US009941207B2

(12) United States Patent
Lin

(10) Patent No.: US 9,941,207 B2
(45) Date of Patent: Apr. 10, 2018

(54) SEMICONDUCTOR DEVICE AND METHOD OF FABRICATING 3D PACKAGE WITH SHORT CYCLE TIME AND HIGH YIELD

(71) Applicant: STATS ChipPAC, Ltd., Singapore (SG)

(72) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/971,627

(22) Filed: Dec. 16, 2015

(65) Prior Publication Data
US 2016/0118333 A1    Apr. 28, 2016

Related U.S. Application Data

(63) Continuation-in-part of application No. 14/887,561, filed on Oct. 20, 2015, now Pat. No. 9,653,445.
(Continued)

(51) Int. Cl.
*H01L 23/528* (2006.01)
*H01L 21/66* (2006.01)
(Continued)

(52) U.S. Cl.
CPC ........ *H01L 23/528* (2013.01); *H01L 21/6835* (2013.01); *H01L 21/6836* (2013.01); *H01L 21/76895* (2013.01); *H01L 21/78* (2013.01); *H01L 22/20* (2013.01); *H01L 23/3107* (2013.01); *H01L 23/49811* (2013.01); *H01L 24/96* (2013.01); *H01L 24/97* (2013.01); *H01L 25/16* (2013.01); *H01L 25/50* (2013.01); *H01L 21/561* (2013.01); *H01L 23/544* (2013.01);
(Continued)

(58) Field of Classification Search
CPC ......... H01L 25/50; H01L 24/97; H01L 25/16; H01L 23/3107; H01L 21/78; H01L 21/76895; H01L 22/20; H01L 23/528
USPC .............................................. 257/773; 438/15
See application file for complete search history.

(56) References Cited

U.S. PATENT DOCUMENTS 9,224,697 B1 * 12/2015 Kwon ................... H01L 23/562
2003/0148558 A1   8/2003 Kubo et al.
(Continued)

*Primary Examiner* — Walter H Swanson
(74) *Attorney, Agent, or Firm* — Robert D. Atkins; Patent Law Group: Atkins and Associates, P.C.

(57) ABSTRACT

A method of making a semiconductor device comprising the steps of providing a first manufacturing line, providing a second manufacturing line, and forming a first redistribution interconnect structure using the first manufacturing line while forming a second redistribution interconnect structure using the second manufacturing line. The method further includes the steps of testing a first unit of the first redistribution interconnect structure to determine a first known good unit (KGU), disposing a known good semiconductor die (KGD) over the first KGU of the first redistribution interconnect structure, and dicing the first KGU and KGD from the first redistribution interconnect structure. The method further includes the steps of testing a unit of the second redistribution interconnect structure to determine a second KGU of the second redistribution interconnect structure and disposing first KGU of the first redistribution interconnect structure and the KGD over the second KGU of the second redistribution interconnect structure.

23 Claims, 36 Drawing Sheets

Related U.S. Application Data

(60) Provisional application No. 62/068,499, filed on Oct. 24, 2014.

(51) Int. Cl.

| | | |
|---|---|---|
| *H01L 21/768* | (2006.01) | |
| *H01L 21/78* | (2006.01) | |
| *H01L 23/31* | (2006.01) | |
| *H01L 25/16* | (2006.01) | |
| *H01L 25/00* | (2006.01) | |
| *H01L 23/00* | (2006.01) | |
| *H01L 23/498* | (2006.01) | |
| *H01L 21/683* | (2006.01) | |
| *H01L 21/56* | (2006.01) | |
| *H01L 23/544* | (2006.01) | |

(52) U.S. Cl.
CPC .............. *H01L 24/81* (2013.01); *H01L 24/83* (2013.01); *H01L 2221/68327* (2013.01); *H01L 2221/68331* (2013.01); *H01L 2221/68359* (2013.01); *H01L 2221/68372* (2013.01); *H01L 2221/68381* (2013.01); *H01L 2223/54433* (2013.01); *H01L 2223/54486* (2013.01); *H01L 2224/03334* (2013.01); *H01L 2224/04105* (2013.01); *H01L 2224/32225* (2013.01); *H01L 2224/73253* (2013.01); *H01L 2224/81005* (2013.01); *H01L 2224/81191* (2013.01); *H01L 2224/81192* (2013.01); *H01L 2224/81815* (2013.01); *H01L 2224/83005* (2013.01); *H01L 2224/94* (2013.01); *H01L 2224/96* (2013.01); *H01L 2224/97* (2013.01); *H01L 2924/15311* (2013.01); *H01L 2924/19104* (2013.01); *H01L 2924/19105* (2013.01); *H01L 2924/19106* (2013.01); *H01L 2924/37001* (2013.01)

(56) References Cited

U.S. PATENT DOCUMENTS

| | | |
|---|---|---|
| 2013/0068516 A1 | 3/2013 | Mohammed |
| 2014/0048906 A1 | 2/2014 | Shim et al. |
| 2016/0086863 A1* | 3/2016 | Won ...................... H01L 21/768 438/17 |

* cited by examiner

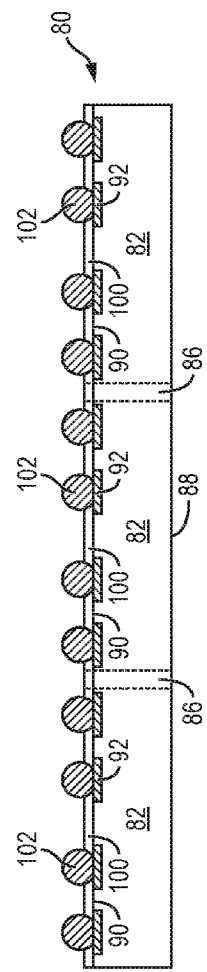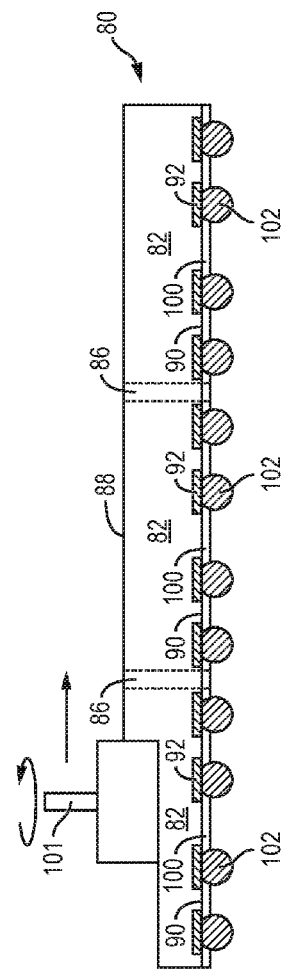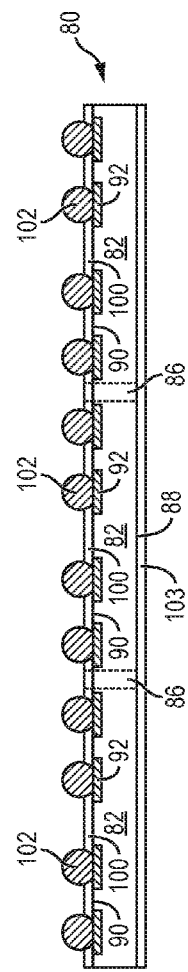

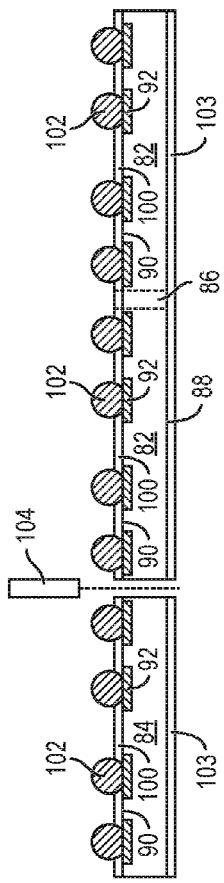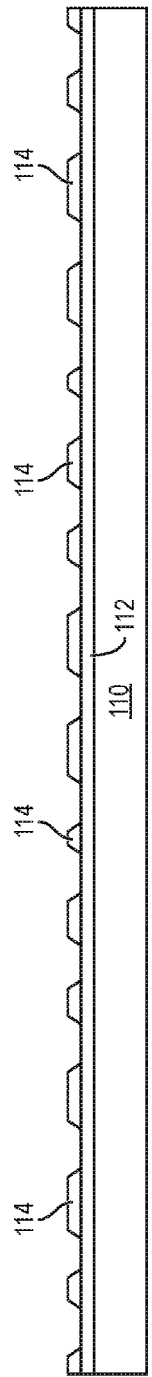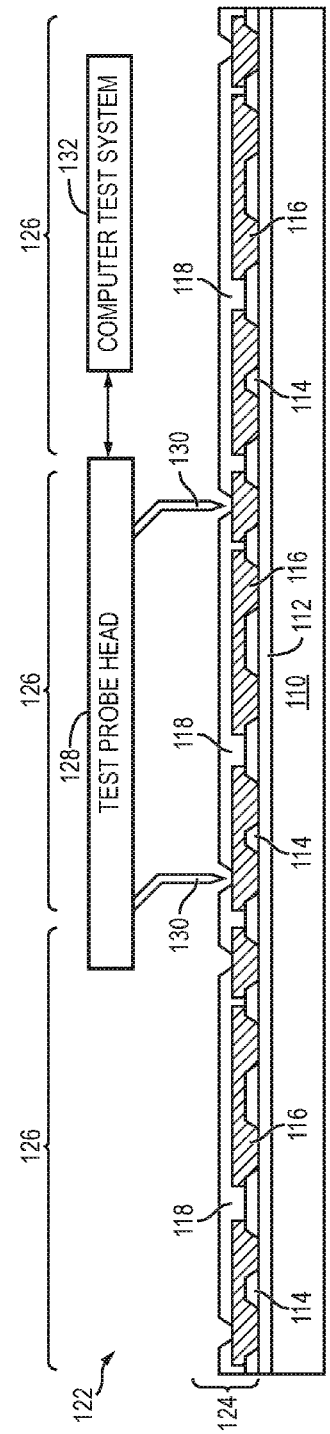

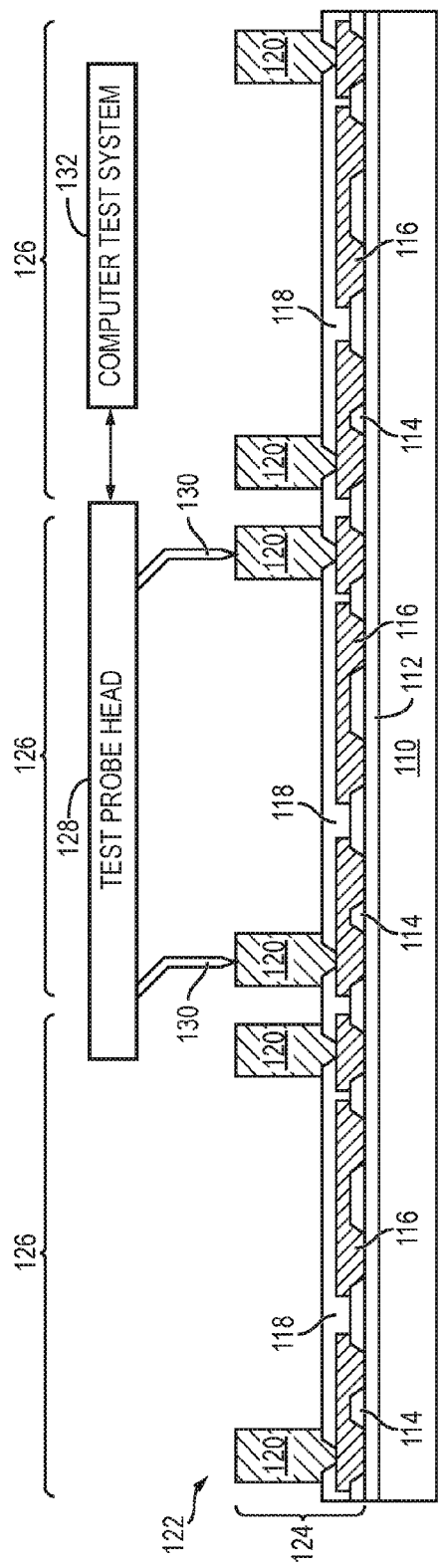
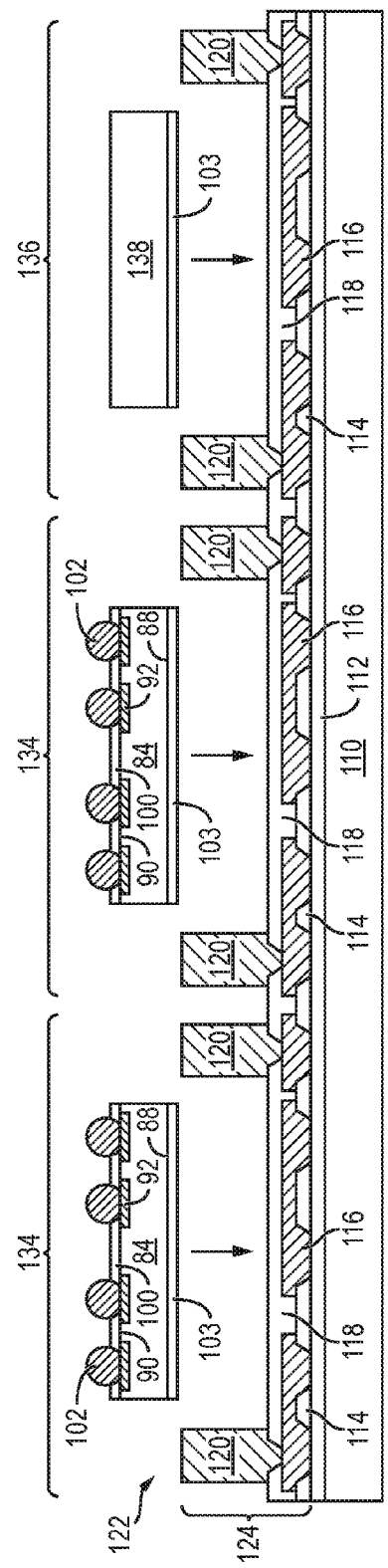
FIG. 3c
FIG. 3d

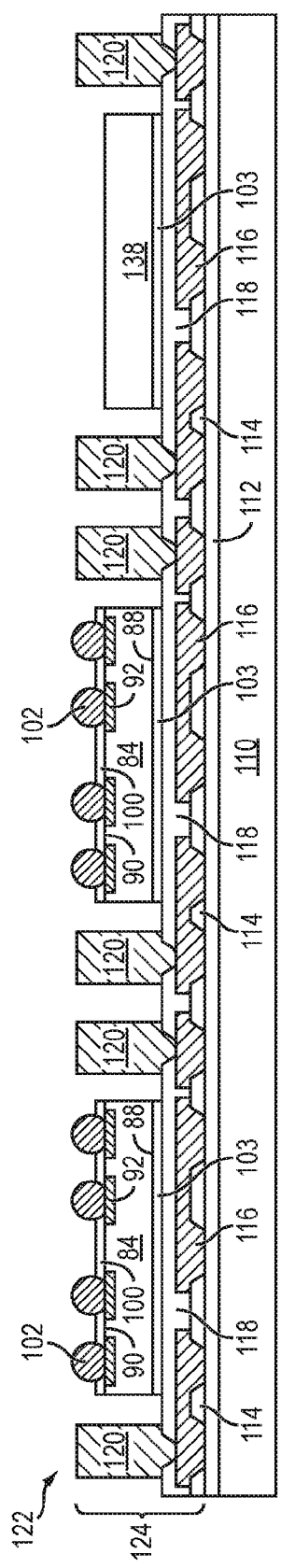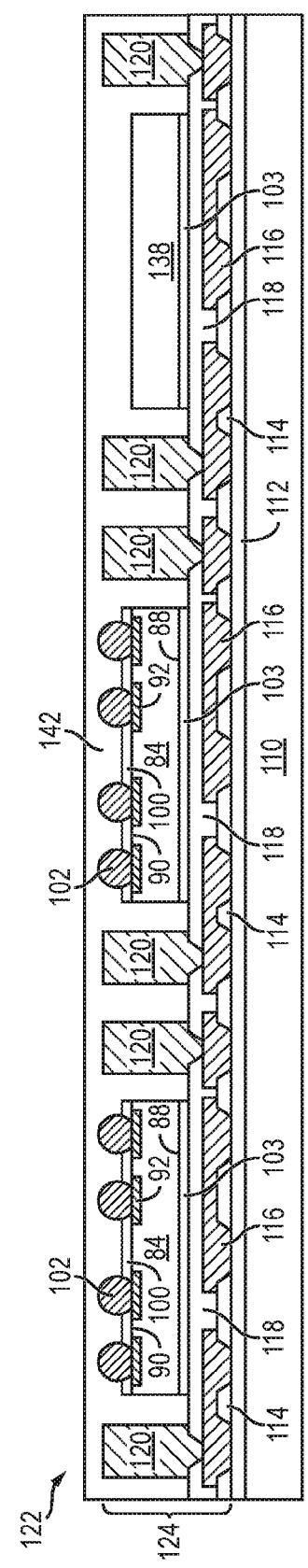

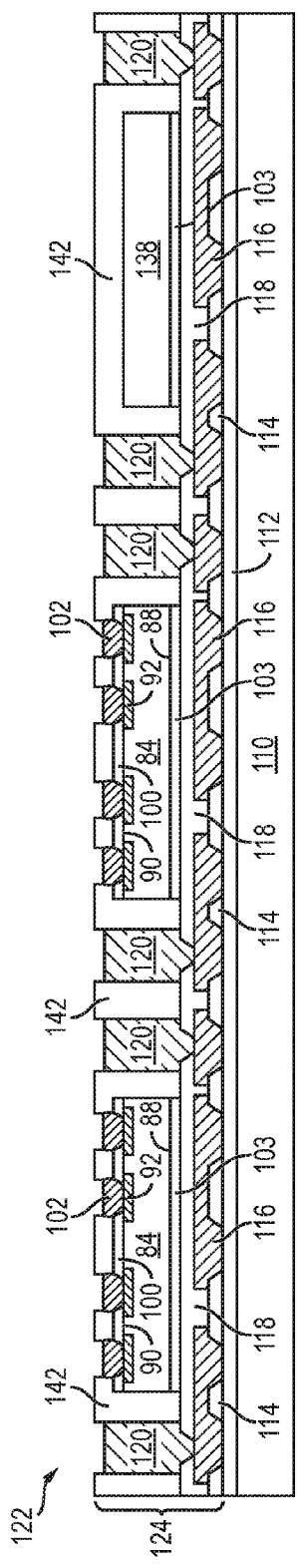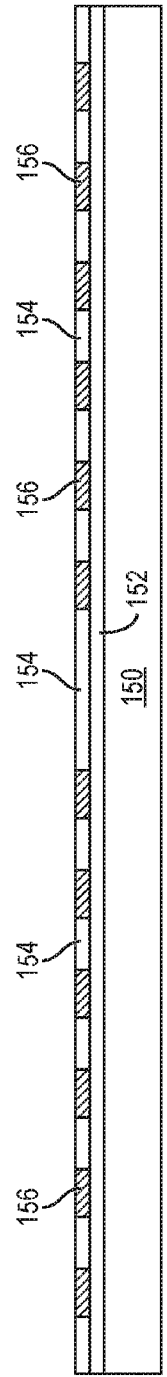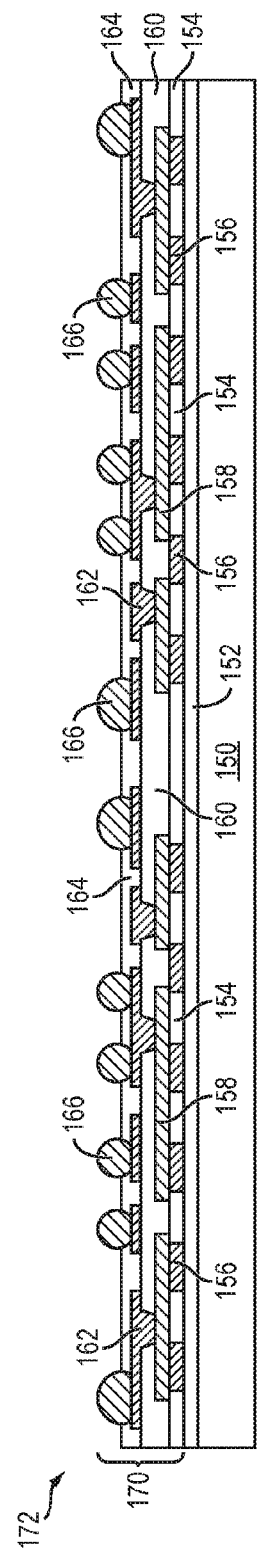

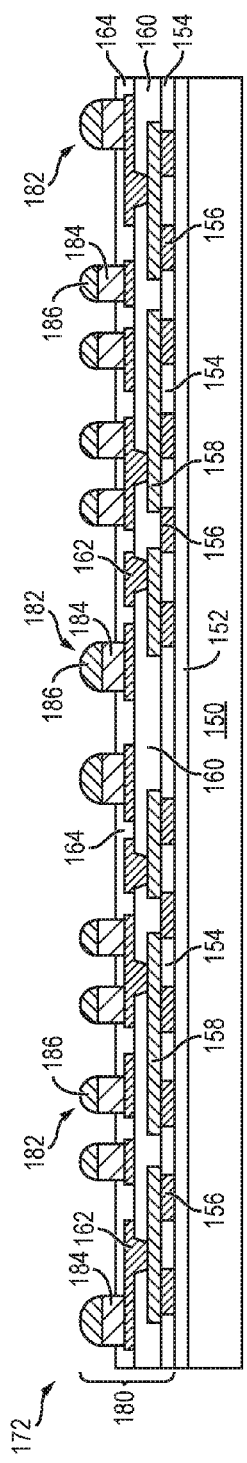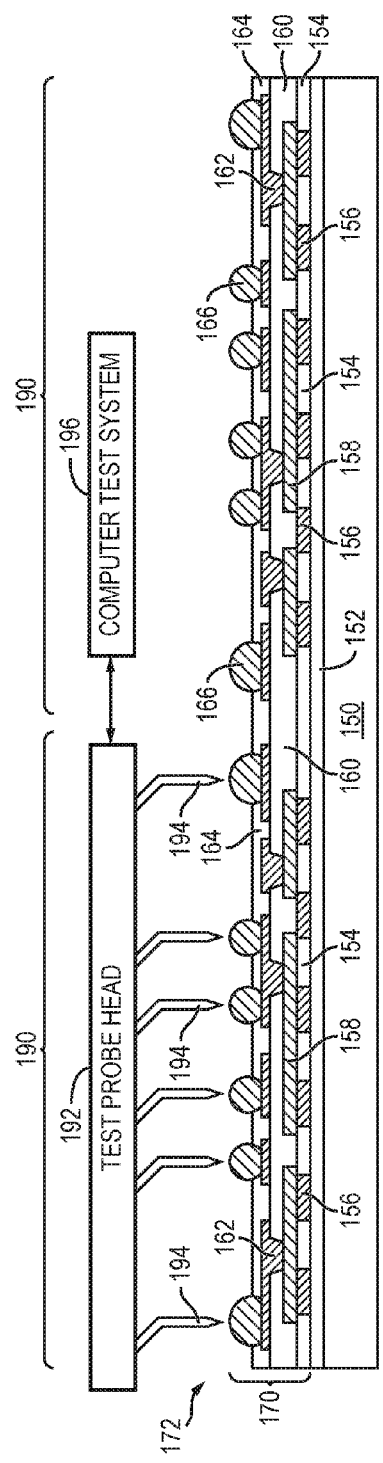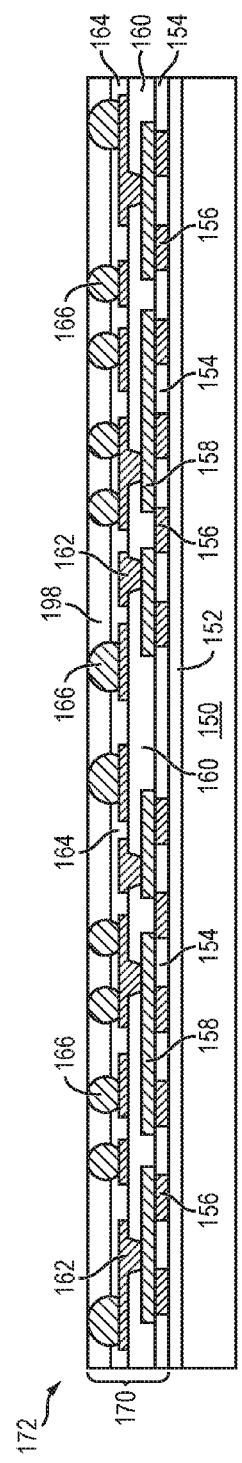

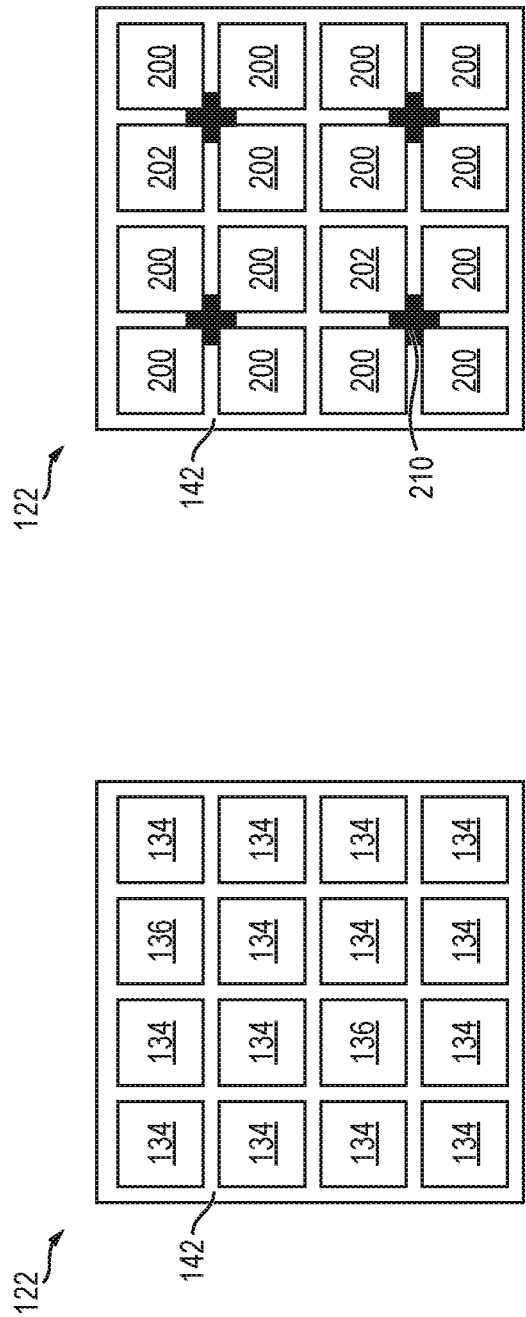

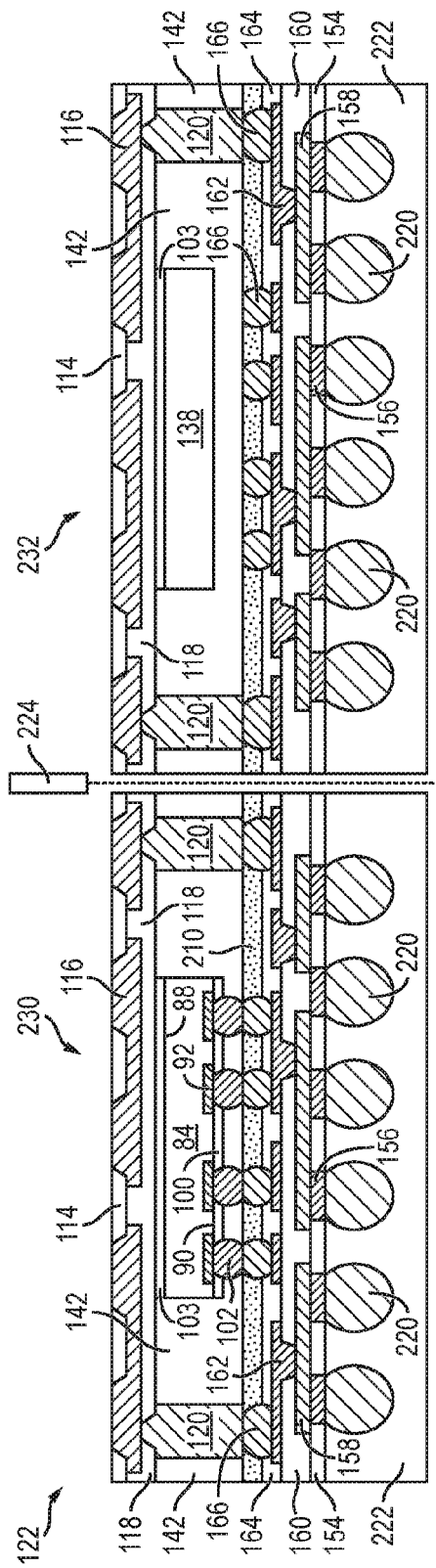
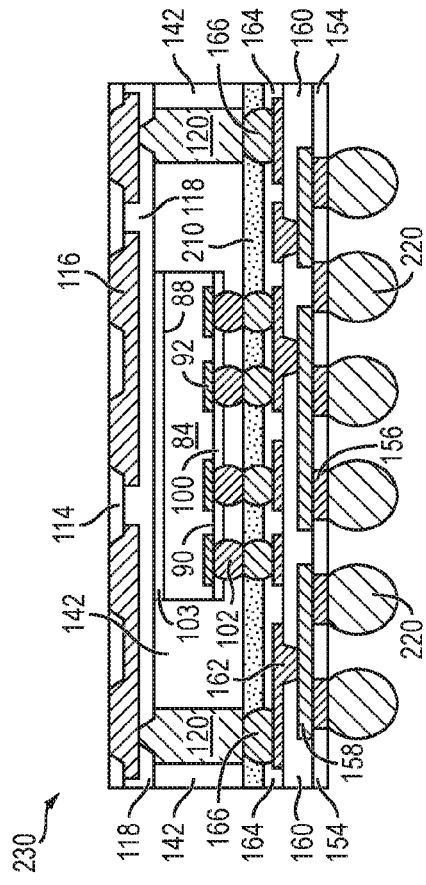
FIG. 5i
FIG. 6

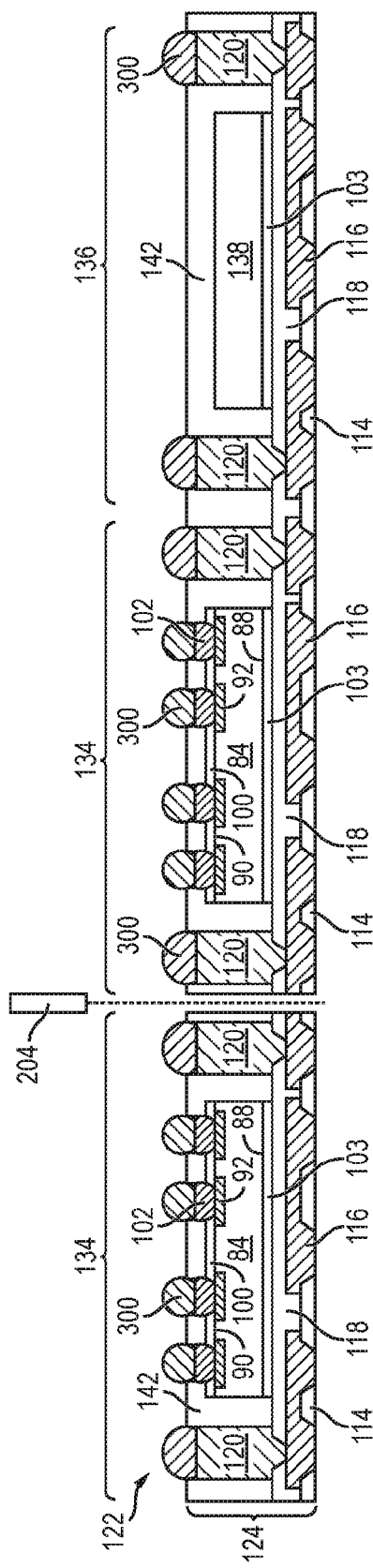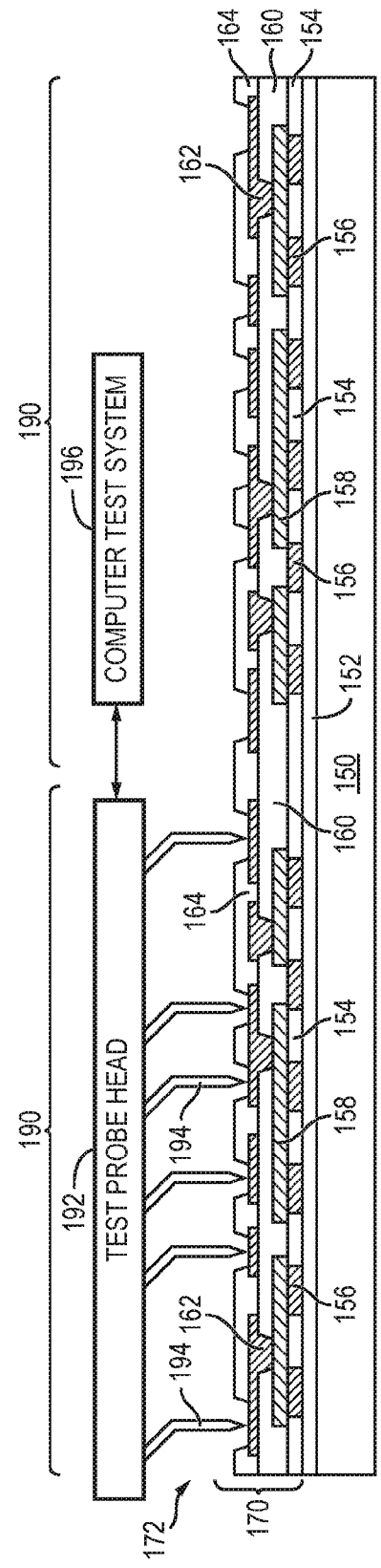

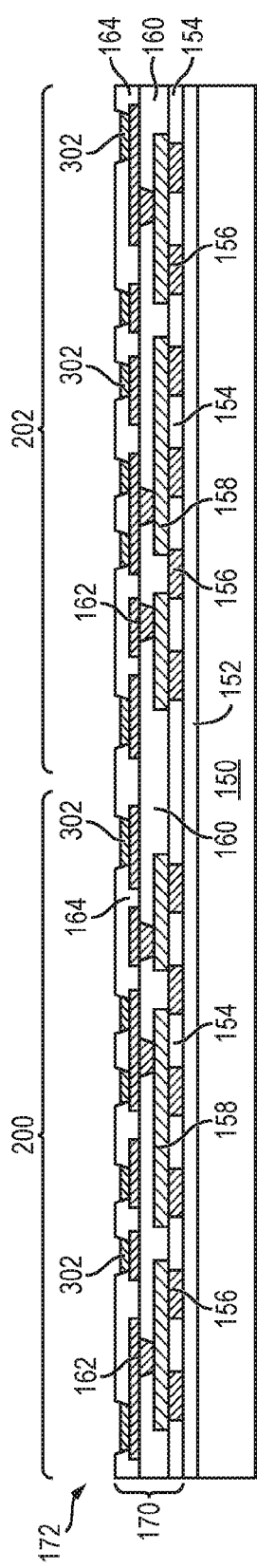
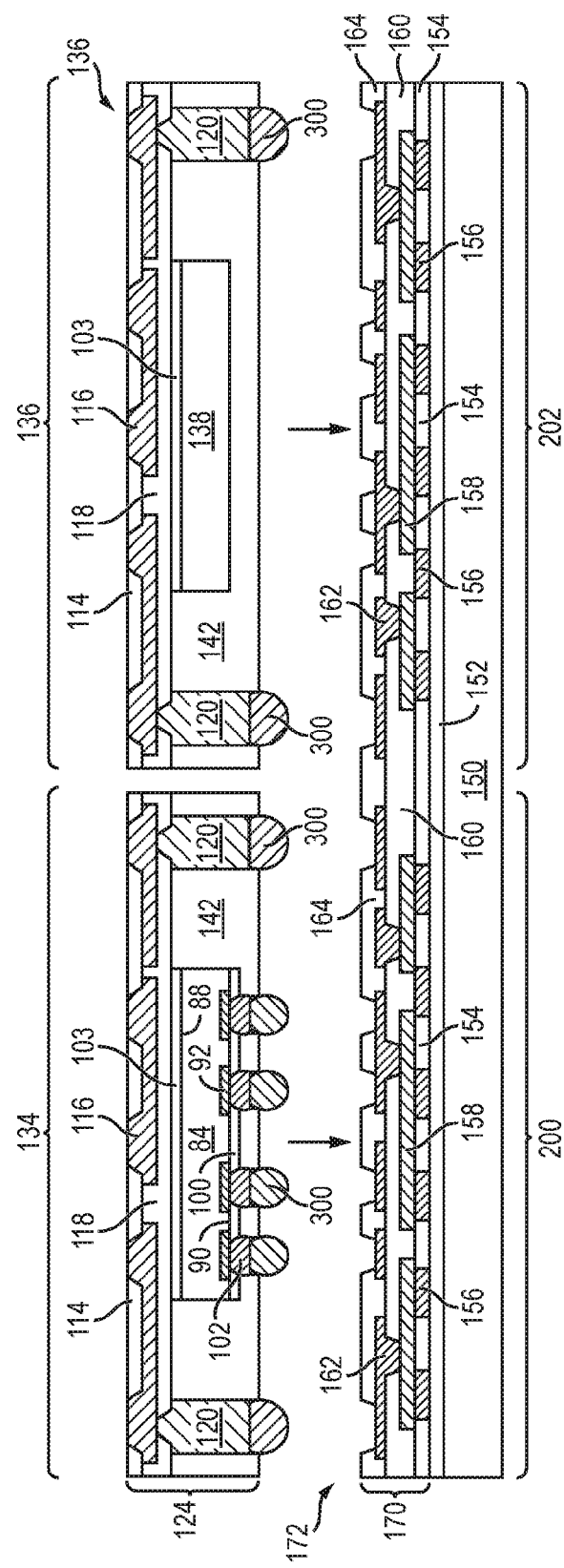

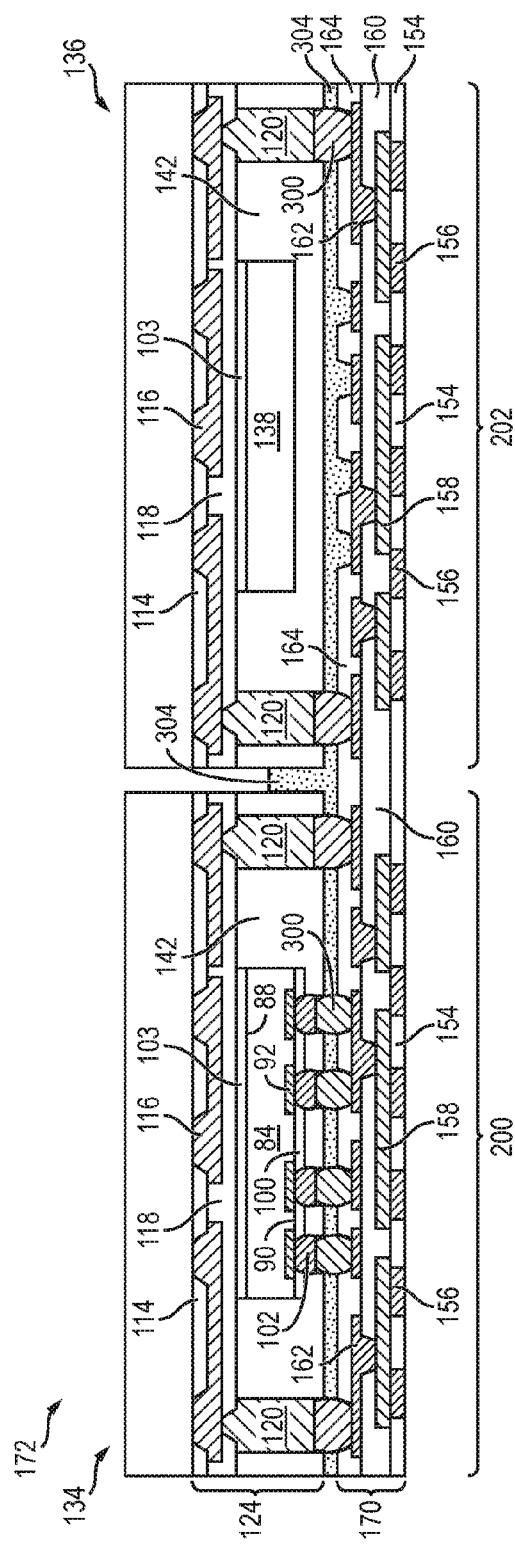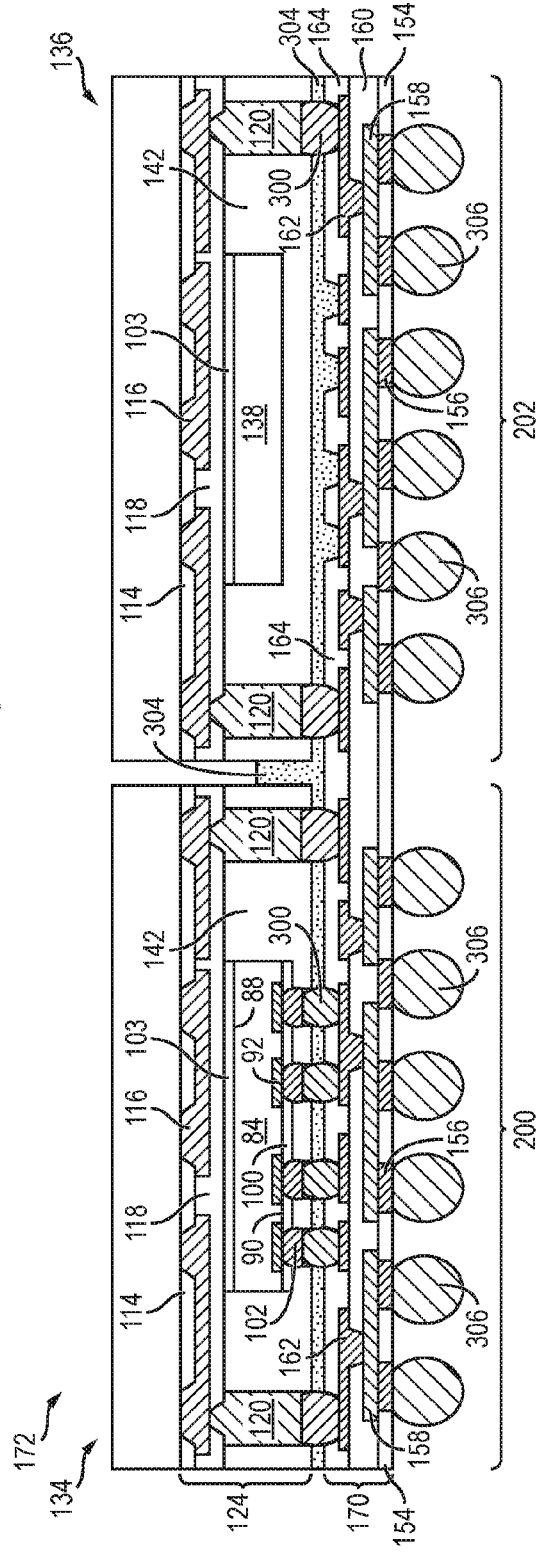

SEMICONDUCTOR DEVICE AND METHOD OF FABRICATING 3D PACKAGE WITH SHORT CYCLE TIME AND HIGH YIELD

CLAIM OF DOMESTIC PRIORITY

The present application is a continuation-in-part of U.S. application Ser. No. 14/887,561, filed Oct. 20, 2015, which claims the benefit of U.S. Provisional Application No. 62/068,499, filed Oct. 24, 2014, which applications are incorporated herein by reference.

FIELD OF THE INVENTION

The present invention relates in general to semiconductor devices and, more particularly, to a semiconductor device and method of forming a wafer level package with the ability to fan-out signals on both an upper and a lower surface of the wafer level package while reducing cycle time and increasing yield.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objectives of greater integration and smaller semiconductor devices is to focus on three-dimensional (3D) packaging technologies including package-on-package (PoP). The manufacturing of smaller semiconductor devices relies on implementing improvements to horizontal and vertical electrical interconnection between multiple semiconductor devices on multiple levels, i.e., 3D device integration. A reduced package profile is of particular importance for packaging in the cellular or smart phone industry. However, PoP devices often require laser drilling to form vertical interconnect structures, e.g., through mold vias, which increases equipment costs and requires drilling through an entire package thickness. Laser drilling increases cycle time (CT) and decreases manufacturing throughput. Vertical interconnections formed exclusively by a laser drilling process can result in reduced control and design flexibility. Furthermore, conductive materials used for forming through mold vias within a PoP, can be incidentally transferred to semiconductor die during package formation, thereby contaminating the semiconductor die within the package.

A semiconductor die can be tested to be a known good die (KGD) prior to mounting in a semiconductor package, e.g., a fan-out wafer level chip scale package (Fo-WLCSP). The semiconductor package can still fail due to defects in the build-up interconnect structure, causing loss of the KGD. Lower yield is expected for WLCSP with dual side fan-out build-up interconnect structures. A semiconductor package size greater than 10 by 10 millimeter (mm) with fine line spacing and multilayer structures is particularly susceptible to defects in the build-up interconnect structure. When the WLCSP with dual side fan-out build-up interconnect structures includes a larger die, the expected yield is lower yet, further increasing the loss of KGD.

Additionally, electrical connection between stacked semiconductor devices often requires first and second side redistribution layers (RDLs) to be formed over opposing surfaces of the semiconductor die. In the manufacture of semiconductor packages having first and second side RDLs, semiconductor die are often mounted to a first temporary carrier and an encapsulant is deposited over the semiconductor die and first carrier to form a reconstituted panel or reconfigured wafer. A first side redistribution interconnect structure is formed over the semiconductor die and encapsulant. The workpiece is inverted and mounted to a second temporary carrier, increasing cost. The first temporary carrier is then removed. Total thickness variation (TTV) in temporary bonding and debonding is a challenge due to the warpage of fanout substrate, especially after one side RDL process. A second side redistribution interconnect structure is formed over the semiconductor die and encapsulant. The first temporary carrier is then removed. The reconstituted panel is bumped and diced. However, flaws in the manufacturing process of either the first side redistribution interconnect structure or second side redistribution interconnect structure cause reduced yield and increased loss of KGD. Additionally, the CT of known methods of manufacture of semiconductor packages having first and second side RDLs manufactured on a single production line is too long to support today's demands to fulfill customer orders with minimal inventory. Maintaining inventory causes waste, as stored inventory rapidly becomes un-sellable out of date product.

SUMMARY OF THE INVENTION

A need exists to fabricate 3D semiconductor packages with short CT and high yield. Accordingly, in one embodiment, the present invention is a method of making a semiconductor device comprising the steps of providing a first manufacturing line, providing a second manufacturing line, forming a first redistribution interconnect structure using the first manufacturing line while forming a second redistribution interconnect structure using the second manufacturing line, and testing a first unit of the first redistribution interconnect structure to determine a first known good unit. The method further includes the steps of disposing a known good die over the first known good unit of the first redistribution interconnect structure, dicing the first redistribution interconnect structure into known good units, testing a unit of the second redistribution interconnect structure to determine a second known good unit, disposing the first known good unit of the first redistribution interconnect structure and the KGD over the second known good unit of the second redistribution interconnect structure.

In another embodiment, the present invention is a method of making a semiconductor device comprising the steps of providing a first manufacturing line, providing a second manufacturing line, and forming a first redistribution interconnect structure using the first manufacturing line while forming a second redistribution interconnect structure using the second manufacturing line. The method further includes the steps of testing a first unit of the first redistribution interconnect structure to determine a first known good unit, disposing a known good die over the first KGU of the first redistribution interconnect structure, and dicing the first redistribution interconnect structure.

In another embodiment, the present invention is a method of making a semiconductor device, comprising forming a first redistribution interconnect structure and dicing the first redistribution interconnected structure into known good units using a first manufacturing line while forming a second redistribution interconnect structure using a second manufacturing line.

In another embodiment, the present invention is a semiconductor device comprising a first redistribution interconnect structure including a known good unit of the first redistribution interconnect structure and a rejected unit of the first redistribution interconnect structure. The known good unit of the first redistribution structure includes a known good die. A second redistribution interconnect structure includes a known good unit of the second redistribution interconnect structure and a rejected unit of the second redistribution interconnect structure. The known good unit of the first redistribution interconnect structure is disposed over the known good unit of the second redistribution interconnect structure and the rejected unit of the first redistribution interconnect structure is disposed over the rejected unit of the second redistribution interconnect structure.

BRIEF DESCRIPTION OF THE DRAWINGS

FIGS. 2a-2g illustrate a semiconductor wafer with a plurality of semiconductor die separated by a saw street;

FIGS. 3a-3i illustrate a process of forming a semiconductor device including a first side redistribution interconnect structure;

FIGS. 4a-4e illustrate a process of forming a second side redistribution interconnect structure over a carrier for testing at interim stages;

FIGS. 5a-5i illustrate a process of forming a 3D fan-out dual side RDL WLCSP;

FIG. 6 illustrates a 3D fan-out dual side RDL WLCSP;

FIG. 13a-13c illustrate an alternate process of forming a 3D fan-out dual side RDL WLCSP;

FIGS. 14a-14h illustrate a process of forming a 3D fan-out dual side RDL WLCSP;

DETAILED DESCRIPTION OF THE DRAWINGS

Figure 1:
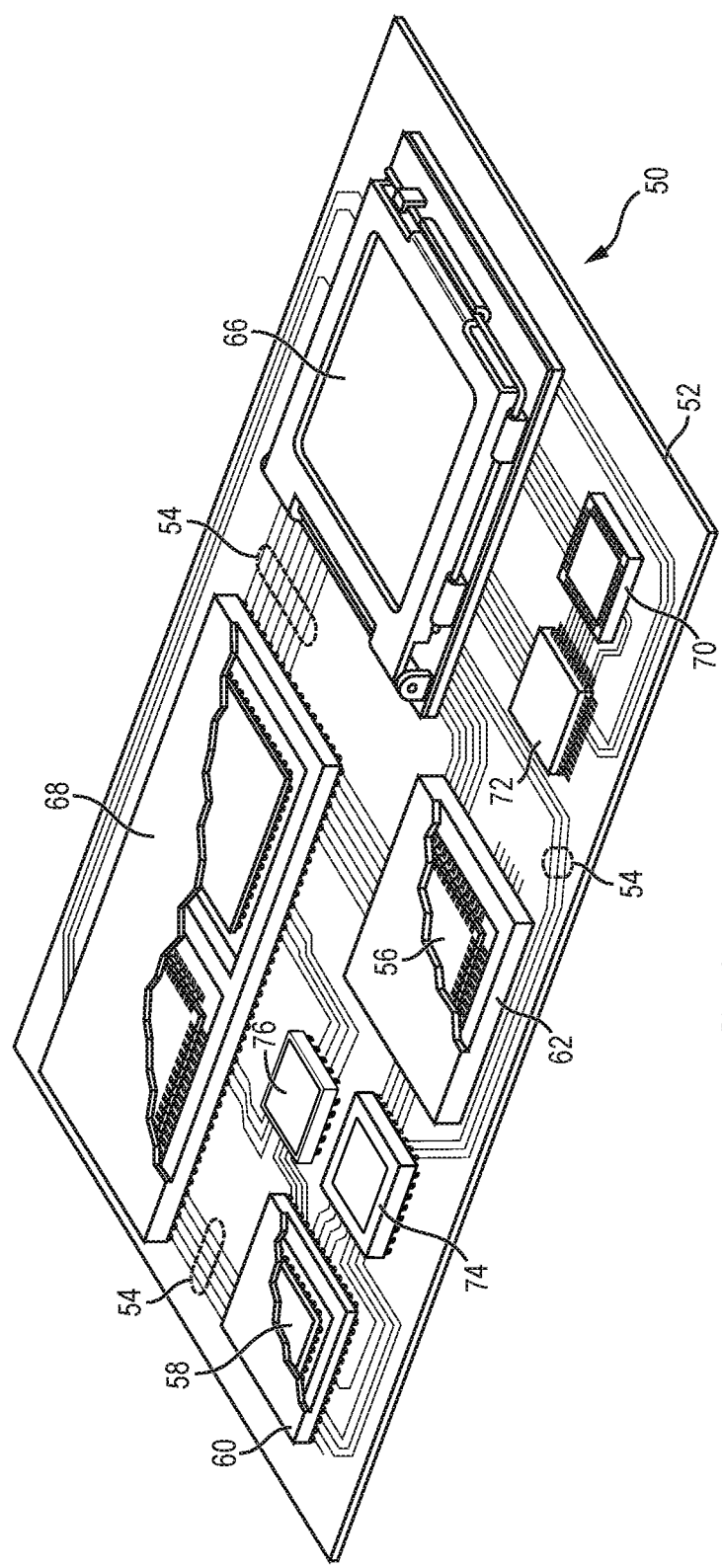
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser-cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
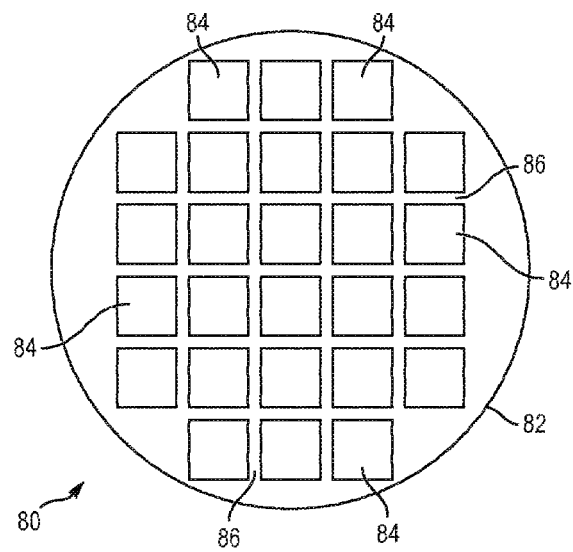

FIG. 2a shows a semiconductor wafer 80 with a base substrate material 82, such as silicon, germanium, aluminum phosphide, aluminum arsenide, gallium arsenide, gallium nitride, indium phosphide, silicon carbide, or other bulk semiconductor material for structural support. A plurality of semiconductor die or components 84 is formed on wafer 80 separated by a non-active, inter-die wafer area or saw street 86 as described above. Saw street 86 provides cutting areas to singulate semiconductor wafer 80 into individual semiconductor die 84. In one embodiment, semiconductor wafer 80 has a width or diameter of 100-450 mm.

Figure 2B:
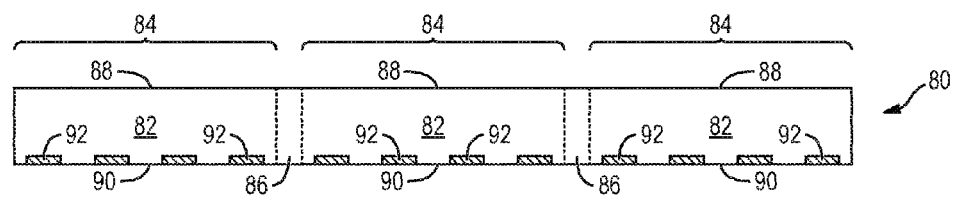

FIG. 2*b* shows a cross-sectional view of a portion of semiconductor wafer 80. Each semiconductor die 84 has a back or non-active surface 88 and an active surface 90 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 90 to implement analog circuits or digital circuits, such as digital signal processor (DSP), ASIC, MEMS, memory, or other signal processing circuit. In one embodiment, active surface 90 contains a MEMS, such as an accelerometer, gyroscope, strain gauge, microphone, or other sensor responsive to various external stimuli.

An electrically conductive layer 92 is formed over active surface 90 of semiconductor die 84 using PVD, CVD, electrolytic plating, electroless plating process, or other suitable metal deposition process. Conductive layer 92 includes one or more layers of aluminum (Al), copper (Cu), tin (Sn), nickel (Ni), gold (Au), silver (Ag), or other suitable electrically conductive material or combination thereof. Conductive layer 92 operates as contact pads electrically connected to the circuits on active surface 90. Conductive layer 92 is formed as contact pads disposed side-by-side a first distance from the edge of semiconductor die 84, as shown in FIG. 2*b*. Alternatively, conductive layer 92 is formed as contact pads that are offset in multiple rows such that a first row of contact pads is disposed a first distance from the edge of the die, and a second row of contact pads alternating with the first row is disposed a second distance from the edge of the die. In one embodiment, back surface 88 of semiconductor wafer 80 undergoes an optional backgrinding operation with a grinder or other suitable mechanical or etching process to remove a portion of base substrate material 82 and reduce the thickness of semiconductor wafer 80 including semiconductor die 84.

Semiconductor wafer 80 undergoes electrical testing and inspection as part of a quality control process. Manual visual inspection and automated optical systems are used to perform inspections on semiconductor wafer 80. Software can be used in the automated optical analysis of semiconductor wafer 80. Visual inspection methods may employ equipment such as a scanning electron microscope, high-intensity or ultra-violet light, or metallurgical microscope. Semiconductor wafer 80 is inspected for structural characteristics including warpage, thickness variation, surface particulates, irregularities, cracks, delamination, and discoloration.

Figure 2C:
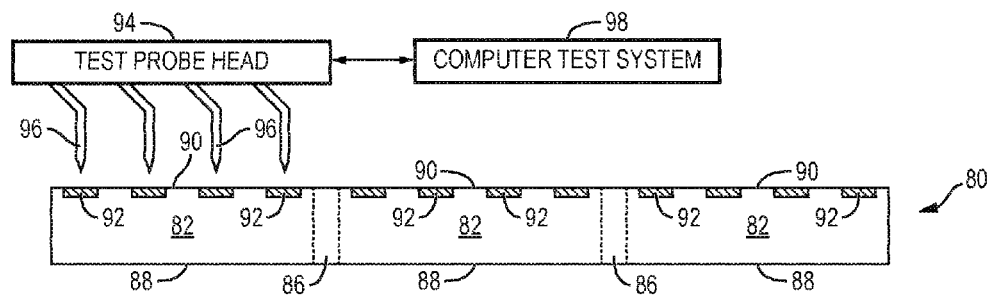

The active and passive components within semiconductor die 84 undergo testing at the wafer level for electrical performance and circuit function. Each semiconductor die 84 is tested for functionality and electrical parameters, as shown in FIG. 2*c*, using a test probe head 94 including a plurality of probes or test leads 96, or other testing device. Probes 96 are used to make electrical contact with nodes or conductive layer 92 on each semiconductor die 84 and provide electrical stimuli to the contact pads. Semiconductor die 84 responds to the electrical stimuli, which is measured by computer test system 98 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 80 enables semiconductor die 84 that pass to be designated as KGD for use in a semiconductor package. Semiconductor die that fail the inspection and electrical testing are designated as rejected die.

In FIG. 2*d*, an insulating or passivation layer 100 is formed over active surface 90 of semiconductor wafer 80 and contact pads 92 using PVD, CVD, printing, spin coating, spray coating, sintering or thermal oxidation. The insulating layer 100 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 100 is removed by laser direct ablation (LDA), etching, or other suitable process to expose contact pads 92.

An electrically conductive bump material is deposited over conductive layer 92 using an evaporation, electrolytic plating, electroless plating, ball drop, or screen printing process. The bump material can be Al, Sn, Ni, Au, Ag, lead (Pb), Bismuth (Bi), Cu, solder, and combinations thereof, with an optional flux solution. For example, the bump material can be eutectic Sn/Pb, high-lead solder, or lead-free solder. The bump material is bonded to conductive layer 92 using a suitable attachment or bonding process. In one embodiment, the bump material is reflowed by heating the material above its melting point to form spherical balls or bumps 102. In some applications, bumps 102 are reflowed a second time to improve electrical contact to conductive layer 92. In one embodiment, bumps 102 are formed over an under bump metallization (UBM) having a wetting layer, barrier layer, and adhesive layer. The bumps can also be compression bonded or thermocompression bonded (TCB) to conductive layer 92. Bumps 102 represent one type of interconnect structure that can be formed over conductive layer 92. The interconnect structure can also use bond wires, conductive pillars, conductive paste, stud bump, micro bump, or other electrical interconnect. Copper pillar plating resist may be formed over bumps 102.

In FIG. 2*e*, back or non-active surface 88 of semiconductor wafer 80 undergoes an optional grinding operation with grinder 101 to planarize the surface and reduce thickness of the semiconductor wafer. The grinding operation removes semiconductor material until semiconductor wafer 80 reaches a desired thickness.

In FIG. 2*f*, an optional die attach film 103 is formed over the planarized back or non-active surface of semiconductor wafer 80. Die attach film 103 can be thermal epoxy, epoxy resin, B-stage epoxy laminating film, ultraviolet (UV) B-stage film adhesive layer, UV B-stage film adhesive layer including acrylic polymer, thermo-setting adhesive film layer, wire-in-film (WIF) encapsulant material, a suitable wafer backside coating, epoxy resin with organic filler, silica filler, or polymer filler, acrylate based adhesive, epoxy-acrylate adhesive, or a polyimide (PI) based adhesive. Die attach film 103 is generally only minimally conductive. In some embodiments, however, die attach film 103 includes a non-conductive material.

In FIG. 2*g*, semiconductor wafer 80 is singulated through saw street 86 using a saw blade or laser-cutting tool 104 into individual semiconductor die 84. Individual semiconductor die 84 can be inspected and electrically tested for identification of KGD post singulation. Rejected die, i.e., semiconductor die that fail the inspection and electrical testing are discarded after singulation leaving only KGD 84 for further processing.

FIGS. 3*a*-5*i* illustrate, in relation to FIG. 1, a method of forming a 3D semiconductor package with short cycle time and high yield. FIG. 3*a* shows a cross-sectional view of a portion of a carrier or temporary substrate 110 containing sacrificial base material such as silicon, polymer, beryllium oxide, glass, or other suitable low-cost, rigid material for structural support. An interface layer or double-sided tape 112 is formed over carrier 110 as a temporary adhesive bonding film, etch-stop layer, or thermal release layer. Carrier 110 may be sacrificial or debondable. Interface layer 112 may be dielectric or conductive.

Carrier 110 can be a round or rectangular panel (greater than 300 mm) with capacity for multiple semiconductor die 84. Carrier 110 may have a larger surface area than the surface area of semiconductor wafer 80. A larger carrier reduces the manufacturing cost of the semiconductor package as more components or semiconductor die can be processed on the larger carrier thereby reducing the cost per unit. Semiconductor packaging and processing equipment are designed and configured for the size of the wafer or carrier being processed.

To further reduce manufacturing costs, the size of carrier 110 is selected independent of the size of semiconductor die 84 or semiconductor wafer 80. That is, carrier 110 has a fixed or standardized size, which can accommodate various size semiconductor die 84 singulated from one or more semiconductor wafers 80. In one embodiment, carrier 110 is circular with a diameter of 330 mm. In another embodiment, carrier 110 is rectangular with a width of 560 mm and length of 600 mm. Semiconductor die 84 may have dimensions of 10 mm by 10 mm, which are placed on the standardized carrier 110. Alternatively, semiconductor die 84 may have dimensions of 20 mm by 20 mm, which are placed on the same standardized carrier 110. Accordingly, standardized carrier 110 can handle any size of semiconductor die 84, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 110 lowers manufacturing costs and capital risk by reducing or eliminating the need for specialized semiconductor processing lines based on die size or incoming wafer size. By selecting a predetermined carrier size to use for any size component or semiconductor die from all semiconductor wafer sizes, a flexible manufacturing line can be implemented.

To further reduce manufacturing costs, a method of fabricating 3D semiconductor packages with short CT and high yield is utilized. The first and second side redistribution interconnect structures to be disposed over opposing surfaces of semiconductor die 84 are analyzed and compared to existing technology nodes or manufacturing lines. The first and second side redistribution interconnect structures are each assigned to a different manufacturing line to maximize the efficiency and cost infrastructure of the technology nodes of panel level RDL build-up and packaging. Accordingly, the first side redistribution interconnect structure is fabricated on a first manufacturing line at the same time, i.e., simultaneously, as the second side redistribution interconnect structure is being fabricated on a second manufacturing line, greatly reducing CT. In one embodiment, first side redistribution interconnect structure 124 is manufactured using a lower resolution, e.g., 250 nanometers (nm), while a second side redistribution interconnect structure is manufactured using a higher resolution, e.g., 90 nm resolution. In one embodiment, first side redistribution interconnect structure 124 includes fewer conductive layers, while a second side redistribution interconnect structure includes a greater number of conductive layers. In one embodiment, first side redistribution interconnect structure 124 is manufactured using a shorter processing time, while a second side redistribution interconnect structure is manufactured using a longer processing time. Processing time includes the time required to form 3D interconnects. In one embodiment, first side redistribution interconnect structure 124 includes a smaller size or footprint, while a second side redistribution interconnect structure includes a greater size or footprint.

In FIGS. 3*a*-3*c*, a build-up interconnect structure 124 is formed over standardized carrier 110 and interface layer 112. FIG. 3*a* shows an insulating or passivation layer 114 formed over standardized carrier 110 and interface layer 112 using PVD, CVD, printing, spin coating, spray coating, sintering or thermal oxidation. Insulating layer 114 contains one or more layers of SiO2, Si3N4, SiON, Ta2O5, Al2O3, hafnium oxide (HfO2), benzocyclobutene (BCB), PI, polybenzoxazoles (PBO), polymer dielectric resist with or without fillers or fibers, or other material having similar structural and dielectric properties. A portion of insulating layer 114 is removed by LDA, etching, or other suitable process to expose portions of interface layer 112. In one embodiment, insulating layer 114 includes a glass fiber or filler with a glass transition temperature (Tg) greater than or equal to 200° C.

FIG. 3*b* shows an electrically conductive layer or RDL 116 formed using a patterning and metal deposition process such as sputtering, electrolytic plating, and electroless plating. Conductive layer 116 can be one or more layers of Al, Cu, Sn, Ni, Au, Ag, or other suitable electrically conductive material. Portions of conductive layer 116 can be electrically common or electrically isolated depending on the design and function of the final semiconductor package. In one embodiment, conductive layer 116 is fully over insulating layer 114. In another embodiment, conductive layer 116 is partially embedded in insulating layer 114. First side redistribution interconnect structure 124 further includes an insulating or passivation layer 118 formed over and between conductive layers 116 for electrical isolation. Insulating layer 118 contains one or more layers of SiO2, Si3N4, SiON, Ta2O5, Al2O3, HfO2, BCB, PI, PBO, polymer dielectric resist with or without fillers or fibers, or other material having similar structural and dielectric properties. Insulating layer 118 is formed using PVD, CVD, printing, spin coating, spray coating, sintering or thermal oxidation. A portion of insulating layer 118 is removed by LDA, etching, or other suitable process to expose conductive layer 116 for bump formation or additional package interconnect. In one embodiment, first side redistribution interconnect structure 124 further includes one or more additional conductive layers and additional insulating or passivation layers.

First side redistribution interconnect structure 124 undergoes electrical testing and inspection as part of a quality control process. Manual visual inspection and automated optical systems are used to perform inspections on first side redistribution interconnect structure 124. Software can be used in the automated optical analysis of first side redistribution interconnect structure 124. Visual inspection methods may employ equipment such as a scanning electron microscope, high-intensity or ultra-violet light, or metallurgical microscope. First side redistribution interconnect structure 124 is inspected for structural characteristics including warpage, thickness variation, surface particulates, irregularities, cracks, delamination, and discoloration.

The electrical connections within each unit 126 of first side redistribution interconnect structure 124 undergo testing at the carrier level for electrical performance and function. Each unit 126 is tested for functionality and electrical parameters, as shown in FIG. 3b, using a test probe head 128 including a plurality of probes or test leads 130, or other testing device. Probes 130 are used to make electrical contact with nodes or RDL 116 on each unit 126 and provide electrical stimuli to RDL 116. Unit 126 responds to the electrical stimuli, which is measured by computer test system 132 and compared to an expected response to test functionality of the unit. The electrical tests may include functionality, lead integrity, resistivity, continuity, reliability, ESD, RF performance, and operational parameters specific to the component type. The inspection and electrical testing of first side redistribution interconnect structure 124 enables units 126 that pass to be designated as known good units (KGU) 134. Units 126 that fail the inspection and test process are designated as rejected units 136. In one embodiment, rejected units 136 are marked for identification.

FIG. 3c shows an electrically conductive material deposited over conductive layer 116 using an evaporation, electrolytic plating, electroless plating, ball drop, Cu pillar plating, ball drop, stud bump, or screen printing process. The conductive material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The conductive material is bonded to conductive layer 116 using a suitable attachment or bonding process. In one embodiment, the conductive material is formed into conductive pillars 120. In another embodiment, the conductive material is reflowed by heating the material above its melting point to form spherical balls or bumps 120. In some applications, bumps 120 are reflowed a second time to improve electrical contact to conductive layer 116. In one embodiment, the conductive material is formed over a UBM having a wetting layer, barrier layer, and adhesive layer. Conductive pillars 120 can also be compression bonded or TCB to conductive layer 116. Conductive pillars 120 represent one type of interconnect structure that can be formed over conductive layer 116. The interconnect structure can also use bumps, bond wires, conductive paste, stud bump, micro bump, plated copper pillar, copper core bump, copper ball bump with solder joint and RDL pad, stub bump, wire bump, or other electrical interconnect. FIG. 3c shows first side redistribution interconnect structure 124 formed over carrier 110 as reconstituted panel or reconfigured wafer 122.

In FIG. 3c, first side redistribution interconnect structure 124 undergoes electrical testing and inspection as part of a quality control process. Manual visual inspection and automated optical systems are used to perform inspections on first side redistribution interconnect structure 124. Software can be used in the automated optical analysis of first side redistribution interconnect structure 124. Visual inspection methods may employ equipment such as a scanning electron microscope, high-intensity or ultra-violet light, or metallurgical microscope. First side redistribution interconnect structure 124 is inspected for structural characteristics including warpage, thickness variation, surface particulates, irregularities, cracks, delamination, and discoloration.

The electrical connections within each unit 126 of first side redistribution interconnect structure 124 undergo testing at the carrier level for electrical performance and function. Each unit 126 is tested for functionality and electrical parameters, as shown in FIG. 3c, using a test probe head 128 including a plurality of probes or test leads 130, or other testing device. Probes 130 are used to make electrical contact with nodes or conductive pillars 120 on each unit 126 and provide electrical stimuli to RDL 116. Unit 126 responds to the electrical stimuli, which is measured by computer test system 132 and compared to an expected response to test functionality of the unit. The electrical tests may include functionality, lead integrity, resistivity, continuity, reliability, ESD, RF performance, and operational parameters specific to the component type. The inspection and electrical testing of first side redistribution interconnect structure 124 enables units 126 that pass to be designated as KGU 134 for use in a semiconductor package. Units 126 that fail the inspection and test process are designated as rejected units 136. In one embodiment, rejected units 136 are marked for identification.

In FIG. 3d, KGD 84 from FIG. 2g are mounted to KGU 134 and over carrier 110 using, for example, a pick and place operation with planarized back surface of KGD 84 and optional die attach adhesive 103 oriented toward the carrier. KGD 84 are not mounted to rejected units 136. Dummy die 138 are mounted over carrier 110 to rejected units 136 using, for example, a pick and place operation. Yield is improved because KGD 84 are only mounted to KGU 134 while dummy die 138 are mounted to rejected units 136. By testing units 126 prior to mounting KGD 84, mounting KGD to defective units 126 is avoided, increasing yield and decreasing KGD loss. Improving yield is a factor in reducing manufacturing (MFG) cost. Additionally, KGD loss is often challenged by customers, especially for wafer level packages and large die with over 2 L RDL and fine line and spacing resolution. Accordingly, decreasing loss of KGD increases customer satisfaction.

FIG. 3e shows KGD 84 and dummy die 138 mounted over KGU 134 and rejected units 136, respectively. Die attach film 103 is disposed between KGD 84 and KGU 134. Die attachment can be via die attached film 103 at backside, via flip-chip with mass reflow and optional underfill, or via TCB per designed interconnection structure. In one embodiment, a top surface of conductive pillars 120 and a top surface of bumps 102 of KGD 84 are approximately coplanar.

In FIG. 3f, an encapsulant or molding compound 142 is deposited over reconstituted panel 122 including KGD 84, dummy die 138, and carrier 110 using a paste printing, compressive molding, transfer molding, liquid encapsulant molding, vacuum lamination, or other suitable applicator. Encapsulant 142 can be polymer composite material, such as epoxy resin with filler, epoxy acrylate with filler, or polymer with proper filler. Encapsulant 142 is non-conductive, provides physical support, and environmentally protects the semiconductor device from external elements and contaminants. Encapsulant 142 is deposited between conductive pillars 120 and KGD 84 to cover the side surfaces of conductive pillars 120 and KGD 84. In one embodiment, encapsulant 142 covers the top surfaces of conductive pillars 120 and bumps 102 of KGD 84.

Figure 3G:
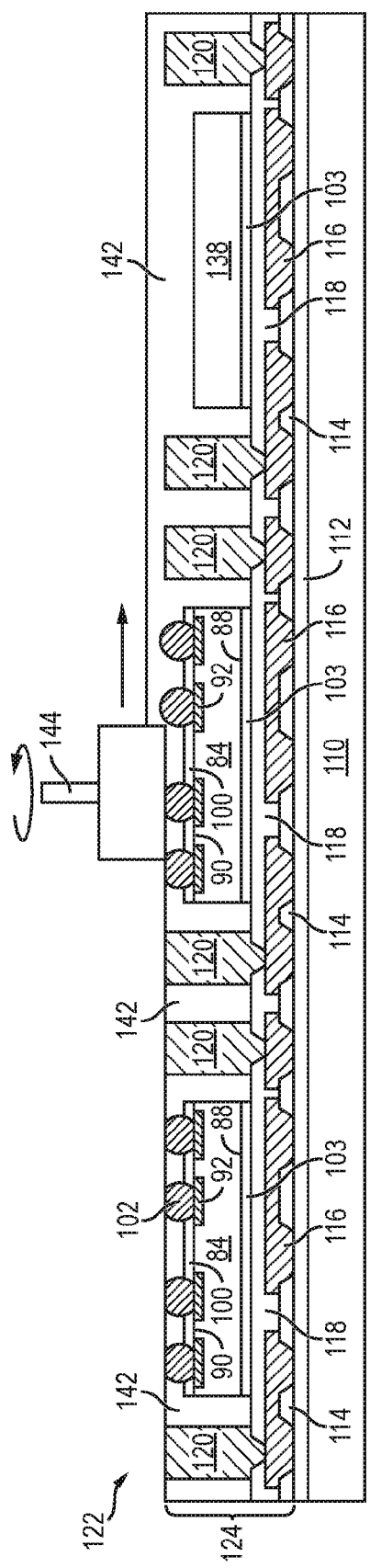
Figure 3H:
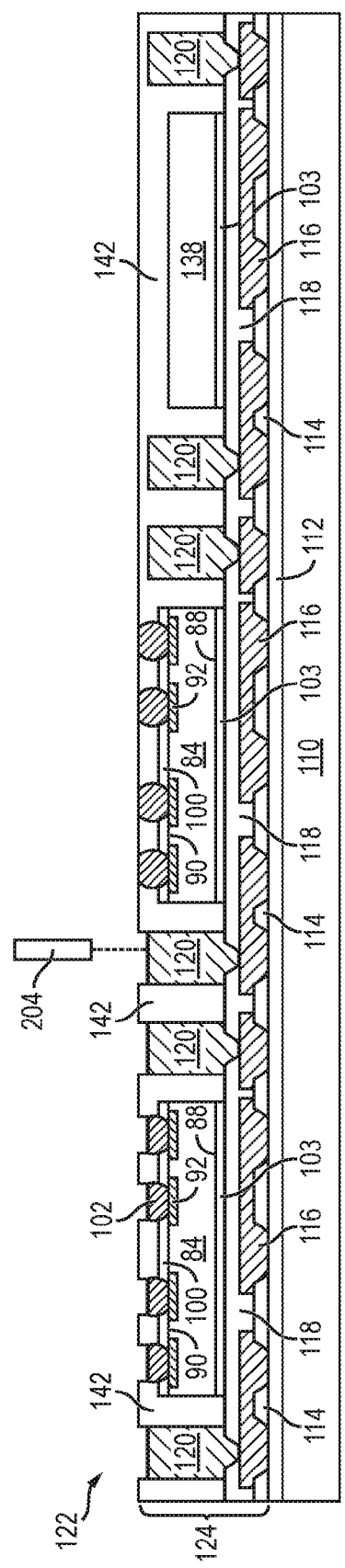

In FIG. 3g, a surface of encapsulant 142 undergoes a grinding operation with grinder 144 to planarize the surface and reduce a thickness of the encapsulant. The grinding operation removes encapsulant material to expose conductive pillars 120 and bumps 102. A chemical etch can also be used to remove and planarize encapsulant 142. After the grinding operation, a top surface of conductive pillars 120 and a top surface of bumps 102 of KGD 84 are coplanar with each other and with a top surface of encapsulant 142. In one embodiment, additional laser ablation with laser 204 and wet etch cleaning are used to expose conductive pillars 120 and bumps 102, as shown in FIG. 3h. FIG. 3i shows reconstituted panel 122 with exposed conductive pillars 120 and bumps 102. In one embodiment, Ni/Au, solder on pad (SOP), or a UBM pad is formed over conductive pillar 120 and bumps 102 after back grinding and cleaning.

The method of fabricating 3D semiconductor packages continues with the simultaneous fabrication of the second side redistribution interconnect structure on a second manufacturing line, as shown in FIGS. 4a-4e, while first side redistribution interconnect structure 124 is being fabricated on the first manufacturing line, as shown in FIGS. 3a-3i, greatly reducing CT. The simultaneous fabrication of first and second side redistribution interconnect structures reduce CT and increase yield to reduce manufacturing costs. In one embodiment, the manufacturing of second side redistribution interconnect structure 170 requires a higher resolution than the manufacturing of first side redistribution interconnect structure 124.

FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer. Carrier 150 may be sacrificial or debondable. Carrier 150 may be the same size or a different size from first side RDL carrier 110. Interface layer 152 may be dielectric or conductive.

Carrier 150 can be a round or rectangular panel (greater than 300 mm) with capacity for multiple semiconductor die 84. Carrier 150 may have a larger surface area than the surface area of semiconductor wafer 80. A larger carrier reduces the manufacturing cost of the semiconductor package as more components or semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of carrier 110, semiconductor die 84, or semiconductor wafer 80. That is, carrier 150 has a fixed or standardized size, which can accommodate various size semiconductor die 84 singulated from one or more semiconductor wafers 80. In one embodiment, carrier 150 is circular with a diameter of 330 mm. In another embodiment, carrier 150 is rectangular with a width of 560 mm and length of 600 mm. Accordingly, common or standardized carrier 150 lowers manufacturing costs and capital risk by reducing or eliminating the need for specialized semiconductor processing lines based on die size or incoming wafer size. By selecting a predetermined carrier size to use for any size component or semiconductor die from all semiconductor wafer sizes, a flexible manufacturing line can be implemented.

In FIGS. 4a-4b, a build-up interconnect structure 170 is formed over standardized carrier 150 and interface layer 152. In one embodiment, first side redistribution interconnect structure 124 is manufactured using a lower resolution, e.g., 250 nm, while second side redistribution interconnect structure 170 is manufactured using a higher resolution, e.g., 90 nm resolution. Second side build-up interconnect structure 170 includes an insulating or passivation layer 154 formed over standardized carrier 150 and interface layer 152 using PVD, CVD, printing, spin coating, spray coating, sintering or thermal oxidation. The insulating layer 154 contains one or more layers of SiO2, Si3N4, SiON, Ta2O5, Al2O3, HfO2, BCB, PI, PBO, polymer dielectric resist with or without fillers or fibers, or other material having similar structural and dielectric properties. In one embodiment, insulating layer 154 includes a glass fiber or filler with a Tg greater than or equal to 200° C. At least one of insulating layer 114 and insulating layer 154 includes a glass fiber or filler with a Tg greater than or equal to 200° C. A portion of insulating layer 154 is removed by LDA, etching, or other suitable process to expose portions of interface layer 152. Second side build-up interconnect structure 170 also includes an electrically conductive layer or RDL 156 formed using a patterning and metal deposition process such as sputtering, electrolytic plating, and electroless plating. Conductive layer 156 can be one or more layers of Al, Cu, Sn, Ni, Au, Ag, or other suitable electrically conductive material. Portions of conductive layer 156 can be electrically common or electrically isolated depending on the design and function of the final semiconductor package. In one embodiment, conductive layer 156 is fully over insulating layer 156. In another embodiment, conductive layer 156 is partially embedded in insulating layer 156.

FIG. 4b shows additional conductive layers 158 and 162 formed over insulating layer 154, conductive layer 156, and carrier 150. Electrically conductive layers 158 and 162 are formed using a patterning and metal deposition process such as sputtering, electrolytic plating, and electroless plating. Conductive layer 158 can be one or more layers of Al, Cu, Sn, Ni, Au, Ag, or other suitable electrically conductive material. Portions of conductive layers 158 and 162 can be electrically common or electrically isolated depending on the design and function of the final semiconductor package. Second side redistribution interconnect structure 170 further includes insulating or passivation layers 160 and 164, formed over and between the conductive layers for electrical isolation. Insulating layers 160 and 164 contain one or more layers of SiO2, Si3N4, SiON, Ta2O5, Al2O3, HfO2, BCB, PI, PBO, polymer dielectric resist with or without fillers or fibers, or other material having similar structural and dielectric properties. Insulating layers 160 and 164 are formed using PVD, CVD, printing, spin coating, spray coating, sintering or thermal oxidation. A portion of insulating layer 160 is removed by LDA, etching, or other suitable process to expose conductive layer 158 for additional package interconnect. A portion of insulating layer 164 is removed by LDA, etching, or other suitable process to expose conductive layer 162 for bump formation or additional package interconnect. In some embodiments, second side redistribution interconnect structure 170 further includes additional conductive and insulating layers formed over carrier 150. In one embodiment, second side redistribution interconnect structure 170 includes a greater number of conductive and insulating layers than first side redistribution interconnect structure 124.

An electrically conductive bump material is deposited over conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form spherical balls or small bumps 166. In some applications, small bumps 166 are reflowed a second time to improve electrical contact to conductive layer 162. In one embodiment, small bumps 166 are formed over a UBM having a wetting layer, barrier layer, and adhesive layer. Small bumps 166 can also be compression bonded or TCB to conductive layer 162. Small bumps 166 represent one type of interconnect structure that can be formed over conductive layer 162. The interconnect structure can also use conductive pillars, bond wires, conductive paste, stud bump, micro bump, or other electrical interconnect. FIG. 4b shows second side redistribution interconnect structure 170 formed over carrier 150 as panel 172.

FIG. 4c shows second side redistribution interconnect structure 180, similar to second side redistribution interconnect structure 170, with composite interconnect 182 in place of bumps 166. Composite interconnect 182 includes a non-fusible base 184 made of Cu, Au, Sn, Ni, and Pb, and a fusible cap 186 made of solder, Sn, or indium. The volume of fusible bump material in relation to the non-fusible base material is selected to ensure self-confinement by virtue of surface tension forces. During reflow, the fusible base material is self-confined around the non-fusible base material. The fusible bump material around the non-fusible base also maintains semiconductor die placement during reflow. In general, the height of composite interconnect 182 is the same or less than the diameter of the bump. In some cases, the height of composite interconnect 182 is greater than the diameter of the interconnect. In one embodiment, given a bump base diameter of 100 µm, the non-fusible base 184 is about 45 µm in height and the fusible cap 186 is about 35 µm in height. In one embodiment, the height of composite interconnect 182 is approximately equal to a height of small bumps 166. In some embodiments, second side redistribution interconnect structure 180 is used in place of second side redistribution interconnect structure 170 to form 3D fan-out dual side RDL WLCSPs.

In FIG. 4d, panel 172 of second side redistribution interconnect structure 170 from FIG. 4b undergoes electrical testing and inspection as part of a quality control process. Manual visual inspection and automated optical systems are used to perform inspections on second side redistribution interconnect structure 170. Software can be used in the automated optical analysis of second side redistribution interconnect structure 170. Visual inspection methods may employ equipment such as a scanning electron microscope, high-intensity or ultra-violet light, or metallurgical microscope. Second side redistribution interconnect structure 170 is inspected for structural characteristics including warpage, thickness variation, surface particulates, irregularities, cracks, delamination, and discoloration.

The electrical connections within each unit 190 of second side redistribution interconnect structure 170 undergo testing at the carrier level for electrical performance and circuit function. Each unit 190 is tested for functionality and electrical parameters, as shown in FIG. 4d, using a test probe head 192 including a plurality of probes or test leads 194, or other testing device. Probes 194 are used to make electrical contact with nodes or bumps 166 on each unit 190 and provide electrical stimuli to second side redistribution interconnect structure 170. Unit 190 responds to the electrical stimuli, which is measured by computer test system 196 and compared with an expected response to test functionality of the unit. The electrical tests may include functionality, lead integrity, resistivity, continuity, reliability, ESD, RF performance, and operational parameters specific to the component type.

In FIG. 4e, an optional non-conductive film (NCF) 198 is formed over bumps 166 after testing. NCF 198 includes epoxy, epoxy-resin adhesive material, polymeric materials, films, or other non-conductive materials. NCF 198 is non-conductive and environmentally protects the semiconductor device from external elements and contaminants.

Figure 5A:
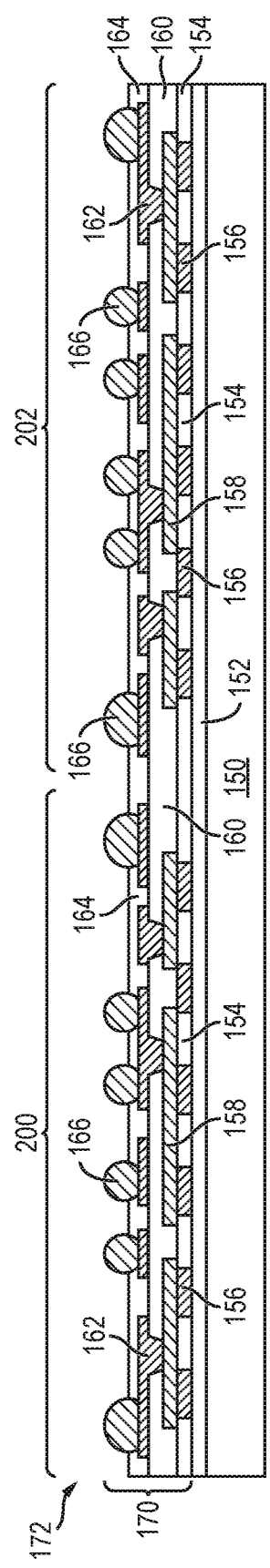

As shown in FIG. 5a, the inspection and electrical testing of panel 172 of second side redistribution interconnect structure 170 enables units 190 that pass to be designated as KGU 200 for use in a semiconductor package. Units 190 that fail the inspection and test process are designated as rejected units 202. In one embodiment, rejected units 202 are marked for identification.

Figure 5B:
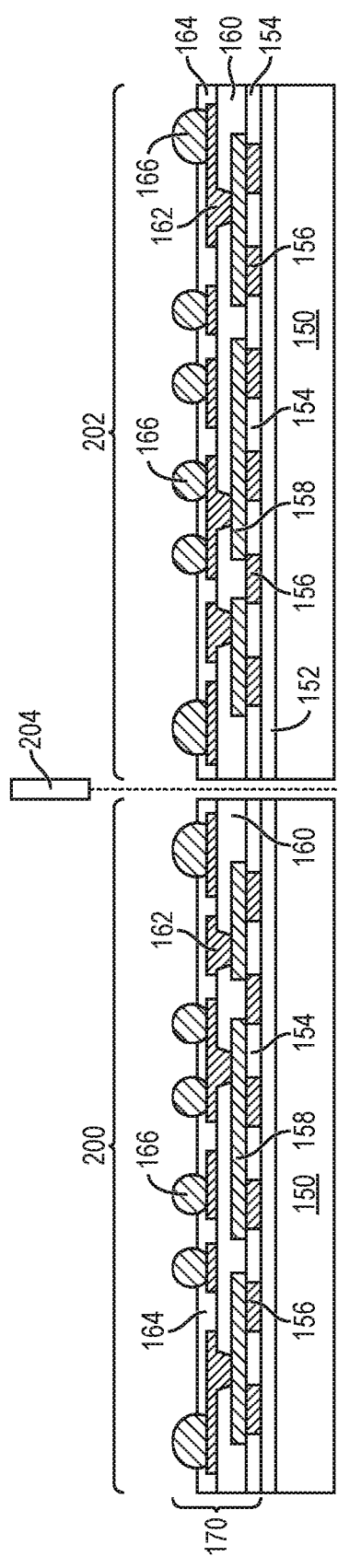

In FIG. 5b, panel 172 of second side redistribution interconnect structure 170 is singulated using a saw blade or laser cutting tool 204 into individual KGU 200 and rejected units 202. In one embodiment, carrier 150 is removed prior to singulation with saw blade or laser cutting tool 204. In one embodiment, rejected units 202 are discarded.

Figure 5C:
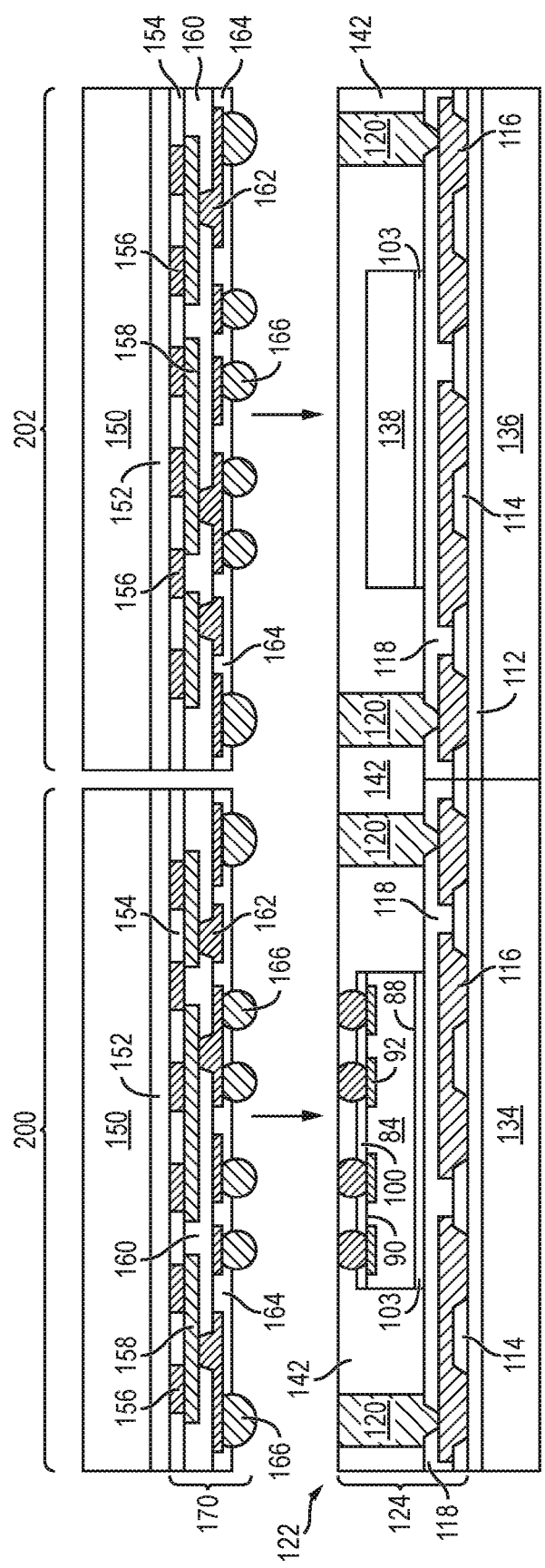

FIG. 5c shows KGU 200 from FIG. 5b mounted to KGU 134 and KGD 84 over carrier 110 and interface layer 112 using, for example, a pick and place operation with bumps 166 oriented toward the carrier and aligned with bumps 102 of KGD 84 and conductive pillars 120. FIG. 5c also shows rejected units 202 mounted to rejected units 136 and dummy die 138 over carrier 110 and interface layer 112 using, for example, a pick and place operation. In one embodiment, TCB is used to mount KGU 200 to KGU 134 and KGD 84 and to mount rejected units 202 to rejected units 136 and dummy die 138 at the reconstituted panel or reconfigured wafer level. By testing units 190 of second side redistribution interconnect structure 170 prior to mounting to KGD 84 and KGU 134 of first side redistribution interconnect structure 124, mounting a defective second side redistribution interconnect structure to KGD is avoided, increasing yield and decreasing KGD loss.

Figure 5D:
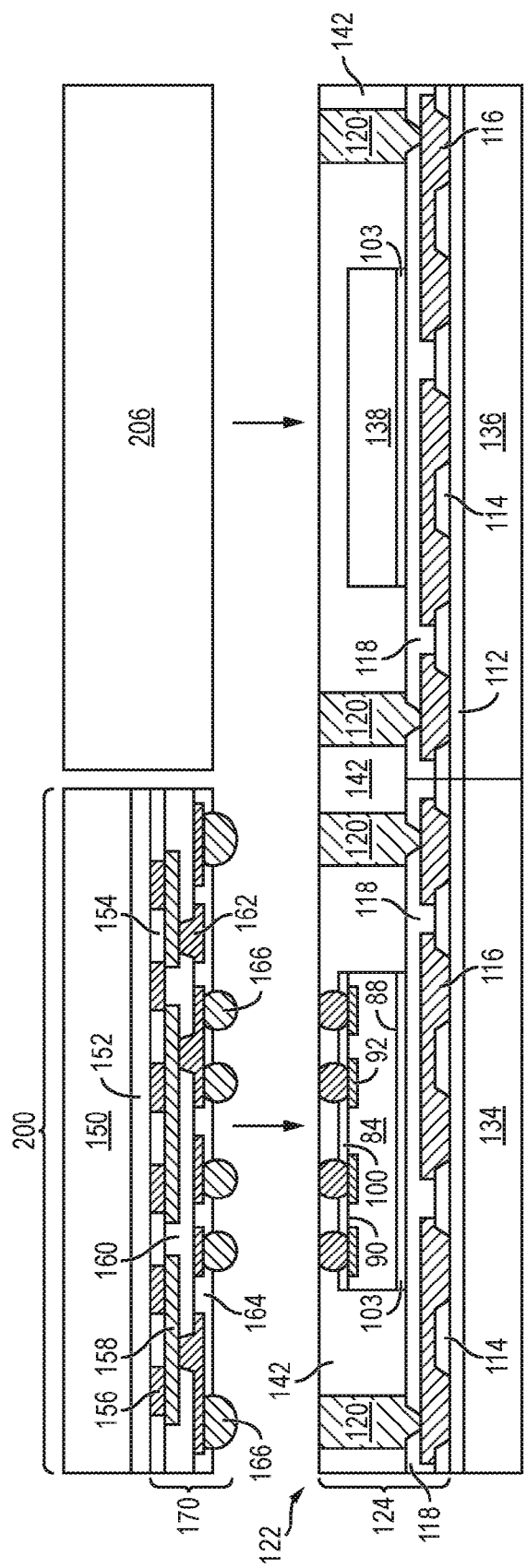

FIG. 5d shows optional dummy substrate 206 mounted to rejected units 136 and dummy die 138 over carrier 110 and interface layer 112 using, for example, a pick and place operation. In one embodiment, rejected units 136 and dummy die 138 are left uncovered, i.e., no dummy substrate 206 or rejected units 202 are disposed over rejected units 136. In one embodiment, TCB is used to mount KGU 200 to KGU 134 and KGD 84 and to mount dummy substrate 206 to rejected units 136 and dummy die 138 at the reconstituted panel or reconfigured wafer level. Yield is improved because only functional units 200 of second side redistribution interconnect structure 170 are mounted to KGD 84 and KGU 134 of first side redistribution interconnect structure 124. By testing units 190 of second side redistribution interconnect structure 170 prior to mounting to KGD 84 and KGU 134 of first side redistribution interconnect structure 124, mounting a defective second side redistribution interconnect structure to KGD is avoided, increasing yield and decreasing KGD loss.

Figure 5E:
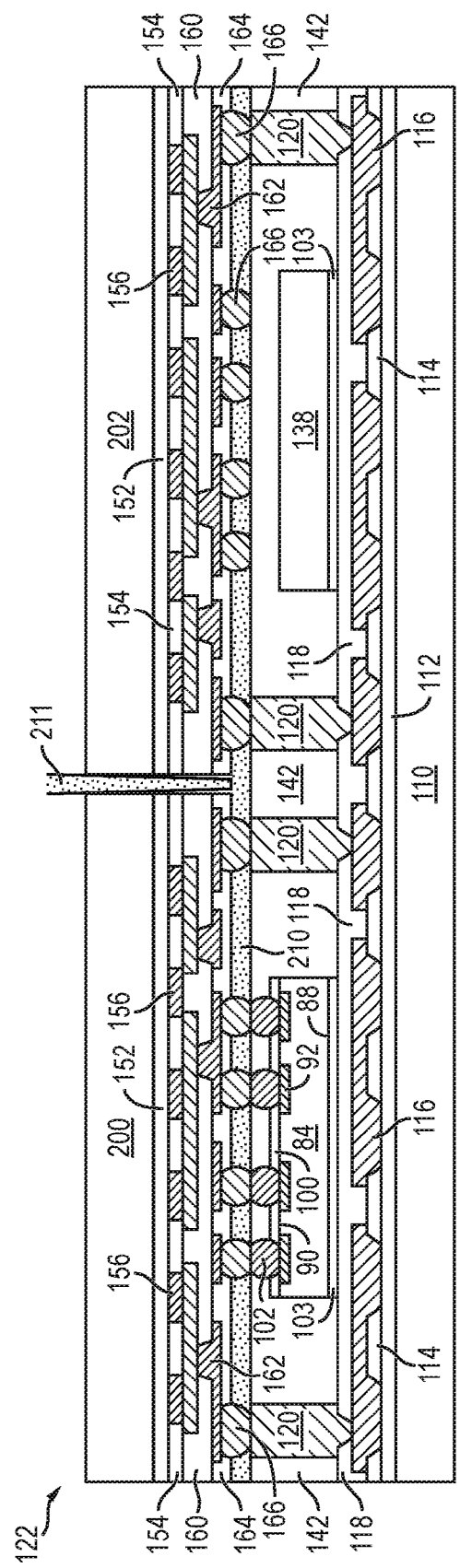

In FIG. 5e, small bumps 166 are reflowed to bond KGU 200 to KGU 134 and KGD 84 and rejected units 202 to rejected units 136 and dummy die 138. In some embodiments, additional laser ablation and wet etch cleaning are performed, after reflow. In one embodiment, TCB is used to mount KGU 200 to KGU 134 and KGD 84 and to mount rejected units 202 to rejected units 136 and dummy die 138 at the reconstituted panel or reconfigured wafer level. In another embodiment, TCB is used to mount KGU 200 to KGU 134 and KGD 84 and to mount rejected units 202 to rejected units 136 and dummy die 138 at a unit level on a tray. FIG. 5e shows an optional underfill material 210 deposited between reconstituted panel 122 and KGU 200 of second side redistribution interconnect structure 170 using dispensing needle 211. Underfill material 210 includes epoxy, epoxy-resin adhesive material, polymeric materials, films, or other non-conductive materials. Underfill 210 is non-conductive and environmentally protects the semiconductor device from external elements and contaminants. In one embodiment, underfill 210 is a capillary underfill (CUF). In another embodiment, underfill 210 is a molded underfill (MUF). In one embodiment, a TCB process is conducted with non-conductive paste (NCP) or NCF in place of optional underfill 210. Thermal high pressure oven curing is performed after underfill 210 is dispensed. In one embodiment, thermal high pressure oven curing includes microwave heating. In one embodiment, MUF 210 with molding is disposed after flip chip attachment. In another embodiment, MUF 210 with molding is disposed after mounting the semiconductor device on a circuit board.

FIG. 5f shows a plan view of a portion of reconstituted panel 122 including KGU 134 and rejected units 136 of first side redistribution interconnect structure 124 encapsulated with encapsulant 142.

FIG. 5g shows a plan view of a portion of reconstituted panel 122 including KGU 200 of second side redistribution interconnect structure 170 disposed over KGU 134 and KGD 84. Rejected units 202 of second side redistribution interconnect structure 170 are disposed over rejected units 136 and dummy die 138. In one embodiment, underfill 210 is a CUF and FIG. 5g shows the pattern of dispense locations for CUF 210. In another embodiment, underfill 210 is a MUF. MUF 210 can be pumped from a reservoir to dispensing needle 211 located according to the dispensing pattern shown in FIG. 5g. MUF 210 is injected under pressure from dispensing needle 211 between reconstituted panel 122 and KGU 200 of second side redistribution interconnect structure 170. A vacuum assist can draw MUF 210 to aid with uniform distribution. MUF 210 can be polymer composite material, such as epoxy resin with filler, epoxy acrylate with filler, or polymer with proper filler.

Figure 5H:
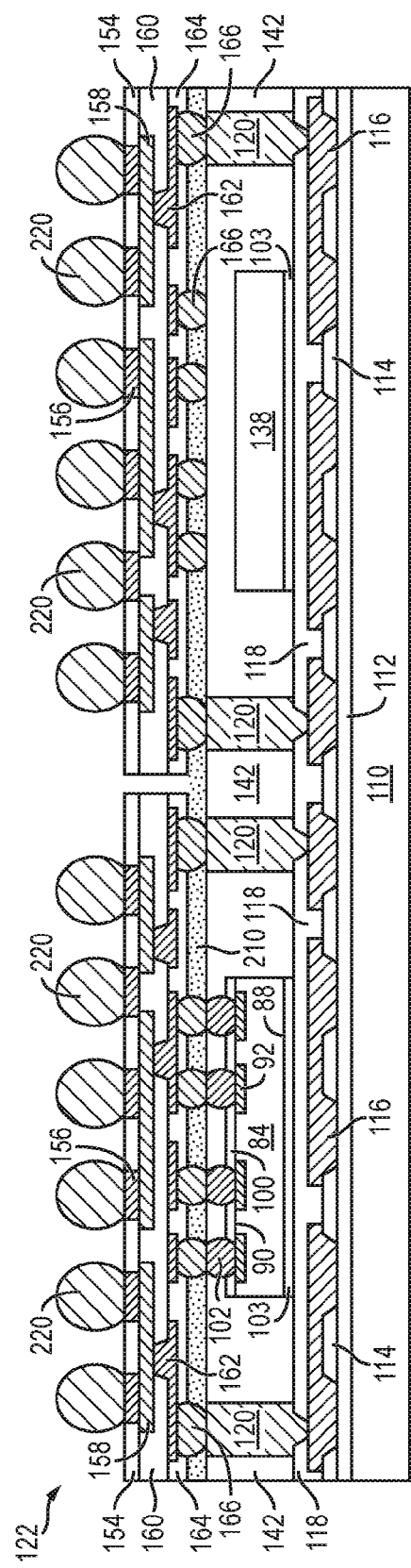

In FIG. 5h, continuing from FIG. 5e, temporary carrier 150 and optional interface layer 152 are removed from KGU 200 and rejected units 202 by chemical etching, mechanical peel-off, chemical mechanical planarization (CMP), mechanical grinding, thermal bake, laser scanning, or wet stripping. Insulating layer 154 and conductive layer 156 of KGU 200 and rejected units 202 are exposed after carrier 150 and interface layer 152 are removed. In one embodiment, additional laser ablation and wet etch cleaning are used to expose conductive layer 156, similar to the additional laser ablation and wet etch cleaning of shown in FIG. 3h.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, laser drilling or wet striping or cleaning may be used to open interconnection pads of first side redistribution interconnect structure 124 prior to the solder bumping process. In one embodiment, the bump material is reflowed by heating the material above its melting point to form spherical balls or bumps 220. In some applications, bumps 220 are reflowed a second time to improve electrical contact to conductive layer 156. In one embodiment, bumps 220 are formed over a UBM having a wetting layer, barrier layer, and adhesive layer. The bumps 220 can also be compression bonded or TCB to conductive layer 156. Bumps 220 represent one type of interconnect structure that can be formed over conductive layer 156. The interconnect structure can also use conductive pillars, bond wires, conductive paste, stud bump, micro bump, or other electrical interconnect.

In FIG. 5i, an optional backgrinding tape or support tape 222 is applied over reconstituted panel 122 and in contact with interconnect structure 220. In one embodiment, support tape 222 includes a thermally resistant tape, warpage balancing tape, or other tape. For example, support tape 222 may include a material having high thermal conductivity and high heat resistance. Alternatively, reconstituted panel 122 is placed in a supporting jig with or without support tape 222.

In FIG. 5i, temporary carrier 110 and optional interface layer 112 are removed from reconstituted panel 122 by chemical etching, mechanical peel-off, CMP, mechanical grinding, thermal bake, laser scanning, or wet stripping. Insulating layer 114 and conductive layer 116 of KGU 134 and rejected units 136 are exposed after carrier 110 and interface layer 112 are removed. In one embodiment, additional laser ablation and wet etch cleaning are used to expose conductive layer 116. In one embodiment, a laser may be used to release carrier 110, followed by wet cleaning process, including solvent cleaning or etching. In one embodiment, copper organic solderability preservative (OSP) is applied over conductive layer 116 to protect conductive layer 116 from oxidation in storage. In another embodiment, solder paste is applied over conductive layer 116 to form SOP before removing support tape 222. In FIG. 5i, reconstituted panel 122 is singulated using a saw blade or laser cutting tool 224 into individual 3D fan-out dual side RDL WLCSP 230 and rejected units 232. In one embodiment, carrier 110 and interface layer 112 are removed prior to singulation with saw blade or laser cutting tool 224. After singulation, 3D fan-out dual side RDL WLCSP 230 is ready for surface mount technology (SMT).

FIG. 6 shows 3D fan-out dual side RDL WLCSP 230. First side redistribution interconnect structure 124 and second side redistribution interconnect structure 170 are processed on different temporary or sacrificial carriers, on different manufacturing lines, and are processed at the same time, i.e., simultaneously, to shorten overall manufacturing time, or CT. In one embodiment, first side redistribution interconnect structure 124 includes a smaller size or footprint, while second side redistribution interconnect structure 170 includes a greater size or footprint. In one embodiment, first side redistribution interconnect structure 124 is manufactured using a lower resolution, e.g., 250 nm, while second side redistribution interconnect structure 170 is manufactured using a higher resolution, e.g., 90 nm resolution. The higher resolution manufacturing line is more costly than the lower resolution manufacturing line. Accordingly, producing first side redistribution interconnect structure 124 on the higher resolution manufacturing line would be wasteful, and is avoided. First side redistribution interconnect structure 124 and second side redistribution interconnect structure 170 are processed on different manufacturing lines using different technology nodes, increasing efficiency. Semiconductor die 84, first side redistribution interconnect structure 124, and second side redistribution interconnect structure 170 are each fully tested prior to assembly. By testing semiconductor die 84, first side redistribution interconnect structure 124, and second side redistribution interconnect structure 170, only known good die and known good RDL's are combined, increasing yield and decreasing KGD loss. By reducing the number of temporary bonding and debonding steps, as compared to traditional methods of manufacturing semiconductor packages having first and second side RDLs, TTV of 3D fan-out dual side RDL WLCSP 230 is decreased. TTV of 3D fan-out dual side RDL WLCSP 230 is less than or equal to 2 mm. In one embodiment, TTV of 3D fan-out dual side RDL WLCSP 230 is less than 1 mm. Accordingly, 3D fan-out dual side RDL WLCSP 230 is produced with lower TTV, shorter CT, higher yield, increased efficiency, and reduced KGD loss. The ability to produce 3D fan-out dual side RDL WLCSP 230 with reduced CT allows for less inventory storage, further reducing loss to obsolesce of stored inventory. The concept of "zero" inventory reduces waste of out of date product. CT is a valuable consideration based on current market trends, especially for fabless and outsourced semiconductor assembly and test (OSAT) business models.

Figure 7:
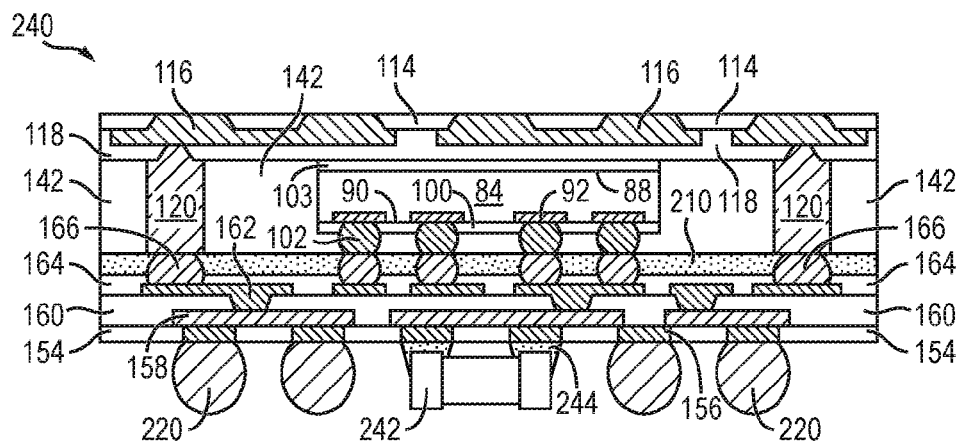
FIG. 7 illustrates another 3D fan-out dual side RDL WLCSP including a discrete passive device.

FIG. 7 shows 3D fan-out dual side RDL WLCSP 240, similar to 3D fan-out dual side RDL WLCSP 230. 3D fan-out dual side RDL WLCSP 240 is manufactured using the same method of forming a 3D semiconductor package with short cycle time and high yield shown in FIGS. 3a-5i. 3D fan-out dual side RDL WLCSP 240 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 240 also includes discrete passive device 242 mounted to KGU 200 of second side redistribution interconnect structure 170 using adhesive 244. Adhesive 244 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 244 is generally only minimally conductive. In some embodiments, adhesive 244 includes a non-conductive material. Passive 242 is mounted to KGU 200 of second side redistribution interconnect structure 170 after formation of bumps 220.

Figure 8A:
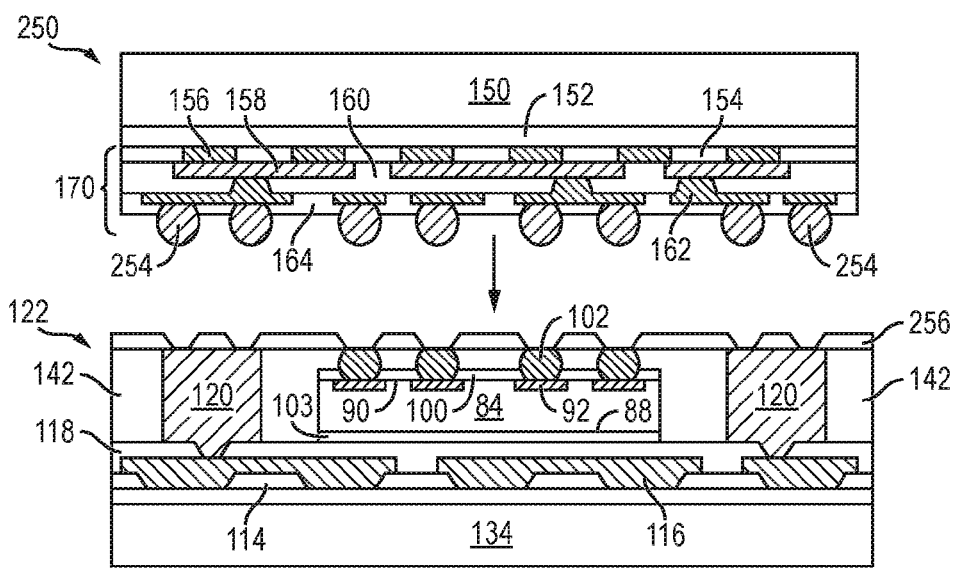
FIGS. 8a-8b illustrate a 3D fan-out dual side RDL WLCSP with an alternate second side redistribution interconnect structure.

FIG. 8a shows second side redistribution interconnect structure 250, similar to second side redistribution interconnect structure 170. Second side redistribution interconnect structure 250 includes multiple interconnects or bumps 254 in place of bumps 166 in second side redistribution interconnect structure 170. A plurality of bumps 254 is configured to contact each conductive pillar 120 of first side redistribution interconnect structure 124. FIG. 8a shows an insulating or passivation layer 256 formed over reconstituted panel 122, bumps 102, and conductive pillars 120 of first side redistribution interconnect structure 124 using PVD, CVD, printing, spin coating, spray coating, sintering or thermal oxidation. Insulating layer 256 contains one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 256 is removed by LDA, etching, or other suitable process to expose bumps 102 and conductive pillars 120. In one embodiment, additional laser ablation and wet etch cleaning are used to expose conductive pillars 120 and bumps 102.

Figure 8B:
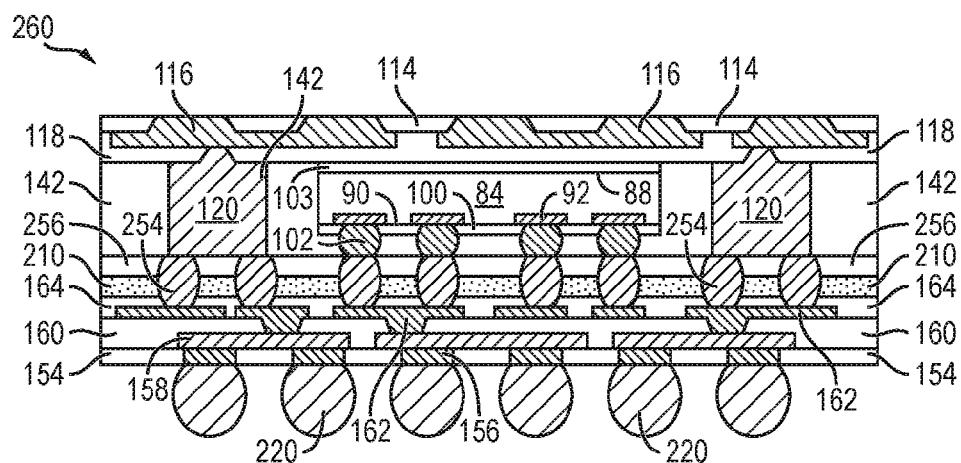

FIG. 8b shows 3D fan-out dual side RDL WLCSP 260, similar to 3D fan-out dual side RDL WLCSP 230. 3D fan-out dual side RDL WLCSP 260 is manufactured using the same method of forming a 3D semiconductor package with short cycle time and high yield shown in FIGS. 3a-5i. 3D fan-out dual side RDL WLCSP 260 includes second side redistribution interconnect structure 250 in place of second side redistribution interconnect structure 170 and additional insulating or passivation layer 256 formed over reconstituted panel 122, bumps 102, and conductive pillars 120 of first side redistribution interconnect structure 124. 3D fan-out dual side RDL WLCSP 260 enjoys all of the benefits of 3D fan-out dual side RDL WLCSP 230, including reduced TTV, reduced CT, increased yield, increased efficiency, and reduced loss to obsolesce of stored inventory.

Figure 9:
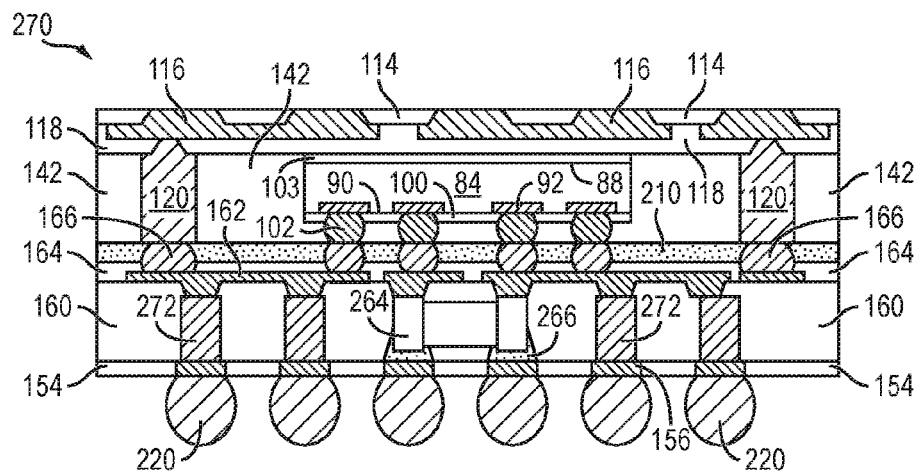
FIG. 9 illustrates another 3D fan-out dual side RDL WLCSP including a discrete passive device.

FIG. 9 shows 3D fan-out dual side RDL WLCSP 270, similar to 3D fan-out dual side RDL WLCSP 230. 3D fan-out dual side RDL WLCSP 270 is manufactured using the same method of forming a 3D semiconductor package with short cycle time and high yield shown in FIGS. 3a-5i. 3D fan-out dual side RDL WLCSP 270 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 270 also includes discrete passive device 264 embedded in second side redistribution interconnect structure 170 and bonded to conductive layer 156 using adhesive 266. Adhesive 266 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 266 is generally only minimally conductive. In some embodiments, adhesive 266 includes a non-conductive material. 3D fan-out dual side RDL WLCSP 270 also includes conductive pillars 272, similar to conductive pillars 120, formed between conductive layers 156 and 162 of second side redistribution interconnect structure 170. Conductive pillars 272 represent one type of interconnect structure that can be formed between conductive layers 156 and 162 of second side redistribution interconnect structure 170. The interconnect structure can also use bumps, bond wires, conductive paste, stud bump, micro bump, or other electrical interconnect.

Figure 10:
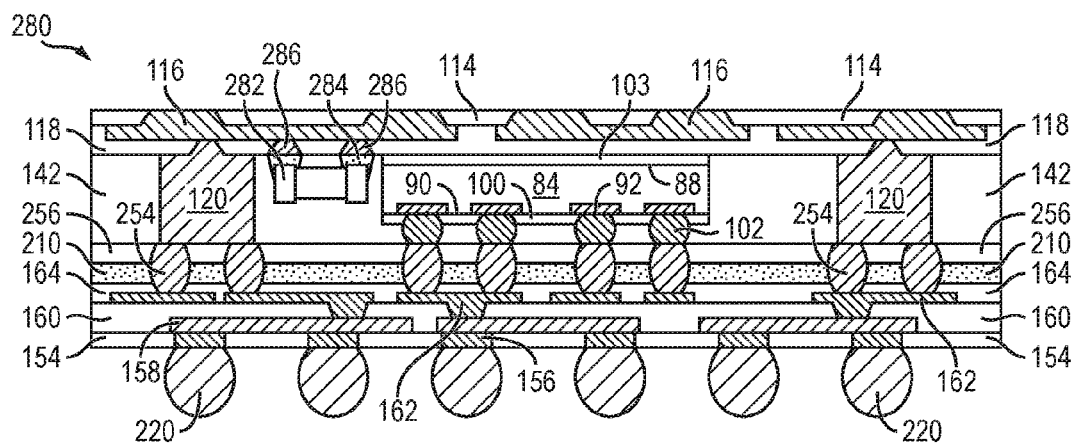
FIG. 10 illustrates a 3D fan-out dual side RDL WLCSP with an alternate second side redistribution interconnect structure and a discrete passive device.

FIG. 10 shows 3D fan-out dual side RDL WLCSP 280, similar to 3D fan-out dual side RDL WLCSP 260. 3D fan-out dual side RDL WLCSP 280 is manufactured using the same method of forming a 3D semiconductor package with short cycle time and high yield shown in FIGS. 3a-5i, with second side redistribution interconnect structure 250 in place of second side redistribution interconnect structure 170 and further including insulating or passivation layer 256. Insulating layer 256 is formed over reconstituted panel 122, bumps 102, and conductive pillars 120 using PVD, CVD, printing, spin coating, spray coating, sintering or thermal oxidation. Insulating layer 256 contains one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 256 is removed by LDA, etching, or other suitable process to expose bumps 102 and conductive pillars 120. 3D fan-out dual side RDL WLCSP 280 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 280 also includes discrete passive device 282 disposed over first side redistribution interconnect structure 124 and bonded to conductive layer 286 using adhesive 284.

Conductive layer 286 is formed by depositing conductive material in vias in insulating layer 118. Conductive layer 286 can be one or more layers of Al, Cu, Sn, Ni, Au, Ag, or other suitable electrically conductive material, such as the conductive material used to form conductive pillars 120. Conductive layer 286 may be formed at the same time and in the same manner as conductive pillars 120. Adhesive 284 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 284 is generally only minimally conductive. In some embodiments, adhesive 284 includes a non-conductive material.

Figure 11:
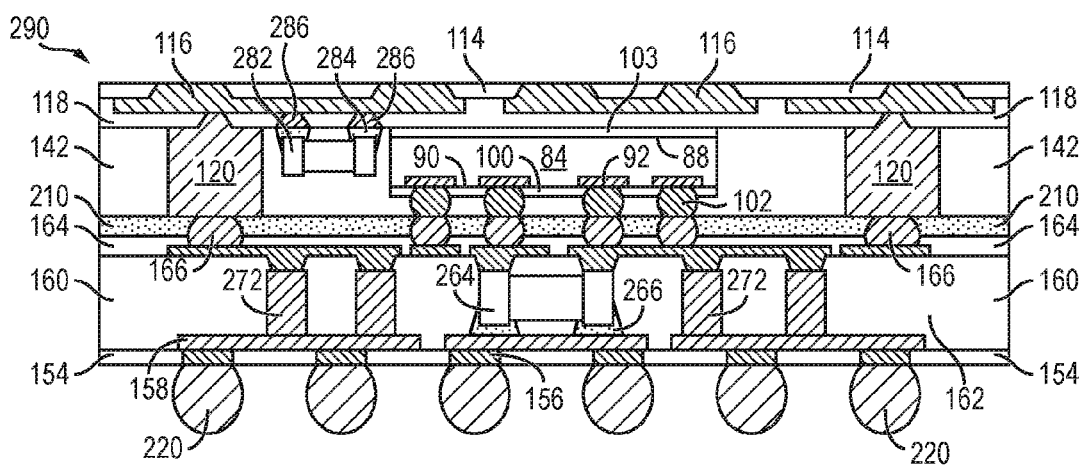
FIG. 11 illustrates another 3D fan-out dual side RDL WLCSP including discrete passive devices.

FIG. 11 shows 3D fan-out dual side RDL WLCSP 290, similar to 3D fan-out dual side RDL WLCSP 230. 3D fan-out dual side RDL WLCSP 290 is manufactured using the same method of forming a 3D semiconductor package with short cycle time and high yield shown in FIGS. 3a-5i. 3D fan-out dual side RDL WLCSP 290 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 290 also includes discrete passive device 264 embedded in second side redistribution interconnect structure 170 and bonded to conductive layer 156 using adhesive 266. 3D fan-out dual side RDL WLCSP 290 also includes conductive pillars 272, similar to conductive pillars 120, formed between conductive layers 156 and 162 of second side redistribution interconnect structure 170. Conductive pillars 272 represent one type of interconnect structure that can be formed between conductive layers 156 and 162 of second side redistribution interconnect structure 170. The interconnect structure can also use bumps, bond wires, conductive paste, stud bump, micro bump, or other electrical interconnect. 3D fan-out dual side RDL WLCSP 290 also includes discrete passive device 282 disposed over first side redistribution interconnect structure 124 and bonded to conductive layer 286 using adhesive 284. Conductive layer 286 is formed by depositing conductive material in vias in insulating layer 118. Conductive layer 286 can be one or more layers of Al, Cu, Sn, Ni, Au, Ag, or other suitable electrically conductive material, such as the conductive material used to form conductive pillars 120. Conductive layer 286 may be formed at the same time and in the same manner as conductive pillars 120. Adhesive 284 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, a suitable wafer backside coating, epoxy resin with organic filler, silica filler, or polymer filler, acrylate based adhesive, epoxy-acrylate adhesive, or a PI-based adhesive. Adhesive 284 is generally only minimally conductive. In some embodiments, adhesive 284 includes a non-conductive material.

Figure 12:
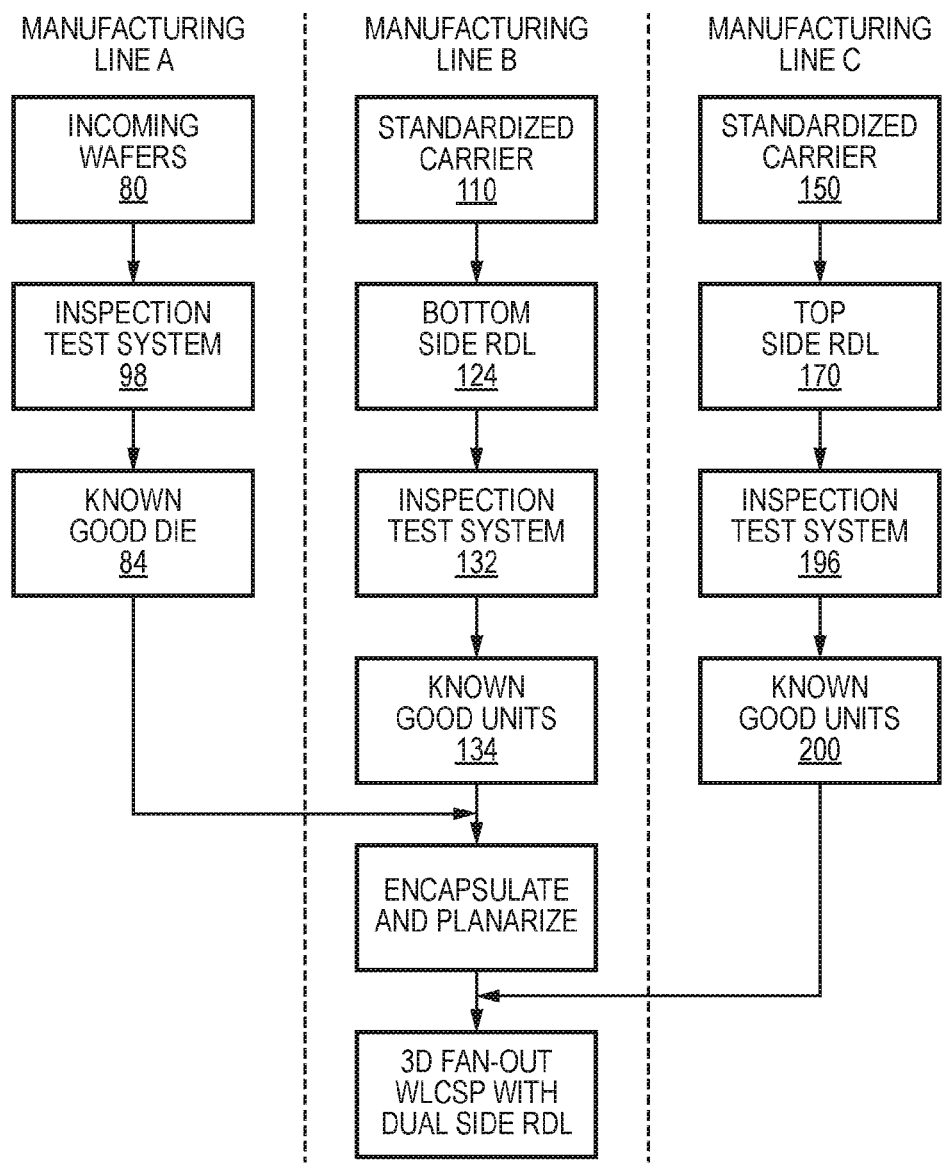
FIG. 12 illustrates a process of forming a 3D fan-out dual side RDL WLCSP.

FIG. 12 summarizes the method of forming a 3D semiconductor package with short cycle time and high yield shown in FIGS. 3a-5i. In particular, FIG. 12 illustrates how three different manufacturing lines are used at the same time, i.e., simultaneously, to greatly reduce CT for producing a 3D fan-out dual side RDL WLCSP. Additionally, FIG. 12 illustrates how different intermediate inspecting and testing protocols are used at intermediate stages of production to greatly increase yield and decrease loss of KGD 84 for producing a 3D fan-out dual side RDL WLCSP. The method of forming a 3D semiconductor package with short cycle time and high yield shown in FIG. 12 can be used to manufacture any of the 3D fan-out dual side RDL WLCSPs discussed above, including 3D fan-out dual side RDL WLCSP 230, 3D fan-out dual side RDL WLCSP 240, 3D fan-out dual side RDL WLCSP 260, 3D fan-out dual side RDL WLCSP 270, 3D fan-out dual side RDL WLCSP 280, or 3D fan-out dual side RDL WLCSP 290. Incoming semiconductor wafers 80 are processed, inspected, and diced on manufacturing line A. Insulating layer 100, bumps 102, and optional die attach adhesive 103 are formed on manufacturing line A. First side redistribution interconnect structure 124 is fabricated and inspected on manufacturing line B. Second side redistribution interconnect structure 170 is fabricated, inspected, and diced on manufacturing line C. First side redistribution interconnect structure 124 and second side redistribution interconnect structure 170 are fabricated on different temporary or sacrificial carriers, and are processed at the same time, i.e., simultaneously, to shorten overall manufacturing time, or CT. Manufacturing lines A, B, and C all run simultaneously to produce the 3D fan-out dual side RDL WLCSP, reducing CT. In one embodiment, first side redistribution interconnect structure 124 is manufactured using a lower resolution, e.g., 250 nm, while second side redistribution interconnect structure 170 is manufactured using a higher resolution, e.g., 90 nm resolution. In one embodiment, manufacturing line B possesses a lower resolution, e.g., 250 nm, while manufacturing line C possesses a higher, i.e., greater, resolution, e.g., 90 nm resolution. The higher resolution manufacturing line is more costly to operate than the lower resolution manufacturing line. Accordingly, fabricating first side redistribution interconnect structure 124 on the higher resolution manufacturing line would be wasteful, and is avoided. The method of forming a 3D semiconductor package with short cycle time and high yield shown in FIG. 12 eliminates such waste. First side redistribution interconnect structure 124 and second side redistribution interconnect structure 170 are processed on different manufacturing lines using different technology nodes, increasing efficiency. Semiconductor die 84, first side redistribution interconnect structure 124, and second side redistribution interconnect structure 170 are each fully tested prior to assembly. By testing semiconductor die 84, first side redistribution interconnect structure 124, and second side redistribution interconnect structure 170, only known good die and known good RDLs are combined, increasing yield and decreasing KGD loss. Accordingly, 3D fan-out dual side RDL WLCSP 230 is produced with lower TTV, shorter CT, higher yield, increased efficiency, and reduced KGD loss. The ability to produce a 3D fan-out dual side RDL WLCSP with reduced CT allows for less inventory storage, further increasing efficiency by reducing loss to obsolesce of stored inventory.

Figure 13A:
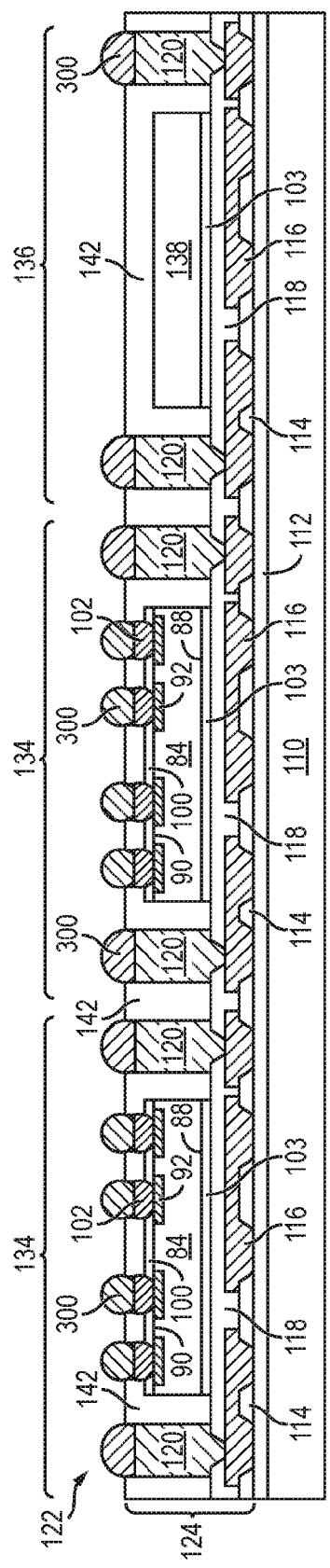

FIGS. 13a-14h illustrate, in relation to FIG. 1, a method of forming a 3D semiconductor package with short cycle time and high yield. FIG. 13a, continuing from FIG. 3j, shows micro bumps 300 formed over bumps 102 and conductive pillars 120 of reconstituted panel 122. In one embodiment, a micro bumping process using either a copper pillar bump having a solder cap or only a solder bump is used to form solder bumps on exposed bumps 102 and conductive pillars 120 of reconstituted panel 122. In one embodiment, an electrically conductive bump material is deposited over bumps 102 and conductive pillars 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to bumps 102 and conductive pillars 120 using a suitable attachment or bonding process. In one embodiment, the bump material is reflowed by heating the material above its melting point to form spherical balls or micro bumps 300. In some applications, micro bumps 300 are reflowed a second time to improve electrical contact to bumps 102 and conductive pillars 120. In one embodiment, micro bumps 300 are formed over a UBM having a wetting layer, barrier layer, and adhesive layer. Micro bumps 300 can also be compression bonded or TCB to bumps 102 and conductive pillars 120. Micro bumps 300 represent one type of interconnect structure that can be formed over bumps 102 and conductive pillars 120. The interconnect structure can also use conductive pillars, bond wires, conductive paste, stud bump, or other electrical interconnect.

Figure 13B:
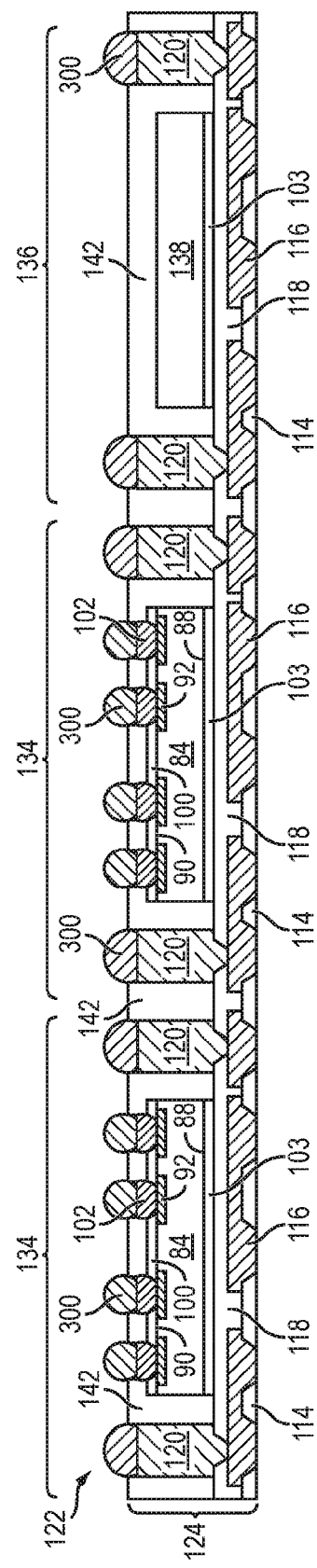

In FIG. 13b, temporary carrier 110 and optional interface layer 112 are removed from reconstituted panel 122 by chemical etching, mechanical peel-off, CMP, mechanical grinding, thermal bake, laser scanning, or wet stripping. Insulating layer 114 and conductive layer 116 of KGU 134 and rejected units 136 are exposed after carrier 110 and interface layer 112 are removed. In one embodiment, additional laser ablation and wet etch cleaning are used to expose conductive layer 116, as shown in FIG. 3h. Laser, thermal debonding, or grinding processes are applied to separate first side redistribution interconnect structure 124 from carrier 110 and interface layer 112.

In FIG. 13c, reconstituted panel 122 of first side redistribution interconnect structure 124 is singulated using a saw blade or laser cutting tool 204 into individual KGU 134 and rejected units 136. In one embodiment, carrier 110 is removed prior to singulation with saw blade or laser cutting tool 204. In one embodiment, rejected units 136 are discarded.

FIG. 14a, continuing from FIG. 4a, shows additional conductive layers 158 and 162 formed over insulating layer 154, conductive layer 156, and carrier 150 of reconstituted panel 122. Electrically conductive layers 158 and 162 are formed using a patterning and metal deposition process such as sputtering, electrolytic plating, and electroless plating. Conductive layer 158 can be one or more layers of Al, Cu, Sn, Ni, Au, Ag, or other suitable electrically conductive material. Portions of conductive layers 158 and 162 can be electrically common or electrically isolated depending on the design and function of the final semiconductor package. Second side redistribution interconnect structure 170 further includes insulating or passivation layers 160 and 164, formed between the conductive layers for electrical isolation. Insulating layers 160 and 164 contain one or more layers of SiO2, Si3N4, SiON, Ta2O5, Al2O3, HfO2, BCB, PI, PBO, polymer dielectric resist with or without fillers or fibers, or other material having similar structural and dielectric properties. Insulating layers 160 and 164 are formed using PVD, CVD, printing, spin coating, spray coating, sintering or thermal oxidation. A portion of insulating layer 160 is removed by LDA, etching, or other suitable process to expose conductive layer 158 for additional package interconnect. A portion of insulating layer 164 is removed by LDA, etching, or other suitable process to expose conductive layer 162 for bump formation or additional package interconnect. In some embodiments, second side redistribution interconnect structure 170 further includes additional conductive and insulating layers formed over carrier 150. In one embodiment, second side redistribution interconnect structure 170 includes a greater number of conductive and insulating layers than first side redistribution interconnect structure 124.

In FIG. 14a, second side redistribution interconnect structure 170 undergoes electrical testing and inspection as part of a quality control process. Manual visual inspection and automated optical systems are used to perform inspections on second side redistribution interconnect structure 170. Software can be used in the automated optical analysis of second side redistribution interconnect structure 170. Visual inspection methods may employ equipment such as a scanning electron microscope, high-intensity or ultra-violet light, or metallurgical microscope. Second side redistribution interconnect structure 170 is inspected for structural characteristics including warpage, thickness variation, surface particulates, irregularities, cracks, delamination, and discoloration.

The electrical connections within each unit 190 of second side redistribution interconnect structure 170 undergo testing at the carrier level for electrical performance and circuit function. Each unit 190 is tested for functionality and electrical parameters, as shown in FIG. 14a, using a test probe head 192 including a plurality of probes or test leads 194, or other testing device. Probes 194 are used to make electrical contact with nodes or conductive layer 162 on each unit 190 and provide electrical stimuli to second side redistribution interconnect structure 170. Unit 190 responds to the electrical stimuli, which is measured by computer test system 196 and compared to an expected response to test functionality of the unit. The electrical tests may include functionality, lead integrity, resistivity, continuity, reliability, ESD, RF performance, and operational parameters specific to the component type.

FIG. 14b shows an optional copper OSP 302 applied over conductive layer 162 to protect conductive layer 162 from oxidation in storage. In another embodiment, solder paste is applied over conductive layer 162 to form an SOP protective layer. In one embodiment, an optional NCF is formed over conductive layer 162 after testing.

FIG. 14c shows KGU 134 and KGD 84 from FIG. 13c mounted to KGU 200 of panel 172 using, for example, a pick and place operation with bumps 300 oriented toward the carrier and aligned with conductive layer 162 of KGU 200. FIG. 14c also shows rejected units 136 and dummy die 138 mounted to rejected units 202 of panel 172 using, for example, a pick and place operation. In one embodiment, TCB is used to mount KGU 134 and KGD 84 to KGU 200 and to mount rejected units 136 and dummy die 138 to rejected units 202 at the reconstituted panel or reconfigured wafer level. By testing units 136 of first side redistribution interconnect structure 124 and KGD 84 prior to mounting to KGU 200 of second side redistribution interconnect structure 170, mounting a defective second side redistribution interconnect structure to KGD is avoided, increasing yield and decreasing KGD loss.

Figure 14D:
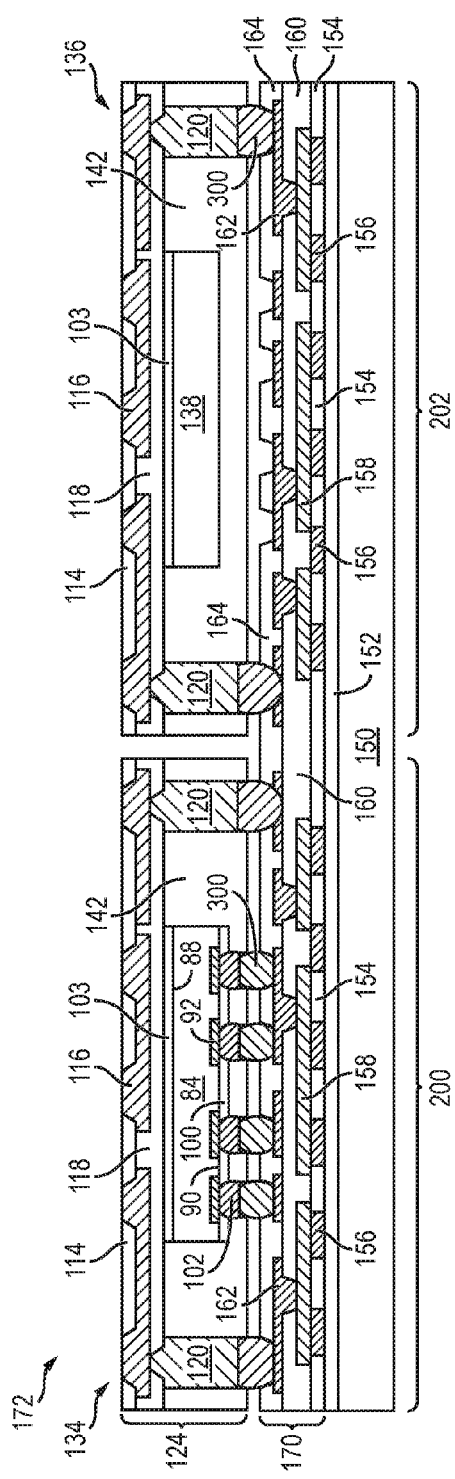

In FIG. 14d, micro bumps 300 are reflowed to bond KGU 134 of first side redistribution interconnect structure 124 and KGD 84 to KGU 200 of second side redistribution interconnect structure 170 and rejected units 136 of first side redistribution interconnect structure 124 and dummy die 138 to rejected units 202 of second side redistribution interconnect structure 170. In one embodiment, additional laser ablation and wet etch cleaning are performed, after reflow. In one embodiment, after reflow, carrier 110 and interface layer 112 are delaminated from first side redistribution interconnect structure 124.

Figure 14E:
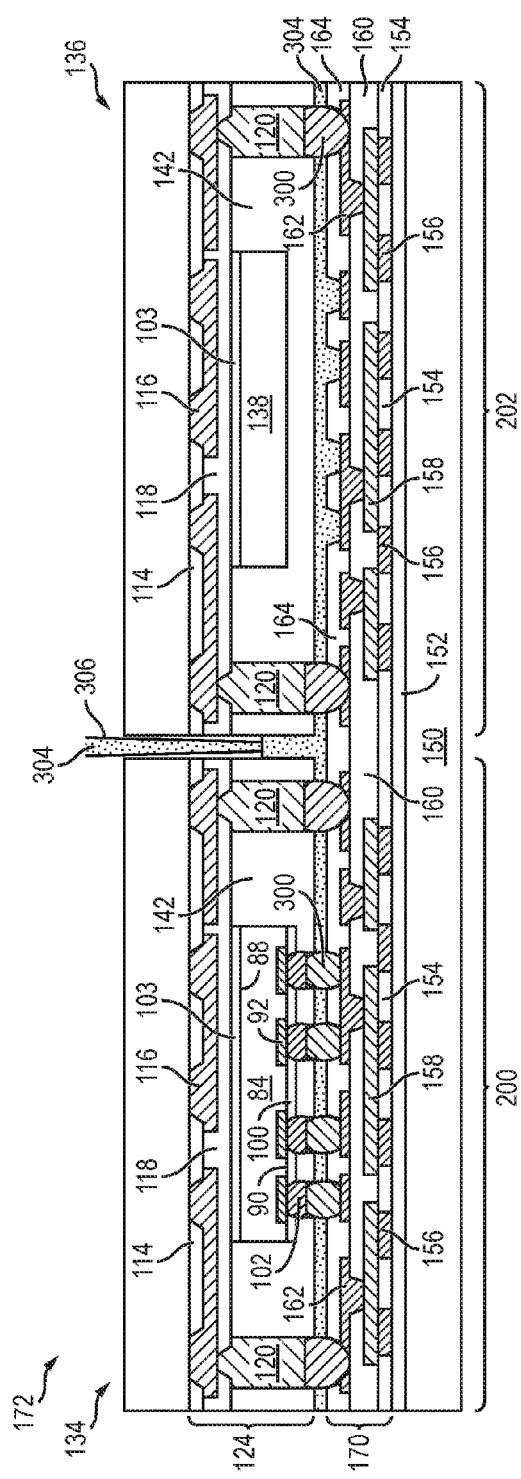

FIG. 14e shows an optional underfill material 304 deposited between KGU 134 of first side redistribution interconnect structure 124 and KGU 200 of second side redistribution interconnect structure 170 using dispensing needle 306. Underfill materials include epoxy, epoxy-resin adhesive material, polymeric materials, films, or other non-conductive materials. Underfill 304 is non-conductive and environmentally protects the semiconductor device from external elements and contaminants. In one embodiment, underfill 304 is a CUF. In another embodiment, underfill 304 is an MUF. In one embodiment, a TCB process is conducted with NCP or NCF. Thermal high pressure oven curing is performed after underfill 304 is dispensed. In one embodiment, MUF 304 with molding is disposed after flip chip attachment. An optional back grinding step is used to expose conductive layer 116 of KGU 134 when there is overmold of MUF 304 over conductive layer 116 of KGU 134.

In FIG. 14f, temporary carrier 150 and optional interface layer 152 are removed from KGU 200 and rejected units 202 of second side redistribution interconnect structure 170 by chemical etching, mechanical peel-off, CMP, mechanical grinding, thermal bake, laser scanning, or wet stripping. Insulating layer 154 and conductive layer 156 of KGU 200 and rejected units 202 are exposed after carrier 150 and interface layer 152 are removed. In one embodiment, additional laser ablation and wet etch cleaning are used to expose conductive layer 156. In one embodiment, copper OSP is applied over conductive layer 156 to protect conductive layer 156 from oxidation in storage. In another embodiment, solder paste is applied over conductive layer 156 to form a protective SOP layer. In one embodiment, a laser may be used to release carrier 150, followed by wet cleaning process, including solvent cleaning or etching.

In FIG. 14g, an electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 306. In some applications, bumps 306 are reflowed a second time to improve electrical contact to conductive layer 156. In one embodiment, bumps 306 are formed over a UBM having a wetting layer, barrier layer, and adhesive layer. Bumps 306 can also be compression bonded or TCB to conductive layer 156. Bumps 306 represent one type of interconnect structure that can be formed over conductive layer 156. The interconnect structure can also use conductive pillars, bond wires, conductive paste, stud bump, micro bump, or other electrical interconnect.

Figure 14H:
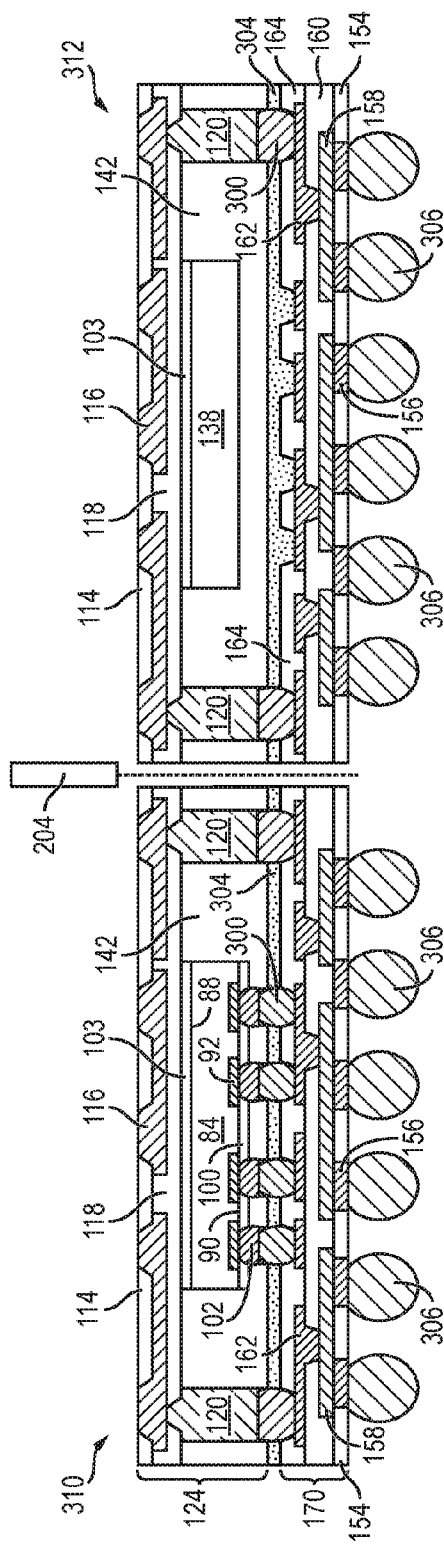

In FIG. 14h, KGU 200 and rejected units 202 of panel 172 are singulated using a saw blade or laser cutting tool 204 into individual 3D fan-out dual side RDL WLCSP 310 and rejected units 312. After singulation, 3D fan-out dual side RDL WLCSP 310 is ready for SMT.

Figure 15:
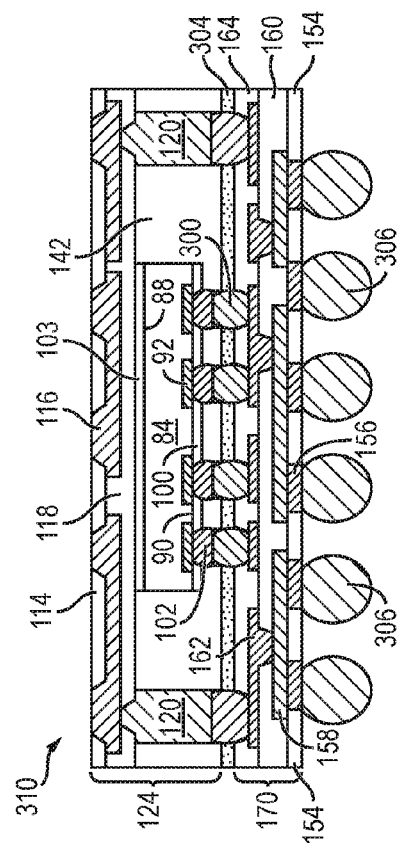
FIG. 15 illustrates a 3D fan-out dual side RDL WLCSP.

FIG. 15 shows 3D fan-out dual side RDL WLCSP 310. First side redistribution interconnect structure 124 and second side redistribution interconnect structure 170 are processed on different temporary or sacrificial carriers, on different manufacturing lines, and are processed at the same time, i.e., simultaneously, to shorten overall manufacturing time, or CT. In one embodiment, first side redistribution interconnect structure 124 includes a smaller size or footprint, while second side redistribution interconnect structure 170 includes a greater size or footprint. In one embodiment, first side redistribution interconnect structure 124 is manufactured using a lower resolution, e.g., 250 nm, while second side redistribution interconnect structure 170 is manufactured using a higher resolution, e.g., 90 nm resolution. The higher resolution manufacturing line is more costly than the lower resolution manufacturing line. Accordingly, producing first side redistribution interconnect structure 124 on the higher resolution manufacturing line would be wasteful, and is avoided. First side redistribution interconnect structure 124 and second side redistribution interconnect structure 170 are processed on different manufacturing lines using different technology nodes, increasing efficiency. Semiconductor die 84, first side redistribution interconnect structure 124, and second side redistribution interconnect structure 170 are each fully tested prior to assembly. By testing semiconductor die 84, first side redistribution interconnect structure 124, and second side redistribution interconnect structure 170, only known good die and known good RDL's are combined, increasing yield and decreasing KGD loss. By reducing the number of temporary bonding and debonding steps, as compared to traditional methods of manufacturing semiconductor packages having first and second side RDLs, TTV of 3D fan-out dual side RDL WLCSP 310 is decreased. TTV of 3D fan-out dual side RDL WLCSP 310 is less than or equal to 2 mm. In one embodiment, TTV of 3D fan-out dual side RDL WLCSP 310 is less than 1 mm. Accordingly, 3D fan-out dual side RDL WLCSP 310 is produced with lower TTV, shorter CT, higher yield, increased efficiency, and reduced KGD loss. The ability to produce 3D fan-out dual side RDL WLCSP 310 with reduced CT allows for less inventory storage, further reducing loss to obsolesce of stored inventory. The concept of "zero" inventory reduces waste of out of date product. CT is a valuable consideration based on current market trends, especially for fabless and OSAT business models.

Figure 16A:
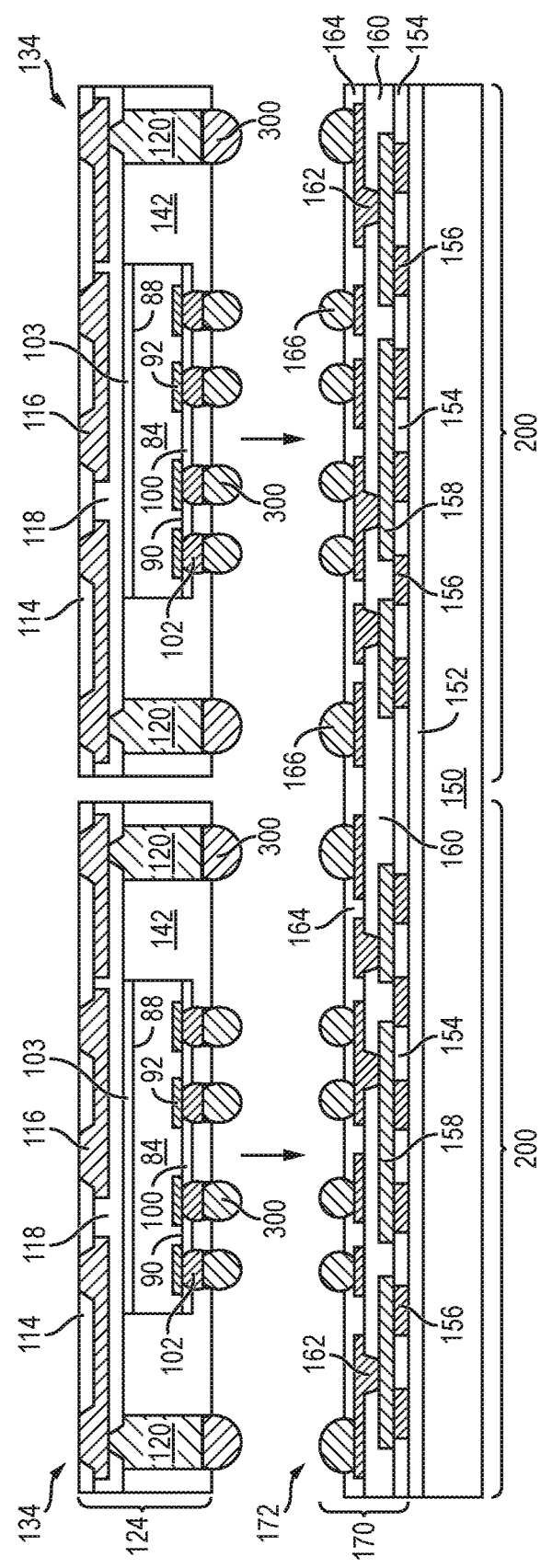
FIGS. 16a-16c illustrate another process of forming a 3D fan-out dual side RDL WLCSP.

FIG. 16a shows shows KGU 134 and KGD 84 from FIG. 13c disposed over panel 172 with KGU 200 from FIG. 4d using, for example, a pick and place operation with bumps 300 oriented toward the carrier and aligned with bumps 166 of KGU 200. In one embodiment, TCB is used to mount KGU 134 and KGD 84 to KGU 200 at the reconstituted panel or reconfigured wafer level. By testing units 136 of first side redistribution interconnect structure 124 and KGD 84 prior to mounting to KGU 200 of second side redistribution interconnect structure 170, mounting a defective second side redistribution interconnect structure to KGD is avoided, increasing yield and decreasing KGD loss.

Figure 16B:
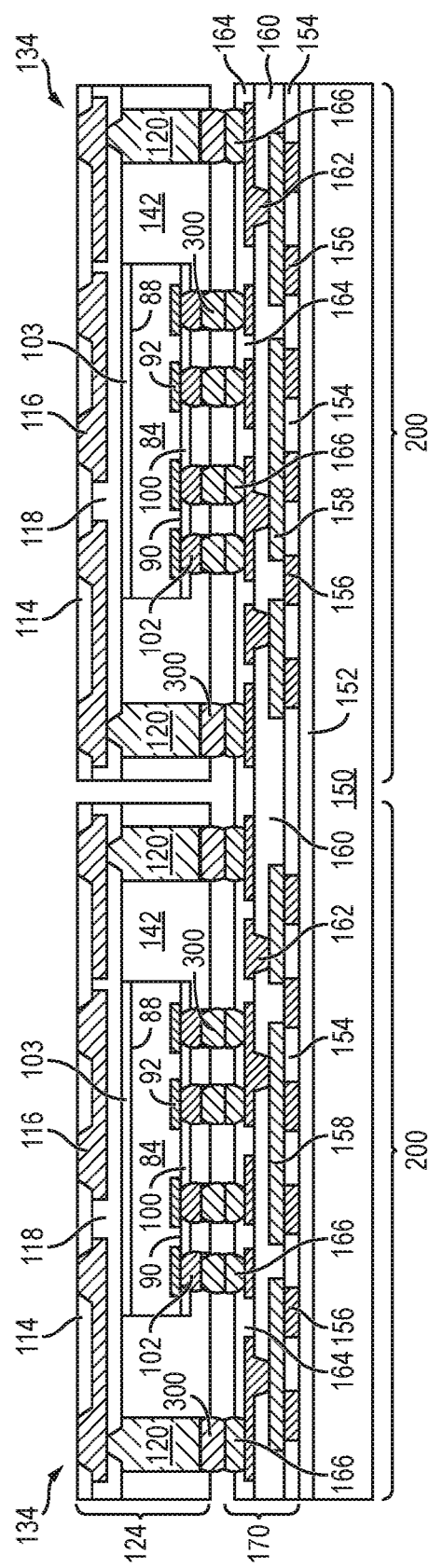

In FIG. 16b, micro bumps 300 are reflowed to bond KGD 84 and KGU 134 of first side redistribution interconnect structure 124 to KGU 200 of second side redistribution interconnect structure 170. In one embodiment, additional laser ablation and wet etch cleaning are performed, after reflow.

Figure 16C:
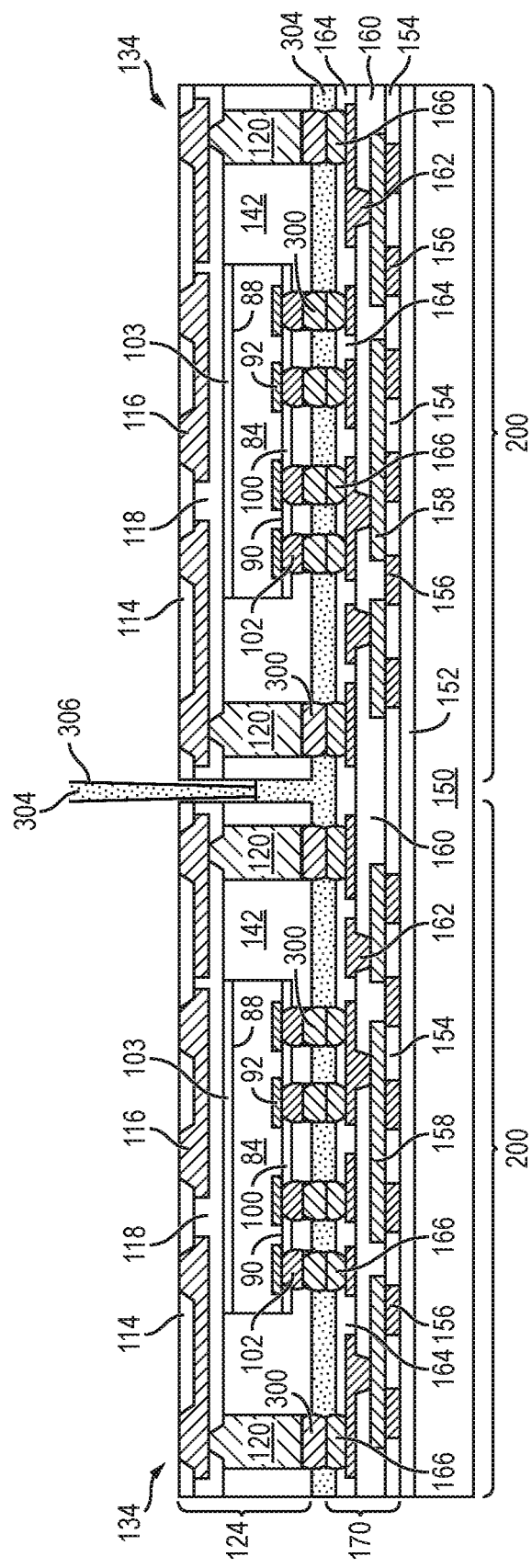

FIG. 16c shows an optional underfill material 304 deposited between KGU 134 of first side redistribution interconnect structure 124 and KGU 200 of second side redistribution interconnect structure 170 using dispensing needle 306. Underfill materials include epoxy, epoxy-resin adhesive material, polymeric materials, films, or other non-conductive materials. Underfill 304 is non-conductive and environmentally protects the semiconductor device from external elements and contaminants. In one embodiment, underfill 304 is a CUF. In another embodiment, underfill 304 is an MUF. In one embodiment, a TCB process is conducted with NCP or NCF. Thermal high pressure oven curing is performed after underfill 304 is dispensed. In one embodiment, thermal high pressure oven curing includes microwave heating. In one embodiment, MUF 304 with molding is disposed after flip chip attachment. KGU 134 of first side redistribution interconnect structure 124 including 3D interconnect structure 120, KGD 84, encapsulant 142, and small bumps 300, are mounted on KGU 200 of second side redistribution interconnect structure 170, and followed with underfill process, either CUF or MUF with film assistance to protect first side redistribution interconnect structure 124 or without film assistance at panel level.

Figure 17:
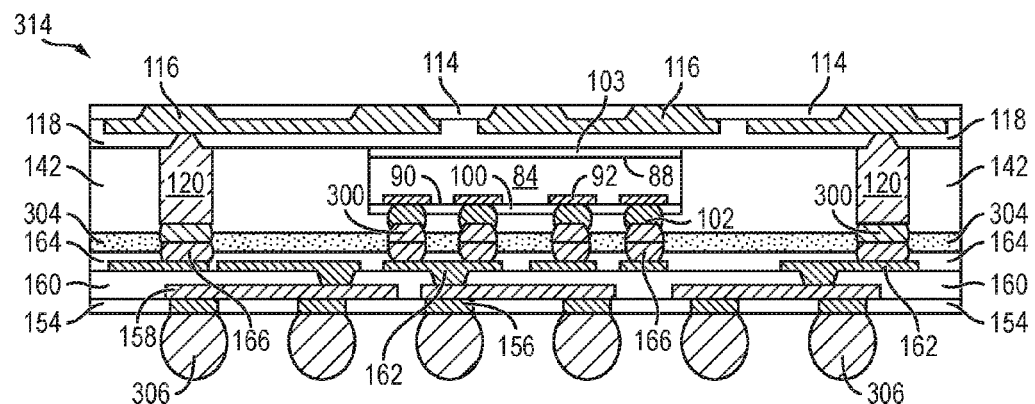
FIG. 17 illustrates another 3D fan-out dual side RDL WLCSP.

In FIG. 17, temporary carrier 150 and optional interface layer 152 are removed from KGU 200 of second side redistribution interconnect structure 170 by chemical etching, mechanical peel-off, CMP, mechanical grinding, thermal bake, laser scanning, or wet stripping. Insulating layer 154 and conductive layer 156 of KGU 200 are exposed after carrier 150 and interface layer 152 are removed. In one embodiment, additional laser ablation and wet etch cleaning are used to expose conductive layer 156. In one embodiment, copper OSP is applied over conductive layer 156 to protect conductive layer 156 from oxidation in storage. In another embodiment, solder paste is applied over conductive layer 156 to form a protective SOP layer. In one embodiment, a laser may be used to release carrier 150, followed by wet cleaning process, including solvent cleaning or etching.

In FIG. 17, an electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 306. In some applications, bumps 306 are reflowed a second time to improve electrical contact to conductive layer 156. In one embodiment, bumps 306 are formed over a UBM having a wetting layer, barrier layer, and adhesive layer. Bumps 306 can also be compression bonded or TCB to conductive layer 156. Bumps 306 represent one type of interconnect structure that can be formed over conductive layer 156. The interconnect structure can also use conductive pillars, bond wires, conductive paste, stud bump, micro bump, or other electrical interconnect.

FIG. 17 shows 3D fan-out dual side RDL WLCSP 314. 3D fan-out dual side RDL WLCSP 314 is ready for SMT. First side redistribution interconnect structure 124 and second side redistribution interconnect structure 170 are processed on different temporary or sacrificial carriers, on different manufacturing lines, and are processed at the same time, i.e., simultaneously, to shorten overall manufacturing time, or CT. In one embodiment, first side redistribution interconnect structure 124 is manufactured using a lower resolution, e.g., 250 nm, while second side redistribution interconnect structure 170 is manufactured using a higher resolution, e.g., 90 nm resolution. The higher resolution manufacturing line is more costly than the lower resolution manufacturing line. Accordingly, producing first side redistribution interconnect structure 124 on the higher resolution manufacturing line would be wasteful, and is avoided. First side redistribution interconnect structure 124 and second side redistribution interconnect structure 170 are processed on different manufacturing lines using different technology nodes, increasing efficiency. Semiconductor die 84, first side redistribution interconnect structure 124, and second side redistribution interconnect structure 170 are each fully tested prior to assembly. By testing semiconductor die 84, first side redistribution interconnect structure 124, and second side redistribution interconnect structure 170, only known good die and known good RDL's are combined, increasing yield and decreasing KGD loss. Accordingly, 3D fan-out dual side RDL WLCSP 314 is produced with lower TTV, shorter CT, higher yield, increased efficiency, and reduced KGD loss. The ability to produce 3D fan-out dual side RDL WLCSP 314 with reduced CT allows for less inventory storage, further reducing loss to obsolesce of stored inventory. The concept of "zero" inventory reduces waste of out of date product. CT is a valuable consideration based on current market trends, especially for fabless and OSAT business models.

Figure 18:
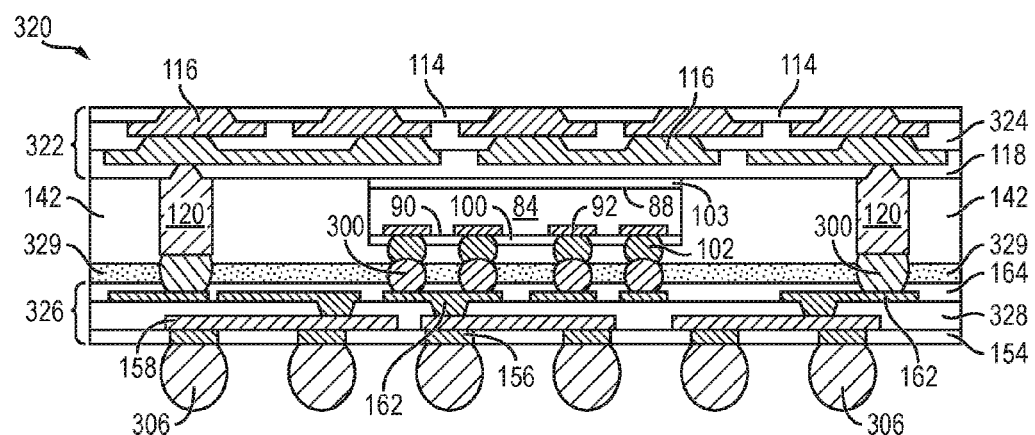
FIG. 18 illustrates a 3D fan-out dual side RDL WLCSP with mid insulating layers.

FIG. 18 shows 3D fan-out dual side RDL WLCSP 320, similar to 3D fan-out dual side RDL WLCSP 310. 3D fan-out dual side RDL WLCSP 320 is manufactured using the same method of forming a 3D semiconductor package with short cycle time and high yield shown in FIGS. 13a-14h. 3D fan-out dual side RDL WLCSP 320 includes first side redistribution interconnect structure 322 in place of first side redistribution interconnect structure 124, second side redistribution interconnect structure 326 in place of second side redistribution interconnect structure 170, and CUF 329 in place of underfill 304. First side redistribution interconnect structure 322 and second side redistribution interconnect structure 326 of 3D fan-out dual side RDL WLCSP 320 include at least one metal layer, and may include more than two metal layers. In one embodiment, second side redistribution interconnect structure 326 includes more metal layers than first side redistribution interconnect structure 322. First side redistribution interconnect structure 322 includes additional conductive and insulating layers compared to first side redistribution interconnect structure 124 including mid insulating layer 324. Mid insulating layer 324 is disposed between insulating layer 114 and insulating layer 118 of first side redistribution interconnect structure 322. Mid insulating layer 328 is disposed between insulating layer 154 and insulating layer 164 of second side redistribution interconnect structure 326. Insulating layers 114, 118, 154, and 164 are deposited and patterned with similar dielectric thin film materials, for example high modulus, i.e., greater than or equal to 4 gigapascals (GPa), low coefficient of thermal expansion (CTE), i.e., less than or equal to 40-50 ppm/° C., high Tg, i.e., greater than or equal to 230° C., and low elongation, i.e., less than 30% at room temperature. In one embodiment, insulating layers 114, 118, 154, and 164 include a CTE of less than 40 ppm/° C. In one embodiment, insulating layers 114, 118, 154, and 164 include filler materials. Mid insulating layer 324 and mid insulating layer 328 are deposited and patterned with different kinds of dielectric thin film materials as compared to insulating layers 114, 118, 154, and 164, for example low modulus, i.e., less than 4 GPa, high CTE, i.e., greater than 40-50 ppm/° C., low Tg, i.e., less than 230° C., and high elongation, i.e., greater than 30% at room temperature. Insulating layer 114 provides an interface with the top of WLCSP 320. Insulating layer 118 provides an interface with encapsulant 142. Insulating layer 164 provides an interface with CUF 329. Insulating layer 154 provides an interface with the bottom of WLCSP 320. In one embodiment, the CTE of the insulating layers at the boundary is from 40 to 50 ppm/° C. CUF 329 materials include epoxy, epoxy-resin adhesive material, polymeric materials, films, or other non-conductive materials. CUF 329 is non-conductive and environmentally protects the semiconductor device from external elements and contaminants. 3D fan-out dual side RDL WLCSP 320 enjoys all of the benefits of 3D fan-out dual side RDL WLCSP 310, including reduced TTV, reduced CT, increased yield, increased efficiency, and reduced loss to obsolesce of stored inventory.

Figure 19A:
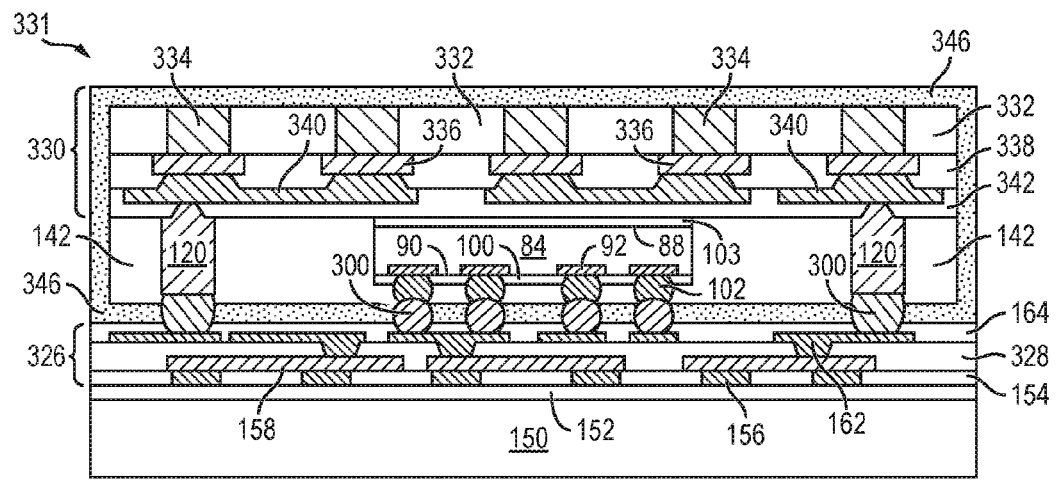
FIGS. 19a-19d illustrate a process of forming a 3D fan-out dual side RDL WLCSP with molded underfill.

FIGS. 19*a*-19*d* illustrate, in relation to FIGS. 13*a*-14*h*, a method of forming a 3D semiconductor package with short cycle time and high yield. FIG. 19*a* shows panel 331, similar to panel 172 from FIG. 14*e*. FIG. 19*a* shows first side redistribution interconnect structure 330, in place of first side redistribution interconnect structure 124 from FIG. 14*e*, second side redistribution interconnect structure 326, in place of first second redistribution interconnect structure 170, and MUF 346 in place of underfill 304. In FIG. 19*a*, second side redistribution interconnect structure 326 is formed over carrier 150 and interface layer 152 as described above. First side redistribution interconnect structure 330 includes additional conductive and insulating layers compared to first side redistribution interconnect structure 124 including mid insulating layer 338. Mid insulating layer 338 is disposed between insulating layer 332 and insulating layer 342 of first side redistribution interconnect structure 330. Insulating layer 332 of first side redistribution interconnect structure 330 is much thicker, i.e., greater than 20 µm, than insulating layer 114 of first side redistribution interconnect structure 124. In one embodiment, insulating layer 332 is deposited and patterned with different kinds of dielectric thin film materials as compared to insulating layers 342, 154, and 164. When insulating layer 332 is deposited and patterned with different kinds of dielectric thin film materials as compared to insulating layers 342, 154, and 164, insulating layer 332 includes similar major material properties as compared to insulating layers 342, 154, and 164. In another embodiment, insulating layer 332 is deposited and patterned with the same dielectric thin film materials as compared to insulating layers 342, 154, and 164. MUF 346 materials include epoxy, epoxy-resin adhesive material, polymeric materials, films, or other non-conductive materials. MUF 346 is non-conductive and environmentally protects the semiconductor device from external elements and contaminants. MUF 346 is molded over a top surface of insulating layer 332 and conductive layer 334 of first side redistribution interconnect structure 330.

Figure 19B:
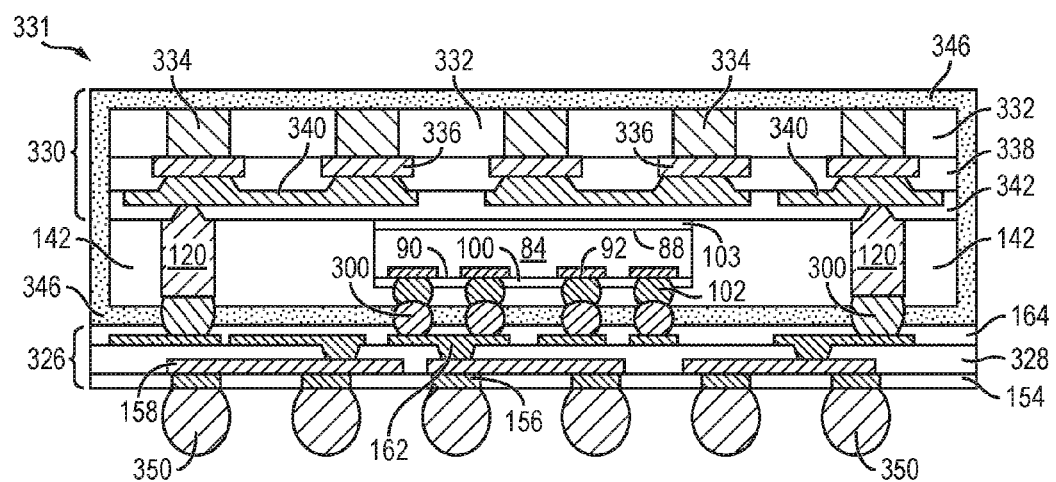

In FIG. 19*b*, temporary carrier 150 and optional interface layer 152 are removed from KGU 200 of second side redistribution interconnect structure 170 by chemical etching, mechanical peel-off, CMP, mechanical grinding, thermal bake, laser scanning, or wet stripping. Insulating layer 154 and conductive layer 156 of KGU 200 are exposed after carrier 150 and interface layer 152 are removed. In one embodiment, additional laser ablation and wet etch cleaning are used to expose conductive layer 156. In one embodiment, copper OSP is applied over conductive layer 156 to protect conductive layer 156 from oxidation in storage. In another embodiment, solder paste is applied over conductive layer 156 to form a protective SOP layer. In one embodiment, a laser may be used to release carrier 150, followed by wet cleaning process, including solvent cleaning or etching.

In FIG. 19*b*, bumps 350, similar to bumps 306, are formed over conductive layer 156. In one embodiment, bumps 350 are formed over a UBM having a wetting layer, barrier layer, and adhesive layer. Bumps 350 can also be compression bonded or TCB to conductive layer 156. Bumps 350 represent one type of interconnect structure that can be formed over conductive layer 156. The interconnect structure can also use conductive pillars, bond wires, conductive paste, stud bump, micro bump, or other electrical interconnect.

Figure 19C:
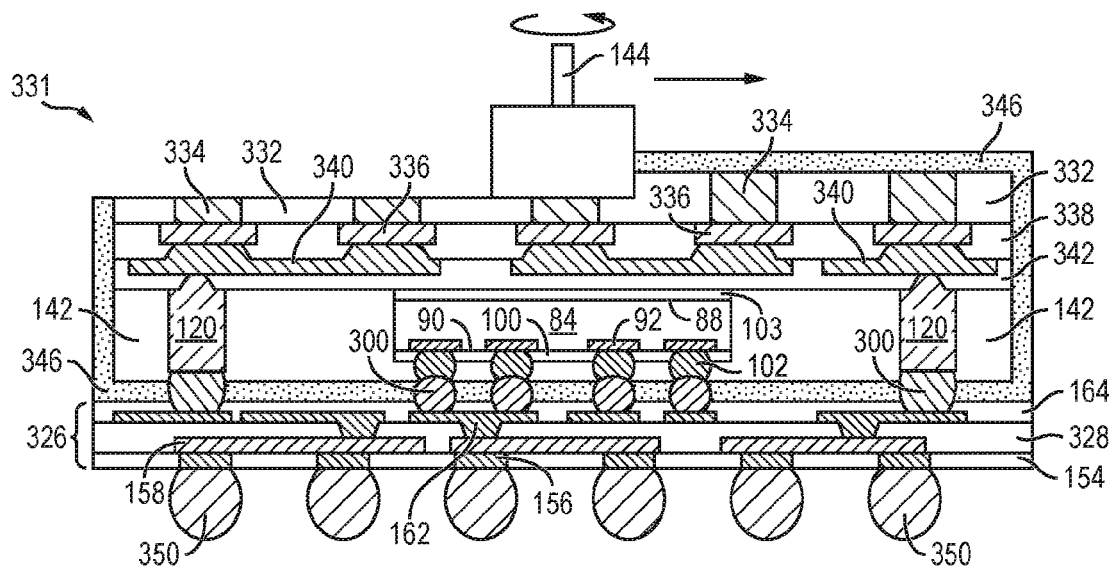
Figure 19D:
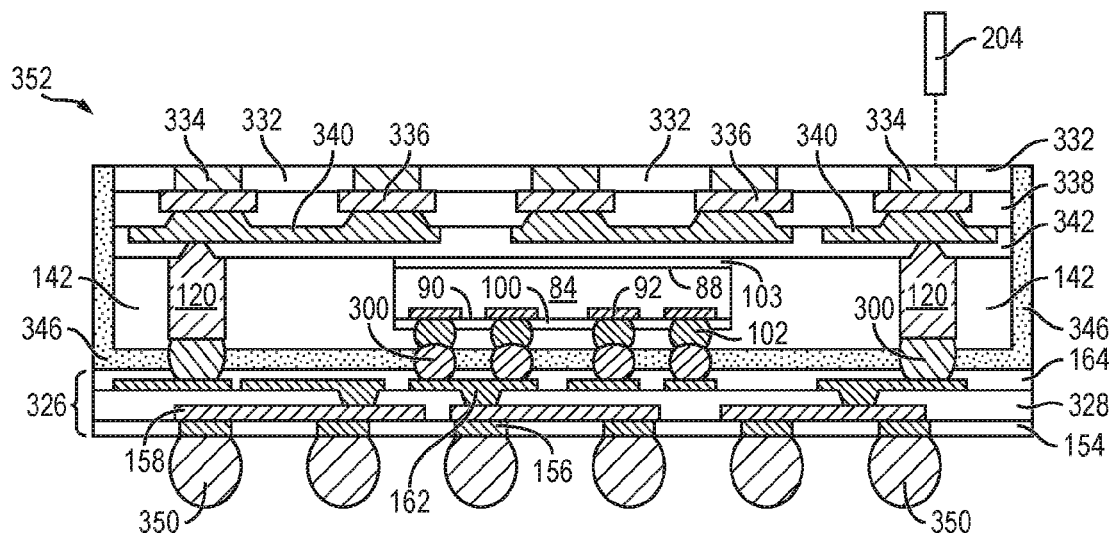

In FIG. 19*c*, a surface of panel 331 undergoes a grinding operation with grinder 144 to planarize the surface and reduce a thickness of insulating layer 332 and conductive layer 334. The grinding operation removes MUF 346 to expose insulating layer 332 and conductive layer 334. A chemical etch can also be used to remove and planarize panel 331. After the grinding operation, a top surface of insulating layer 332 and conductive layer 334 are coplanar with each other. In one embodiment, additional laser ablation and wet etch cleaning are used to expose conductive layer 334, as shown in FIG. 19*d*. In one embodiment, Ni/Au, SOP, or a UBM pad is formed over conductive layer 334 after back grinding and cleaning.

FIG. 19*d* shows 3D fan-out dual side RDL WLCSP 352, similar to 3D fan-out dual side RDL WLCSP 230. 3D fan-out dual side RDL WLCSP 352 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 352 is ready for SMT.

Figure 20A:
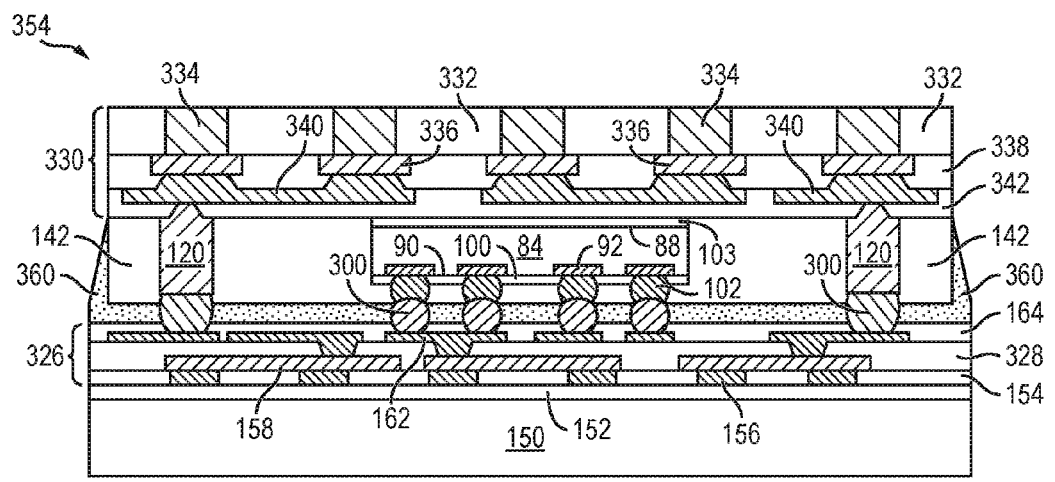
FIGS. 20a-20d illustrate a process of forming a 3D fan-out dual side RDL WLCSP with capillary underfill.

FIGS. 20*a*-20*d* illustrate, in relation to FIGS. 13*a*-14*h*, a method of forming a 3D semiconductor package with short cycle time and high yield. FIG. 20*a* shows panel 354, similar to panel 331 from FIG. 19*a*. In FIG. 20*a*, second side redistribution interconnect structure 326 is formed over carrier 150 and interface layer 152 as described above. FIG. 20*a* shows first side redistribution interconnect structure 330, similar to first side redistribution interconnect structure 124 from FIG. 14*e*, and CUF 360 in place of underfill 304. First side redistribution interconnect structure 330 includes additional conductive and insulating layers compared to first side redistribution interconnect structure 124 including mid insulating layer 338. Mid insulating layer 338 is disposed between insulating layer 332 and insulating layer 342 of first side redistribution interconnect structure 330. Insulating layer 332 of first side redistribution interconnect structure 330 is much thicker, i.e., greater than 20 µm, than insulating layer 114 of first side redistribution interconnect structure 124. In one embodiment, insulating layer 332 is deposited and patterned with different kinds of dielectric thin film materials as compared to insulating layers 342, 154, and 164. When insulating layer 332 is deposited and patterned with different kinds of dielectric thin film materials as compared to insulating layers 342, 154, and 164, insulating layer 332 includes similar major material properties as compared to insulating layers 342, 154, and 164. In another embodiment, insulating layer 332 is deposited and patterned with the same dielectric thin film materials as compared to insulating layers 342, 154, and 164. CUF 360 materials include epoxy, epoxy-resin adhesive material, polymeric materials, films, or other non-conductive materials. CUF 360 is non-conductive and environmentally protects the semiconductor device from external elements and contaminants.

Figure 20B:
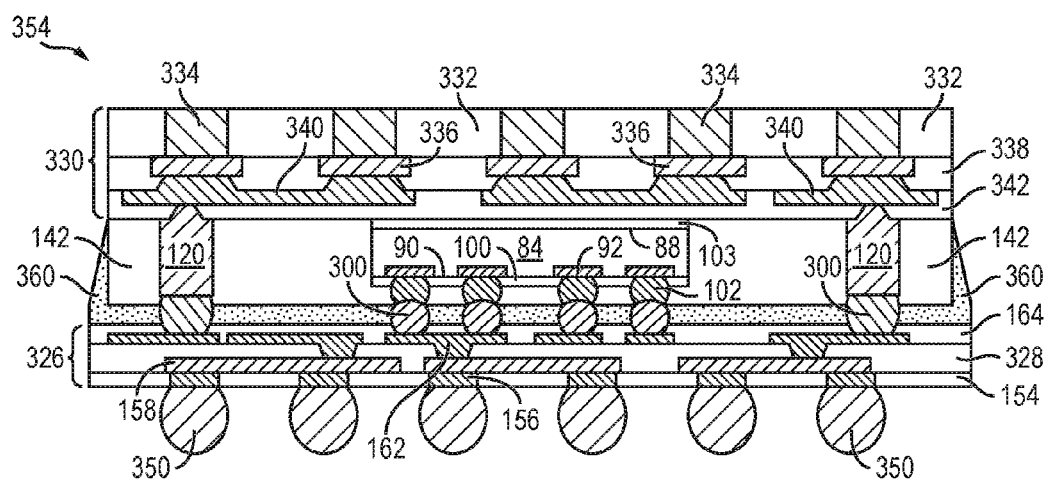

In FIG. 20*b*, temporary carrier 150 and optional interface layer 152 are removed from KGU 200 of second side redistribution interconnect structure 170 by chemical etching, mechanical peel-off, CMP, mechanical grinding, thermal bake, laser scanning, or wet stripping. Insulating layer 154 and conductive layer 156 of KGU 200 are exposed after carrier 150 and interface layer 152 are removed. In one embodiment, additional laser ablation and wet etch cleaning are used to expose conductive layer 156. In one embodiment, copper OSP is applied over conductive layer 156 to protect conductive layer 156 from oxidation in storage. In another embodiment, solder paste is applied over conductive layer 156 to form a protective SOP layer. In one embodiment, a laser may be used to release carrier 150, followed by wet cleaning process, including solvent cleaning or etching.

In FIG. 20b, bumps 350, similar to bumps 306, are formed over conductive layer 156. In one embodiment, bumps 350 are formed over a UBM having a wetting layer, barrier layer, and adhesive layer. Bumps 350 can also be compression bonded or TCB to conductive layer 156. Bumps 350 represent one type of interconnect structure that can be formed over conductive layer 156. The interconnect structure can also use conductive pillars, bond wires, conductive paste, stud bump, micro bump, or other electrical interconnect.

Figure 20C:
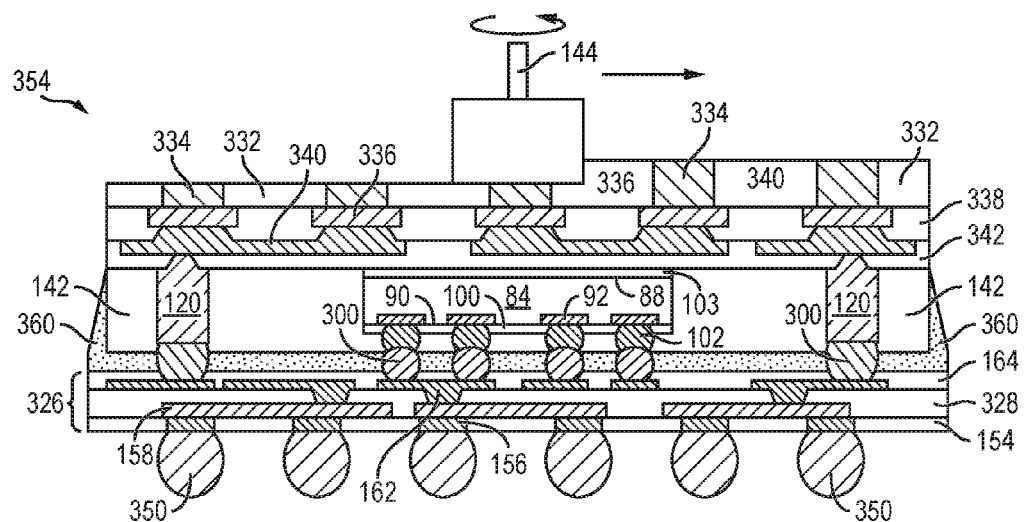
Figure 20D:
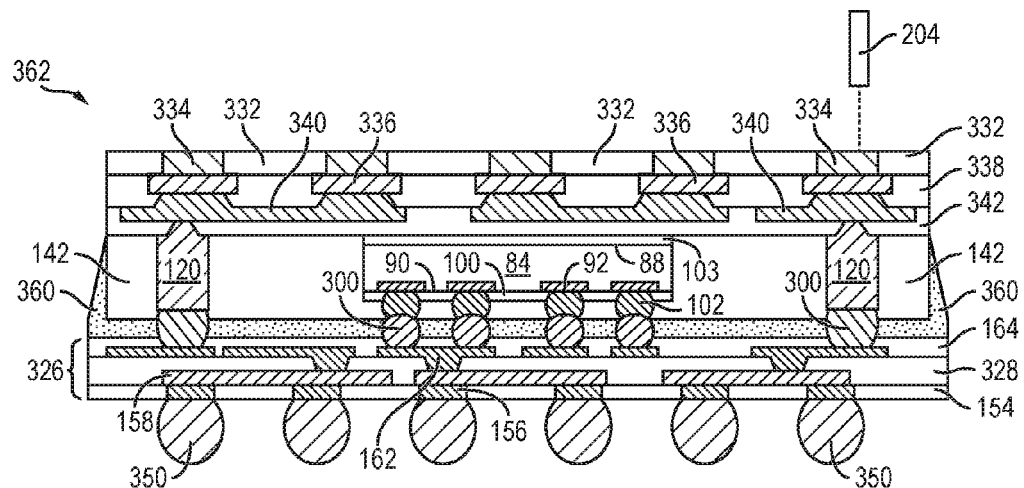

In FIG. 20c, a surface of panel 354 undergoes a grinding operation with grinder 144 to planarize the surface and reduce a thickness of insulating layer 332 and conductive layer 334. A chemical etch can also be used to remove and planarize panel 334. After the grinding operation, a top surface of insulating layer 332 and conductive layer 334 are coplanar with each other. In one embodiment, additional laser ablation and wet etch cleaning are used to expose conductive layer 334, as shown in FIG. 20d. In one embodiment, Ni/Au, SOP, or a UBM pad is formed over conductive layer 334 after back grinding and cleaning.

FIG. 20d shows 3D fan-out dual side RDL WLCSP 362, similar to 3D fan-out dual side RDL WLCSP 230. 3D fan-out dual side RDL WLCSP 362 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 362 is ready for SMT.

Figure 21A:
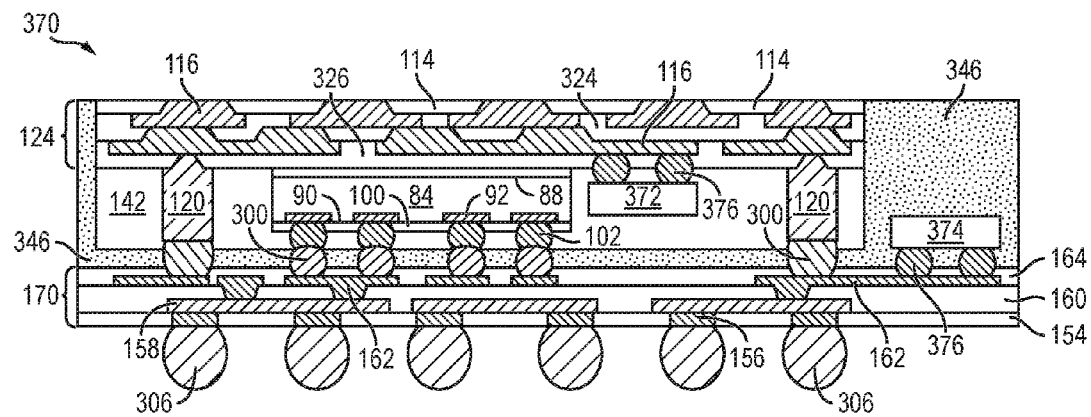
FIGS. 21a-21b illustrate 3D fan-out dual side RDL WLCSPs with additional components.

FIG. 21a shows 3D fan-out dual side RDL WLCSP 370, similar to 3D fan-out dual side RDL WLCSP 230. 3D fan-out dual side RDL WLCSP 370 is manufactured using the same method of forming a 3D semiconductor package with short cycle time and high yield described above. 3D fan-out dual side RDL WLCSP 370 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 370 also includes MUF 346 in place of underfill 304, component 372 mounted to KGU 134 of first side redistribution interconnect structure 124 using interconnect 376, and component 374 mounted to KGU 200 of second side redistribution interconnect structure 170 using interconnect 376. Component 372 is encapsulated with encapsulant 142. Component 374 is encapsulated with MUF 346. Components 372 and 374 include discrete passive devices, filters, WLCSP, or semiconductor devices. Components 372 and 374 may include one or more transistors, diodes, and other circuit elements formed within an active surface to implement analog circuits or digital circuits, such as DSP, ASIC, MEMS, memory, or other signal processing circuit. In one embodiment, components 372 and 374 include a MEMS, such as an accelerometer, gyroscope, strain gauge, microphone, or other sensor responsive to various external stimuli. Interconnect 376 may include bumps, bond wires, conductive pillars, conductive paste, stud bump, micro bump, or other electrical interconnect. 3D fan-out dual side RDL WLCSP 370 is ready for SMT.

Figure 21B:
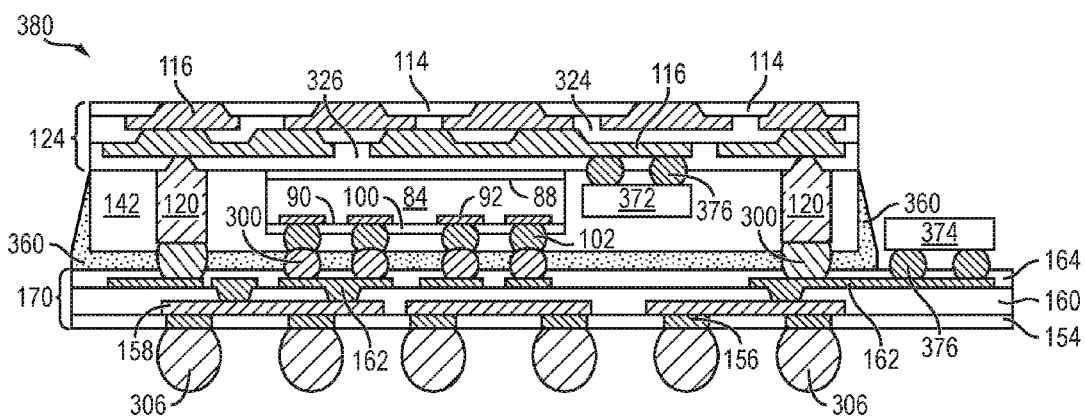

FIG. 21b shows 3D fan-out dual side RDL WLCSP 380, similar to 3D fan-out dual side RDL WLCSP 230. 3D fan-out dual side RDL WLCSP 380 is manufactured using the same method of forming a 3D semiconductor package with short cycle time and high yield described above. 3D fan-out dual side RDL WLCSP 380 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 380 also includes CUF 360 in place of underfill 304, component 372 mounted to KGU 134 of first side redistribution interconnect structure 124 using interconnect 376, and component 374 mounted to KGU 200 of second side redistribution interconnect structure 170 using interconnect 376. Component 372 is encapsulated with encapsulant 142. Component 374 is not encapsulated with CUF 360. Components 372 and 374 include discrete passive devices, filters, WLCSP, or semiconductor devices. Components 372 and 374 may include one or more transistors, diodes, and other circuit elements formed within an active surface to implement analog circuits or digital circuits, such as DSP, ASIC, MEMS, memory, or other signal processing circuit. In one embodiment, components 372 and 374 include a MEMS, such as an accelerometer, gyroscope, strain gauge, microphone, or other sensor responsive to various external stimuli. Interconnect 376 may include bumps, bond wires, conductive pillars, conductive paste, stud bump, micro bump, or other electrical interconnect. 3D fan-out dual side RDL WLCSP 380 is ready for SMT.

Figure 22A:
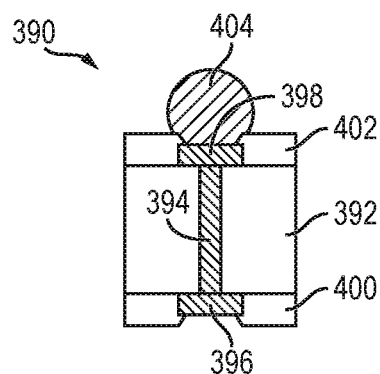
FIGS. 22a-22c illustrate 3D interconnects.

FIG. 22a shows 3D interconnect structure or interposer 390. 3D interconnect structure or interposer 390 is prefabricated. Interposer 390 includes a core substrate 392. Substrate 392 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 392 includes one or more insulating or passivation layers.

A plurality of through vias is formed through core substrate 392 using laser drilling, mechanical drilling, or deep reactive ion etching (DRIE). The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 394. In one embodiment, Cu is deposited over the sidewall of the through vias by electroless plating and electroplating. The through vias are filled with conductive paste or plugging resin with fillers.

An electrically conductive layer or RDL 398 is formed over the surface of core substrate 392 and conductive vias 394 using a patterning and metal deposition process such as printing, PVD, CVD, sputtering, electrolytic plating, and electroless plating. Conductive layer 398 includes one or more layers of Al, Cu, Sn, Ni, Au, Ag, or other suitable electrically conductive material. Conductive layer 398 is electrically connected to conductive vias 394. Conductive layer 398 operates as contact pads electrically connected to conductive vias 394.

An optional insulating or passivation layer 402 is formed over the surface of core substrate 392 and conductive layer 398 using PVD, CVD, printing, spin coating, spray coating, slit coating, rolling coating, lamination, sintering, or thermal oxidation. Insulating layer 402 includes one or more layers of $SiO_2$, $Si_3N_4$, SiON, $Ta_2O_5$, $Al_2O_3$, $HfO_2$, BCB, PI, PBO, polymer dielectric resist with or without fillers or fibers, or other material having similar structural and dielectric properties. A portion of insulating layer 402 is removed by LDA, etching, or other suitable process to expose portions of conductive layer 398. In one embodiment, insulating layer 402 is a masking layer.

An electrically conductive layer or RDL 396 is formed over a surface of core substrate 392 opposite conductive layer 398 using a patterning and metal deposition process such as printing, PVD, CVD, sputtering, electrolytic plating, and electroless plating. Conductive layer 396 includes one or more layers of Al, Cu, Sn, Ni, Au, Ag, or other suitable electrically conductive material. Conductive layer 396 is electrically connected to conductive vias 394 and conductive layer 398. Conductive layer 396 operates as contact pads electrically connected to conductive vias 394. Alternatively, conductive vias 394 are formed through core substrate 392 after forming conductive layer 398 and/or conductive layer 396.

An optional insulating or passivation layer 400 is formed over the surface of core substrate 392 and conductive layer 396 using PVD, CVD, printing, spin coating, spray coating, slit coating, rolling coating, lamination, sintering, or thermal oxidation. Insulating layer 400 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 400 is removed by LDA, etching, or other suitable process to expose portions of conductive layer 396. In one embodiment, insulating layer 400 is a masking layer.

Bumps 404, similar to bumps 306, are formed over conductive layer 398. In one embodiment, bumps 404 are formed over a UBM having a wetting layer, barrier layer, and adhesive layer. Bumps 404 can also be compression bonded or TCB to conductive layer 398. Bumps 404 represent one type of interconnect structure that can be formed over conductive layer 398. The interconnect structure can also use conductive pillars, bond wires, conductive paste, stud bump, micro bump, or other electrical interconnect. Substrate 392 is then singulated into individual 3D interconnect units or interposers 390. Interposer 390 is known good, having been inspected and tested by open/short probe or auto-scope inspection.

Figure 22B:
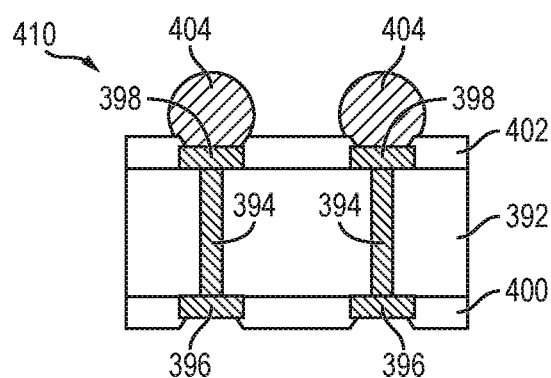

FIG. 22b shows 3D interconnect structure or interposer 410, similar to 3D interconnect structure or interposer 390. 3D interconnect structure or interposer 410 is prefabricated. Substrate 392 described above is singulated into individual 3D interconnect units or interposers 410, each having a plurality of conductive vias 394. Interposer 410 includes a plurality of vias 394 formed through core substrate 392. Interposer 410 is known good, having been inspected and tested by open/short probe or auto-scope inspection.

Figure 22C:
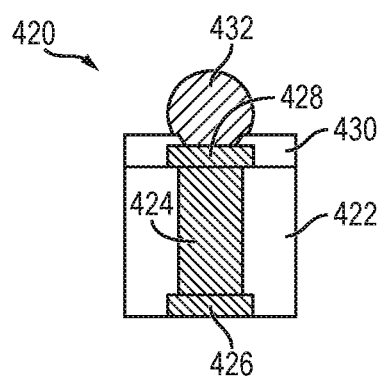

FIG. 22c shows 3D interconnect structure or interposer 420, similar to 3D interconnect structure or interposer 390. 3D interconnect structure or interposer 420 is prefabricated using mold interconnect substrate (MIS) technology. An electrically conductive layer or RDL 426 is formed over the surface of a carrier including glass, copper foil, or silicon, using a patterning and metal deposition process such as printing, PVD, CVD, sputtering, electrolytic plating, and electroless plating. Conductive layer 426 includes one or more layers of Al, Cu, Sn, Ni, Au, Ag, or other suitable electrically conductive material.

An electrically conductive material deposited over conductive layer 426 using an evaporation, electrolytic plating, electroless plating, ball drop, Cu pillar plating, ball drop, stud bump, or screen printing process. The conductive material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The conductive material is bonded to conductive layer 426 using a suitable attachment or bonding process. In one embodiment, the conductive material is formed into conductive pillar 424. Conductive layer 426 is electrically connected to conductive pillar 424. Conductive layer 426 operates as contact pads electrically connected to conductive pillar 424.

An encapsulant or molding compound 422 is deposited over conductive pillar 424 and conductive layer 426 using a paste printing, compressive molding, transfer molding, liquid encapsulant molding, vacuum lamination, or other suitable applicator. Encapsulant 422 can be polymer composite material, such as epoxy resin with filler, epoxy acrylate with filler, or polymer with proper filler. Encapsulant 422 is non-conductive and environmentally protects conductive pillar 424 and conductive layer 426 from external elements and contaminants.

An electrically conductive layer or RDL 428 is formed over conductive pillar 424 and encapsulant 422 using a patterning and metal deposition process such as printing, PVD, CVD, sputtering, electrolytic plating, and electroless plating. Conductive layer 428 includes one or more layers of Al, Cu, Sn, Ni, Au, Ag, or other suitable electrically conductive material. Conductive layer 428 is electrically connected to conductive pillar 424. Conductive layer 428 operates as contact pads electrically connected to conductive pillar 424.

An optional insulating or passivation layer 430 is formed over the surface of encapsulant 422 and conductive layer 428 using PVD, CVD, printing, spin coating, spray coating, slit coating, rolling coating, lamination, sintering, or thermal oxidation. Insulating layer 430 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 430 is removed by LDA, etching, or other suitable process to expose portions of conductive layer 428. In one embodiment, insulating layer 430 is a masking layer.

Bumps 432, similar to bumps 306, are formed over conductive layer 428. In one embodiment, bumps 432 are formed over a UBM having a wetting layer, barrier layer, and adhesive layer. Bumps 430 can also be compression bonded or TCB to conductive layer 428. Bumps 430 represent one type of interconnect structure that can be formed over conductive layer 428. The interconnect structure can also use conductive pillars, bond wires, conductive paste, stud bump, micro bump, or other electrical interconnect. Encapsulant 422 is then singulated into individual 3D interconnect units or interposers 420. Interposer 420 is known good, having been inspected and tested by open/short probe or auto-scope inspection.

Figure 23A:
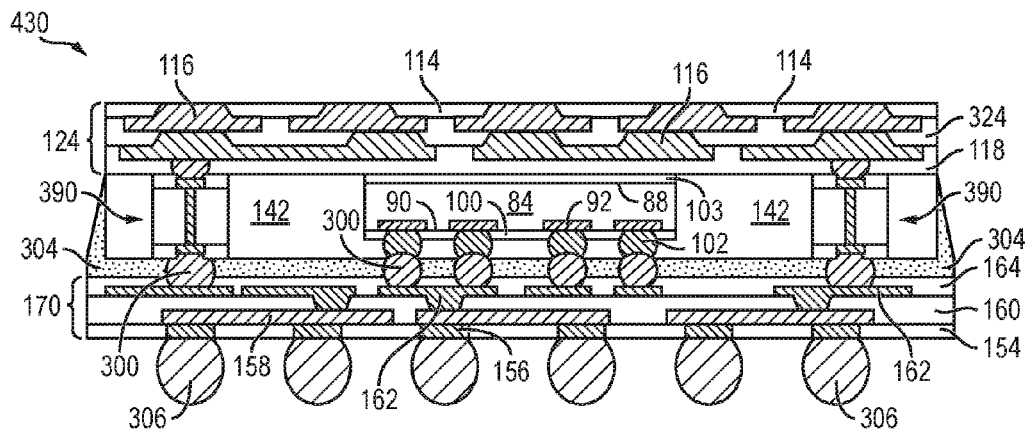
FIGS. 23a-23c illustrate 3D fan-out dual side RDL WLCSPs with 3D interconnects.

FIG. 23a shows 3D fan-out dual side RDL WLCSP 430, similar to 3D fan-out dual side RDL WLCSP 230. 3D fan-out dual side RDL WLCSP 430 is manufactured using the same method of forming a 3D semiconductor package with short cycle time and high yield described above. 3D fan-out dual side RDL WLCSP 430 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 430 includes interposer 390 mounted to first side redistribution interconnect structure 124 in place of conductive pillars 120. 3D interconnect structure or interposer 390 is prefabricated, i.e., interposer 390 is formed and tested prior to mounting interposer 390 to first side redistribution interconnect structure 124. Interposer 390 is encapsulated with encapsulant 142. Side surfaces of interposer 390 are not exposed from encapsulant 142. 3D fan-out dual side RDL WLCSP 430 is ready for SMT.

Figure 23B:
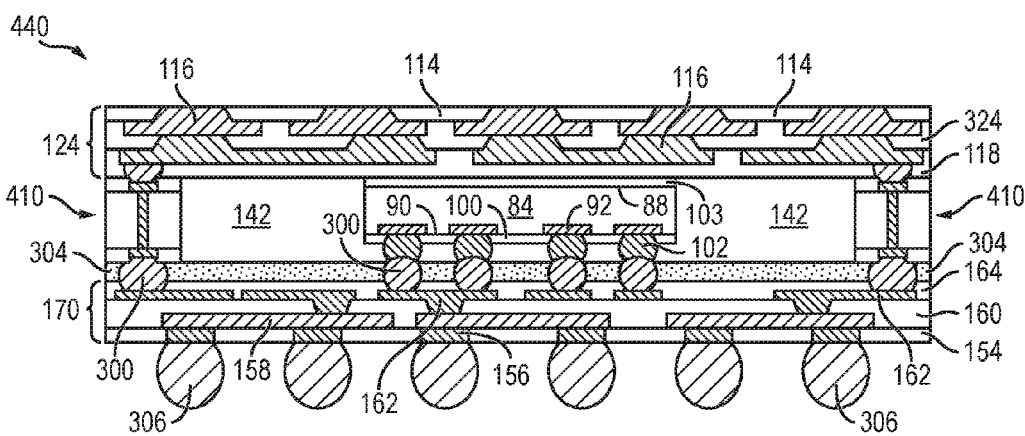

FIG. 23*b* shows 3D fan-out dual side RDL WLCSP 440, similar to 3D fan-out dual side RDL WLCSP 230. 3D fan-out dual side RDL WLCSP 440 is manufactured using the same method of forming a 3D semiconductor package with short cycle time and high yield described above. 3D fan-out dual side RDL WLCSP 440 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 440 includes interposer 410 mounted to first side redistribution interconnect structure 124 in place of conductive pillars 120. 3D interconnect structure or interposer 410 is prefabricated, i.e., interposer 410 is formed and tested prior to mounting interposer 410 to first side redistribution interconnect structure 124. Interposer 410 is encapsulated with encapsulant 142. Interposer 410 extends into the saw street between adjacent units 126 of first side redistribution interconnect structure 124. Interposer 410 is singulated during singulation of units 126 of first side redistribution interconnect structure 124, exposing side surfaces of interposer 410 from encapsulant 142. Side surfaces of interposer 410 remain exposed from encapsulant 142 in the final product, 3D fan-out dual side RDL WLCSP 440. 3D fan-out dual side RDL WLCSP 440 is ready for SMT.

Figure 23C:
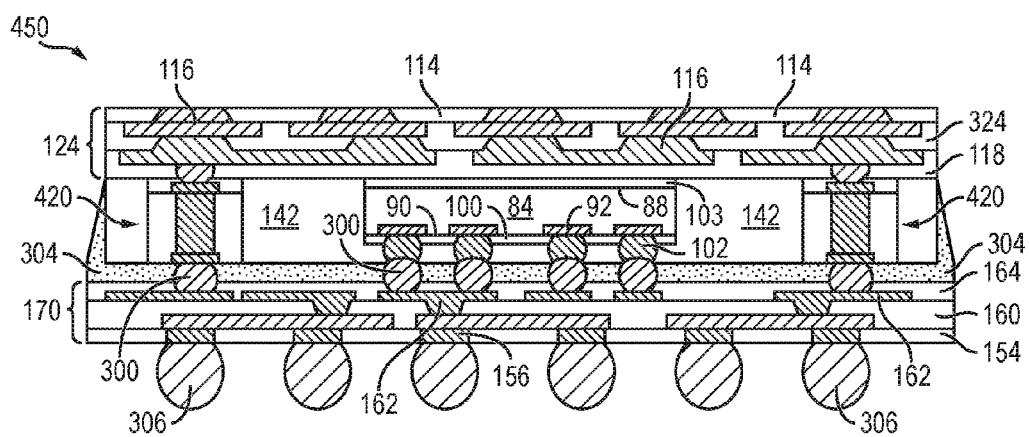

FIG. 23*c* shows 3D fan-out dual side RDL WLCSP 450, similar to 3D fan-out dual side RDL WLCSP 230. 3D fan-out dual side RDL WLCSP 450 is manufactured using the same method of forming a 3D semiconductor package with short cycle time and high yield described above. 3D fan-out dual side RDL WLCSP 430 enjoys all of the benefits of 3D fan-out dual side RDL WLCSP 230, including reduced TTV, reduced CT, increased yield, increased efficiency, and reduced loss to obsolesce of stored inventory. 3D fan-out dual side RDL WLCSP 450 includes interposer 420 mounted to first side redistribution interconnect structure 124 in place of conductive pillars 120. 3D interconnect structure or interposer 420 is prefabricated, i.e., interposer 420 is formed and tested prior to mounting interposer 420 to first side redistribution interconnect structure 124. Interposer 420 is encapsulated with encapsulant 142. Side surfaces of interposer 420 are not exposed from encapsulant 142. 3D fan-out dual side RDL WLCSP 450 is ready for SMT.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first manufacturing line;
   providing a second manufacturing line;
   forming a first redistribution interconnect structure over a first carrier using the first manufacturing line;
   forming a second redistribution interconnect structure over a second carrier using the second manufacturing line;
   testing a first unit of the first redistribution interconnect structure to determine a first known good unit (KGU);
   disposing a known good semiconductor die (KGD) over the first KGU of the first redistribution interconnect structure after forming the first redistribution interconnect structure using the first manufacturing line;
   dicing the first redistribution interconnect structure and first carrier into KGUs after disposing the KGD over the first redistribution interconnect structure;
   testing a unit of the second redistribution interconnect structure to determine a second known good unit (KGU);
   disposing the first KGU of the first redistribution interconnect structure and the KGD over the second KGU of the second redistribution interconnect structure after dicing the first redistribution interconnect structure, wherein the KGD is between the first KGU and second KGU;
   removing the first carrier and second carrier after disposing the first KGU over the second KGU; and
   dicing the second redistribution interconnect structure after disposing the first KGU and KGD over the second KGU.

2. The method of claim 1, further including:
   providing a third manufacturing line;
   testing a semiconductor die of a semiconductor wafer to determine the KGD; and
   dicing the KGD from the semiconductor wafer using the third manufacturing line.

3. The method of claim 1, further including:
   testing a second unit of the first redistribution interconnect structure to determine a rejected unit; and
   disposing a dummy die over the rejected unit of the first redistribution interconnect structure.

4. The method of claim 1, wherein forming the second redistribution interconnect structure further includes disposing a discrete passive device over a conductive layer of the second redistribution interconnect structure.

5. The method of claim 1, wherein a resolution of the second manufacturing line is greater than a resolution of the first manufacturing line.

6. The method of claim 5, wherein forming the second redistribution interconnect structure includes using a resolution greater than the resolution of the first manufacturing line.

7. A method of making a semiconductor device, comprising:
   providing a first manufacturing line;
   providing a second manufacturing line;
   forming a first redistribution interconnect structure using the first manufacturing line;
   providing a carrier;
   forming a second redistribution interconnect structure over the carrier using the second manufacturing line;
   testing a first unit of the first redistribution interconnect structure to determine a first known good unit (KGU);
   disposing a known good semiconductor die (KGD) over the first KGU of the first redistribution interconnect structure after forming the first redistribution interconnect structure;
   forming a vertical interconnect structure over the first redistribution interconnect structure adjacent to the KGD;
   disposing the first redistribution interconnect structure and KGD over the second redistribution interconnect structure with the KGD and vertical interconnect structure between the first redistribution interconnect structure and second redistribution interconnect structure; and
   removing the carrier after disposing the first redistribution interconnect structure and KGD over the second redistribution interconnect structure.

8. The method of claim 7, further including:
providing a third manufacturing line;
testing a semiconductor die of a semiconductor wafer to determine the KGD; and
dicing the KGD from the semiconductor wafer using the third manufacturing line.

9. The method of claim 7, further including:
testing a second unit of the first redistribution interconnect structure to determine a rejected unit; and
disposing a dummy die over the rejected unit of the first redistribution interconnect structure.

10. The method of claim 7, wherein a resolution of the second manufacturing line is greater than a resolution of the first manufacturing line.

11. The method of claim 10, wherein forming the second redistribution interconnect structure includes using a resolution greater than the resolution of the first manufacturing line.

12. The method of claim 7, wherein forming the second redistribution interconnect structure further includes disposing a discrete passive device over a conductive layer of the second redistribution interconnect structure.

13. The method of claim 7, further including:
testing a unit of the second redistribution interconnect structure to determine a second known good unit (KGU); and
disposing the first KGU of the first redistribution interconnect structure and the KGD over the second KGU of the second redistribution interconnect structure.

14. A method of making a semiconductor device, comprising:
forming a first redistribution interconnect structure over a carrier using a first manufacturing line;
forming a second redistribution interconnect structure using a second manufacturing line;
disposing a semiconductor die over the first redistribution interconnect structure after forming the first redistribution interconnect structure;
disposing the second redistribution interconnect structure over the first redistribution interconnect structure and semiconductor die with the semiconductor die disposed between the first redistribution interconnect structure and second redistribution interconnect structure; and
removing the carrier after disposing the second redistribution interconnect structure over the first redistribution structure.

15. The method of claim 14, further including:
testing a first unit of the first redistribution interconnect structure to determine a first known good unit (KGU);
testing the semiconductor die to determine a known good semiconductor die (KGD); and
disposing the KGD over the first KGU of the first redistribution interconnect structure.

16. The method of claim 15, further including:
testing a unit of the second redistribution interconnect structure to determine a second known good unit (KGU); and
disposing the first KGU of the first redistribution interconnect structure and the KGD over the second KGU of the second redistribution interconnect structure.

17. The method of claim 16, further including:
providing a third manufacturing line; and
dicing the KGD from a semiconductor wafer using the third manufacturing line.

18. The method of claim 14, further including:
testing a second unit of the first redistribution interconnect structure to determine a rejected unit; and
disposing a dummy die over the rejected unit of the first redistribution interconnect structure.

19. The method of claim 14, wherein forming the second redistribution interconnect structure further includes disposing a discrete passive device over a conductive layer of the second redistribution interconnect structure.

20. The method of claim 14, wherein a resolution of the second manufacturing line is greater than a resolution of the first manufacturing line.

21. The method of claim 20, wherein forming the second redistribution interconnect structure includes using a resolution greater than the resolution of the first manufacturing line.

22. A method of making a semiconductor device, comprising:
providing a first build-up interconnect structure;
disposing a semiconductor die over the first build-up interconnect structure;
disposing a vertical interconnect structure over the first build-up interconnect structure adjacent to the semiconductor die;
providing a carrier;
forming a second build-up interconnect structure on the carrier;
disposing the second build-up interconnect structure over the first build-up interconnect structure, vertical interconnect structure, and semiconductor die; and
removing the carrier after disposing the second build-up interconnect structure over the first build-up interconnect structure to expose a contact pad of the second build-up interconnect structure.

23. The method of claim 22, wherein the semiconductor die is a dummy semiconductor die.

* * * * *